(12) United States Patent
Kurashima et al.

(10) Patent No.: US 7,339,533 B2
(45) Date of Patent: Mar. 4, 2008

(54) ANTENNA APPARATUS AND ELECTRONIC DEVICE

(75) Inventors: Shigemi Kurashima, Shinagawa (JP); Masahiro Yanagi, Shinagawa (JP); Hideki Iwata, Shinagawa (JP); Takashi Arita, Shinagawa (JP); Takashi Yuba, Shinagawa (JP); Kazuhiko Ikeda, Iiyama (JP); Yuriko Segawa, Shinagawa (JP)

(73) Assignee: Fujitsu Component Limited, Tokyo (JP)

( * ) Notice: Subject to any disclaimer, the term of this patent is extended or adjusted under 35 U.S.C. 154(b) by 33 days.

(21) Appl. No.: 11/341,368

(22) Filed: Jan. 30, 2006

(65) Prior Publication Data

US 2006/0170597 A1    Aug. 3, 2006

(30) Foreign Application Priority Data

| Jan. 31, 2005 | (JP) | ............................. 2005-023846 |
| Jul. 11, 2005 | (JP) | ............................. 2005-202154 |
| Aug. 24, 2005 | (JP) | ............................. 2005-243040 |
| Nov. 14, 2005 | (JP) | ............................. 2005-328514 |

(51) Int. Cl.
*H01Q 1/24* (2006.01)

(52) U.S. Cl. ................. 343/702; 343/700 MS
(58) Field of Classification Search ................ 343/702, 343/700 MS, 873
See application file for complete search history.

(56) References Cited

U.S. PATENT DOCUMENTS

| 6,476,766 | B1 | 11/2002 | Cohen |
| 6,621,458 | B1 | 9/2003 | Petros et al. |
| 6,778,139 | B2 | 8/2004 | Suzuki et al. |
| 2002/0152606 | A1 | 10/2002 | Huang |
| 2002/0190904 | A1 | 12/2002 | Cohen |
| 2003/0030586 | A1 | 2/2003 | Suzuki et al. |
| 2003/0151556 | A1 | 8/2003 | Cohen |
| 2004/0021610 | A1 | 2/2004 | Hickel |
| 2004/0090366 | A1 | 5/2004 | Wong et al. |
| 2005/0001767 | A1 | 1/2005 | Wulff et al. |

FOREIGN PATENT DOCUMENTS

| EP | 0 543 645 | 11/1992 |
| EP | 0 701 296 | 3/1996 |
| EP | 1 215 893 | 6/2002 |
| EP | 1 434 304 | 6/2004 |
| JP | 56-8902 | 1/1981 |
| JP | 11-506280 | 6/1999 |
| JP | 2000-196327 | 7/2000 |
| JP | 2001-136426 | 5/2001 |
| JP | 2002-84134 | 3/2002 |
| JP | 2003-078320 | 3/2003 |
| KR | 10-2004-0085358 | 10/2004 |
| WO | 96/38879 | 12/1996 |

(Continued)

OTHER PUBLICATIONS

Korean Office Action (Notice Requesting Submission of Opinion) mailed Dec. 11, 2006 in corresponding Korean Application No. 10-2006-0009348.

(Continued)

*Primary Examiner*—Hoang V. Nguyen
(74) *Attorney, Agent, or Firm*—Staas & Halsey LLP

(57) ABSTRACT

The present invention discloses an antenna apparatus including a dielectric substrate on which an element including a conductive material pattern is formed. The dielectric substrate is a film.

30 Claims, 62 Drawing Sheets

FOREIGN PATENT DOCUMENTS

WO     WO 01/33664     5/2001
WO     WO 02/31912     4/2002

OTHER PUBLICATIONS

European Search Report, dated Jul. 31, 2006, for related European Patent Application EP06250430.3-2220.

Partial European Search Report, dated Jun. 1, 2006, for related European Patent Application No. EP06250430.3-2220.

Takuya Taniguchi et al., "An Omnidirectional and Low-VSWR Antenna for the FCC-Approved UWB Frequency Band", published by the Institute of Electronics, Information and Communication Engineers. B-A-133, p. 133, no date avail.

FIG.42A  FIG.42B
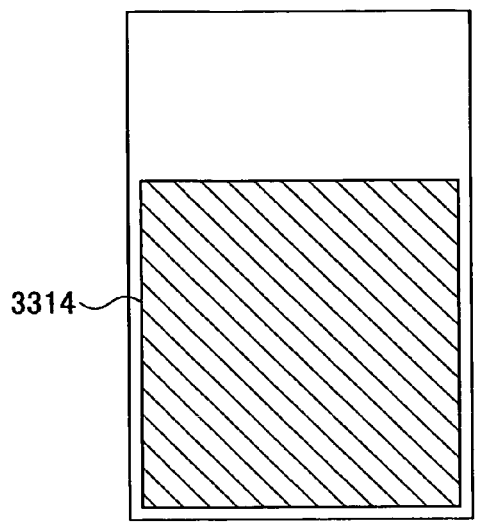
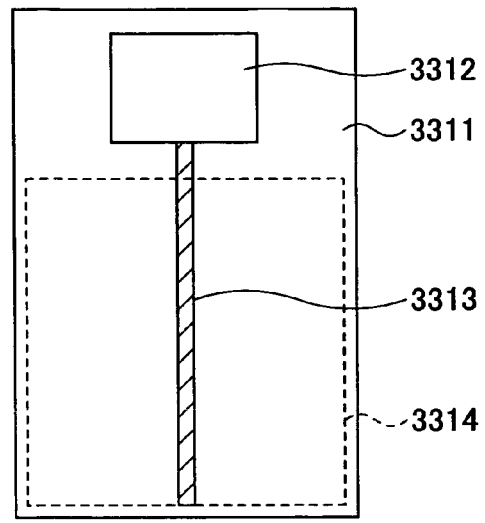
FIG.43A
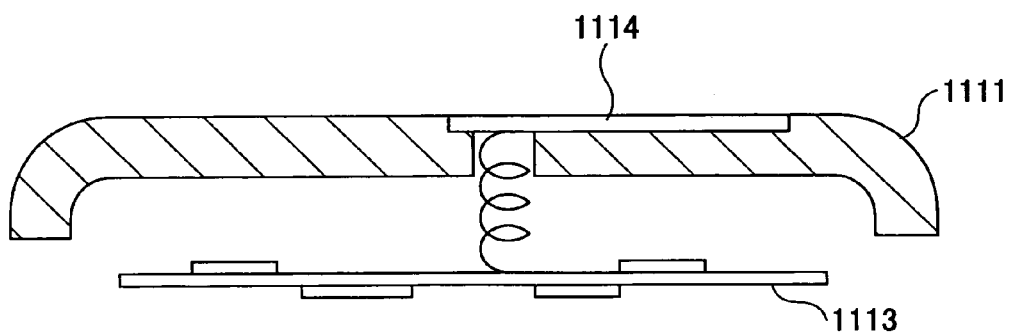
FIG.43B
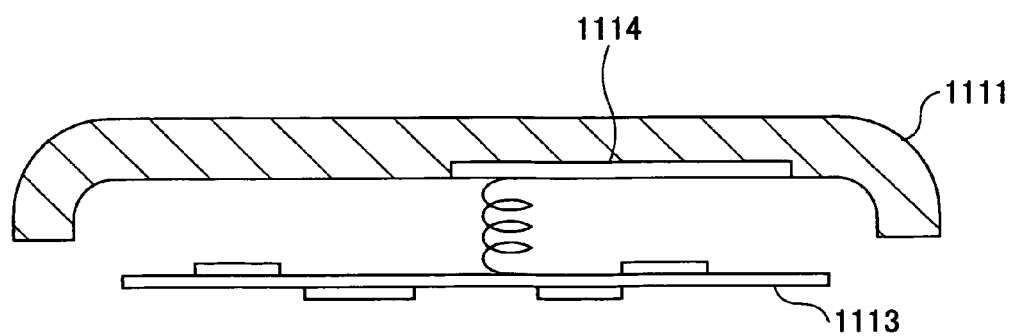

4713

| SUBSTRATE MATERIAL | εr | W(μm) | SUBSTRATE THICKNESS h(mm) | PATTERN WIDTH (mm) | | | | | | | | |
|---|---|---|---|---|---|---|---|---|---|---|---|---|
| | | | | 25 | 0.8 | 0.5 | 0.2 | 0.1 | 0.08 | 0.05 | 0.02 | 0.01 |
| FR-4 | 4.4 | 25 | | 1.86 | 1.49 | 0.93 | 0.36 | 0.17 | 0.14 | 0.08 | 0.028 | 0.012 |
| PI | 3.6 | 12 | | 2.07 | 1.74 | 1.08 | 0.43 | 0.21 | 0.17 | 0.101 | 0.037 | 0.017 |
| PET | 3.0 | 20 | | 2.45 | 1.96 | 1.22 | 0.48 | 0.23 | 0.18 | 0.111 | 0.04 | 0.018 |

ANTENNA APPARATUS AND ELECTRONIC DEVICE

BACKGROUND OF THE INVENTION

1. Field of the Invention

The present invention generally relates to an antenna apparatus and an electronic device, and more particularly to an antenna apparatus and an electronic device including a film-like dielectric substrate on which an element including a conductive material pattern is formed.

2. Description of the Related Art

In recent years and continuing, a wireless communication technology using UWB (Ultra-Wide Band) is drawing attention for its ability to perform radar positioning and large capacity communications. In 2002, the U.S Federal Communication Commission (FCC) approved the use of the UWB in a frequency band of 3.1-10.6 GHz.

The UWB is a communications technology for communicating pulse signals in an ultra wide band. Therefore, an antenna used for UWB is desired to have a configuration that allows transmission/reception in an ultra wide band.

As for an antenna to be used at least in the frequency band of 3.1-10.6 GHz approved by the FCC, an antenna having an earth plate and a feeder member (power supply member) is proposed (See Institute of Electronics, Information and Communication Engineers, B-1-133, "Horizontal In-Plane Non-Directional/Low VSWR Antenna for FCC Approved UWB", Takuya Taniguchi, Takehiko Kobayashi, Tokyo Denki University, Class B201, Presented on Mar. 22, 2003).

FIGS. 1A and 1B are schematic drawings showing conventional antenna apparatuses.

FIG. 1A shows an antenna apparatus 10 having an inverted circular cone-shaped feeder member 12 situated on an earth plate 11.

The side plane of the circular cone-shaped feeder member 12 is configured to form an angle of θ degrees with respect to the surface of the earth plate 11. A desired property can be obtained by adjusting the angle.

FIG. 1B shows another antenna apparatus 20 having a droplet (teardrop) shaped feeder member 22 situated on the earth plate 11. The feeder member 22 includes a circular cone part 22a and a sphere part 22b inscribed to the circular cone part 22a.

In such state, the feeder member 12, 22 of the antenna 10, 20 is connected to a filter 31, as shown in FIG. 2. The filter 31 extracts a desired frequency band component from the radio waves received by the feeder member 12, 22. The component extracted by the filter 31 is supplied to a transmission/reception unit 32. The transmission/reception unit 32 performs a signal process on the received radio wave as a pre-process or a post-process.

Since the conventional antenna apparatuses 10, 20 are configured having a circular cone shape or a teardrop shape feeder member 12, 22 on a flat earth plate 11, the conventional antenna apparatuses 10, 20 have a relatively large size. Accordingly, it is desired to fabricate an antenna apparatus having a smaller and thinner size.

In terms of an antenna apparatus for low frequency band communication, there is a loop antenna which includes an element(s) fabricated by forming a conductive pattern on a flexible substrate.

Nevertheless, the conventional antenna apparatus for ultra wideband communication has a bulky large size. Therefore, it is difficult to mount the antenna apparatus for ultra wideband communication on an electronic device. Accordingly, there is a demand for an antenna apparatus for ultra wideband communication that has a small and thin configuration, such as the loop antenna for low frequency band communication.

SUMMARY OF THE INVENTION

It is a general object of the present invention to provide an antenna apparatus and an electronic device that substantially obviate one or more of the problems caused by the limitations and disadvantages of the related art.

Features and advantages of the present invention will be set forth in the description which follows, and in part will become apparent from the description and the accompanying drawings, or may be learned by practice of the invention according to the teachings provided in the description. Objects as well as other features and advantages of the present invention will be realized and attained by an antenna apparatus and an electronic device particularly pointed out in the specification in such full, clear, concise, and exact terms as to enable a person having ordinary skill in the art to practice the invention.

To achieve these and other advantages and in accordance with the purpose of the invention, as embodied and broadly described herein, an embodiment of the present invention provides an antenna apparatus including: a dielectric substrate on which an element including a conductive material pattern is formed, wherein the dielectric substrate is a film.

Furthermore, an embodiment of the present invention provides an electronic device including: a housing having an antenna apparatus integrally formed thereto; wherein the antenna apparatus includes a dielectric substrate on which an element including a conductive material pattern is formed, wherein the dielectric substrate is a film.

Furthermore, an embodiment of the present invention provides an electronic device including: a housing for installing an antenna apparatus therein, the housing including an opening part to which the antenna apparatus is mounted; wherein the antenna apparatus includes a dielectric substrate on which an element including a conductive material pattern is formed, wherein the dielectric substrate is a film.

Furthermore, an embodiment of the present invention provides an electronic device including: an illuminating device for installing an antenna apparatus therein, the illuminating device including a reflecting part to which the antenna apparatus is mounted; wherein the antenna apparatus includes a dielectric substrate on which an element including a conductive material pattern is formed for functioning as a reflecting member of the illuminating device, wherein the dielectric substrate is a film.

Furthermore, an embodiment of the present invention provides an electronic device including: a strap including a tip part to which an antenna apparatus is attached; wherein the antenna apparatus includes a dielectric substrate on which an element including a conductive material pattern is formed, wherein the dielectric substrate is a film.

Furthermore, an embodiment of the present invention provides an electronic device for generating image data, the electronic device including: an illuminating device; a reflecting part for reflecting light from the illuminating device; and an antenna apparatus for transmitting image data signals to an external device, the antenna apparatus mounted to the reflecting part for functioning as a reflecting member of the illuminating device; wherein the antenna apparatus includes a dielectric substrate on which an element including a conductive material pattern is formed, wherein the dielectric substrate is a film.

Furthermore, an embodiment of the present invention provides an electronic device for functioning as a peripheral device, the electronic device including: a housing; and an antenna apparatus mounted to the housing for transmitting data signals to an external device; wherein the antenna apparatus includes a dielectric substrate on which an element including a conductive material pattern is formed, wherein the dielectric substrate is a film.

Other objects and further features of the present invention will be apparent from the following detailed description when read in conjunction with the accompanying drawings.

BRIEF DESCRIPTION OF THE DRAWINGS

FIGS. 42A-42B are schematic drawings an antenna apparatus including a chip antenna and a micro-strip-line according to an embodiment of the present invention;

FIGS. 43A-43B are schematic drawings of other methods for mounting the antenna apparatus to a housing according to an embodiment of the present invention;

DESCRIPTION OF THE PREFERRED EMBODIMENTS

In the following, embodiments of the present invention will be described with reference to the accompanying drawings.

[Antenna Apparatus 100]

Figure 1A:
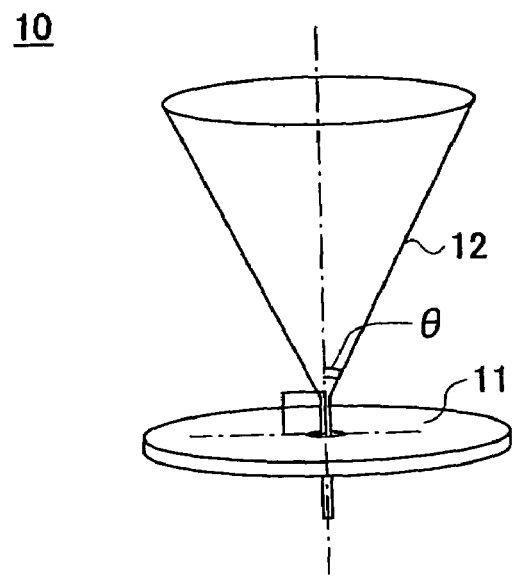
FIGS. 1A and 1B are schematic drawings of a conventional antenna apparatus.
Figure 1B:
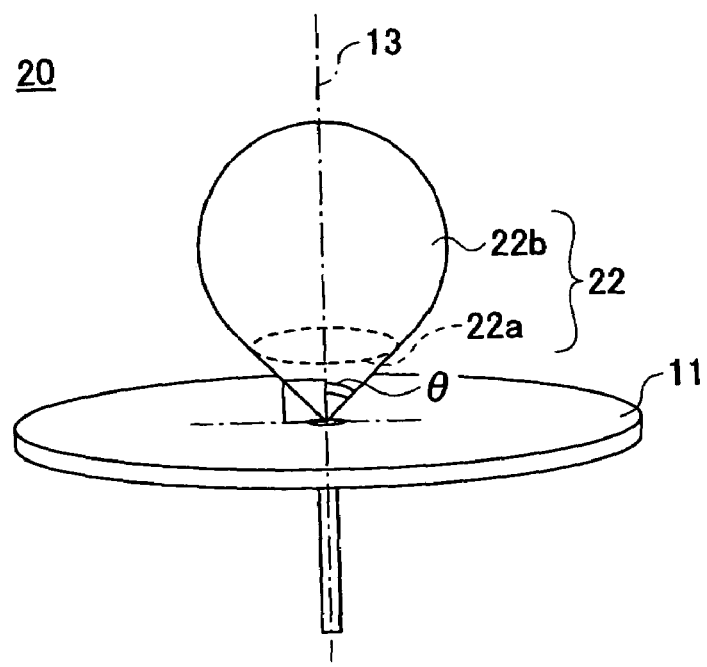
Figure 2:
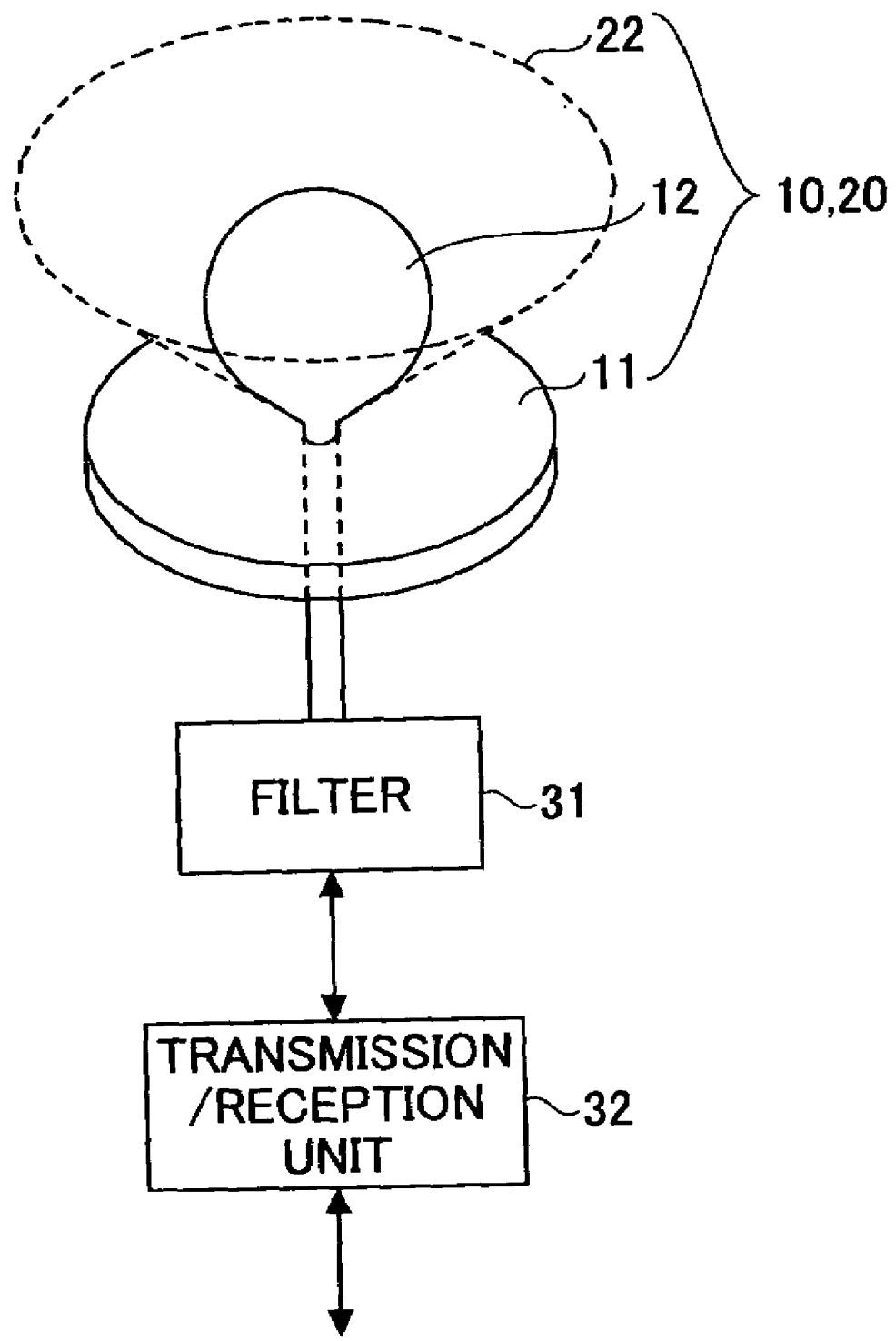
FIG. 2 is a block diagram of a conventional antenna apparatus.
Figure 3:
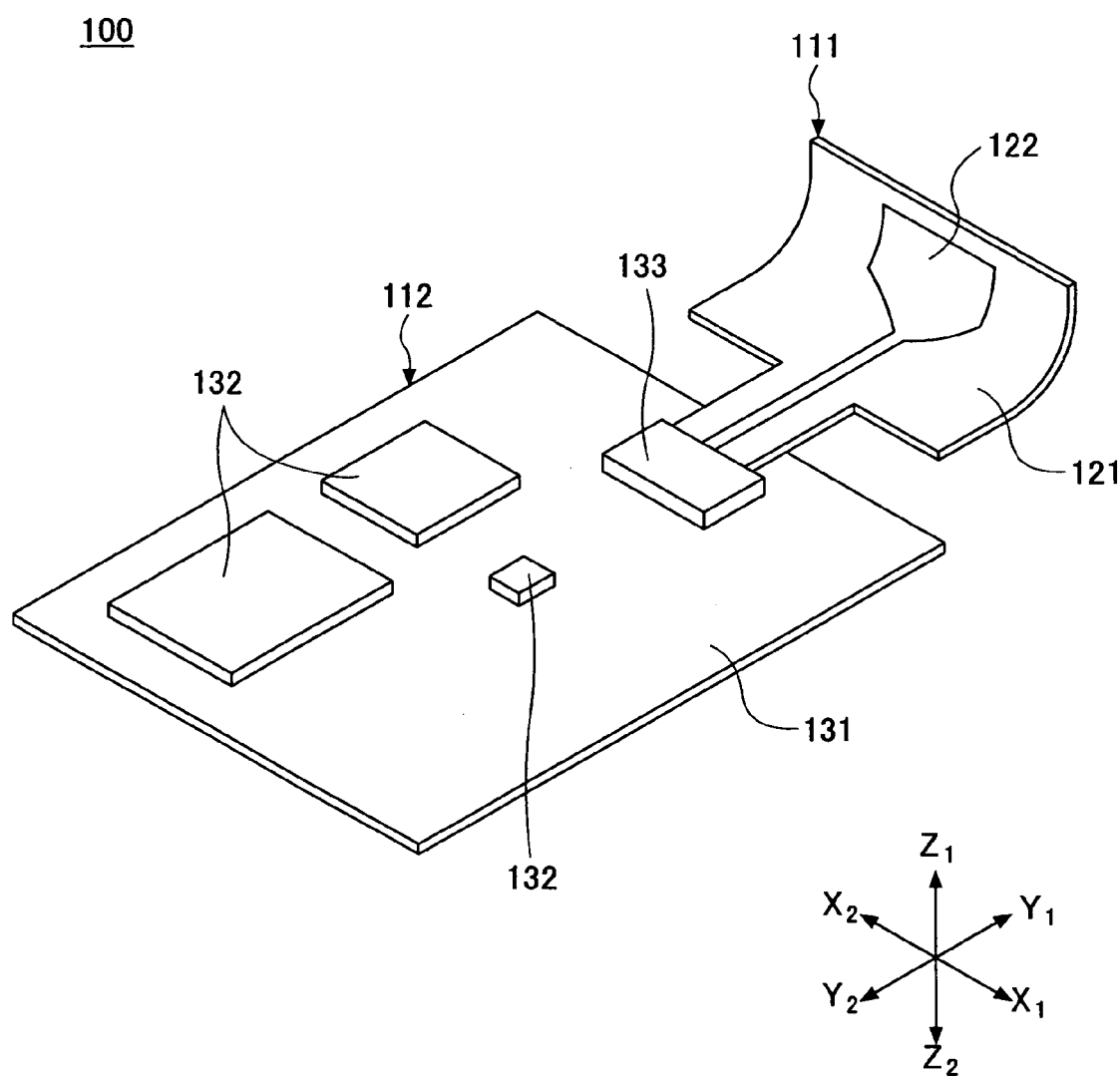
FIG. 3 is a schematic drawing of an exemplary configuration of a system according to an embodiment of the present invention.

FIG. 3 is a schematic drawing showing an exemplary configuration of an antenna apparatus 100 according to an embodiment of the present invention.

The antenna apparatus 100 according to an embodiment of the present invention includes an antenna part (element) 111 and a circuit part 112.

The antenna part 111 includes a conductive pattern 122 formed on a flexible printed wiring board 121. In the circuit part 112, an electronic component 132 is mounted on a printed wiring board 131. Accordingly, a process circuit for processing signals in the UWB (Ultra Wide Band) can be obtained by the electronic component 132 and the wiring patterns. Furthermore, in the circuit part 112, an FPC connector 133 is formed on the printed wiring board 131. The FPC connector 133 is connected to the antenna part 111. The circuit part 112 processes the signals received/transmitted at the antenna part 111.

[Antenna Part (Element) 111]

Figure 4A:
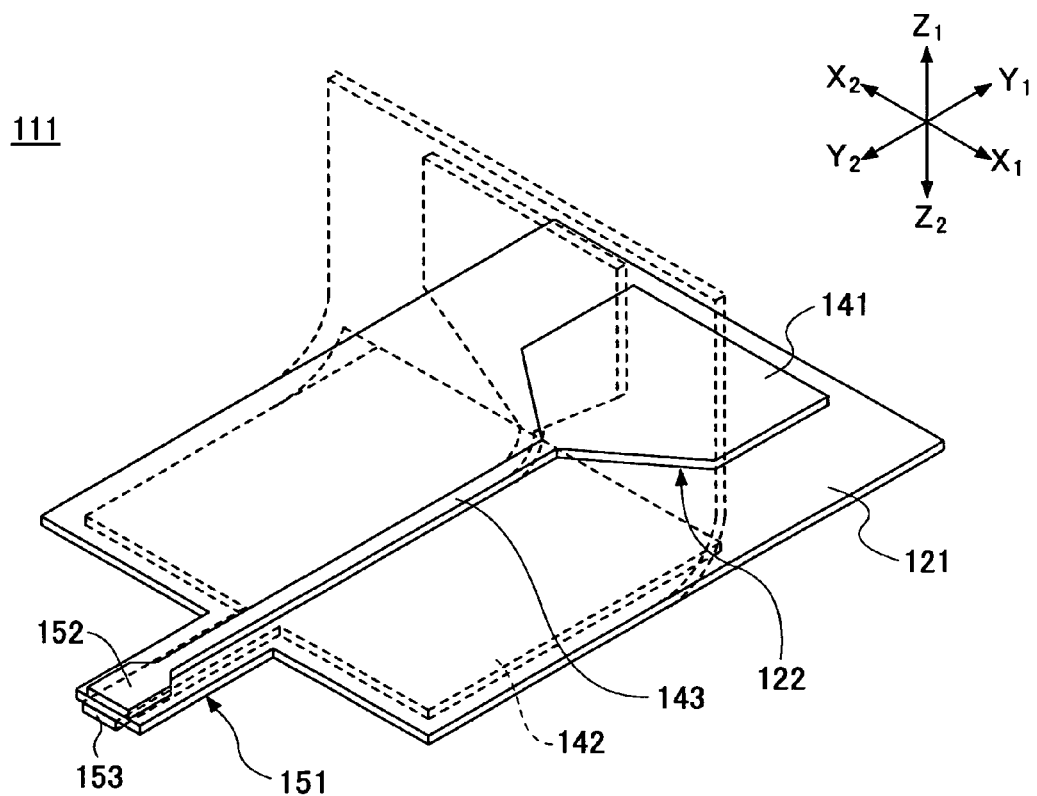
FIGS. 4A and 4B are perspective views of an antenna part (element) according to an embodiment of the present invention.
Figure 4B:
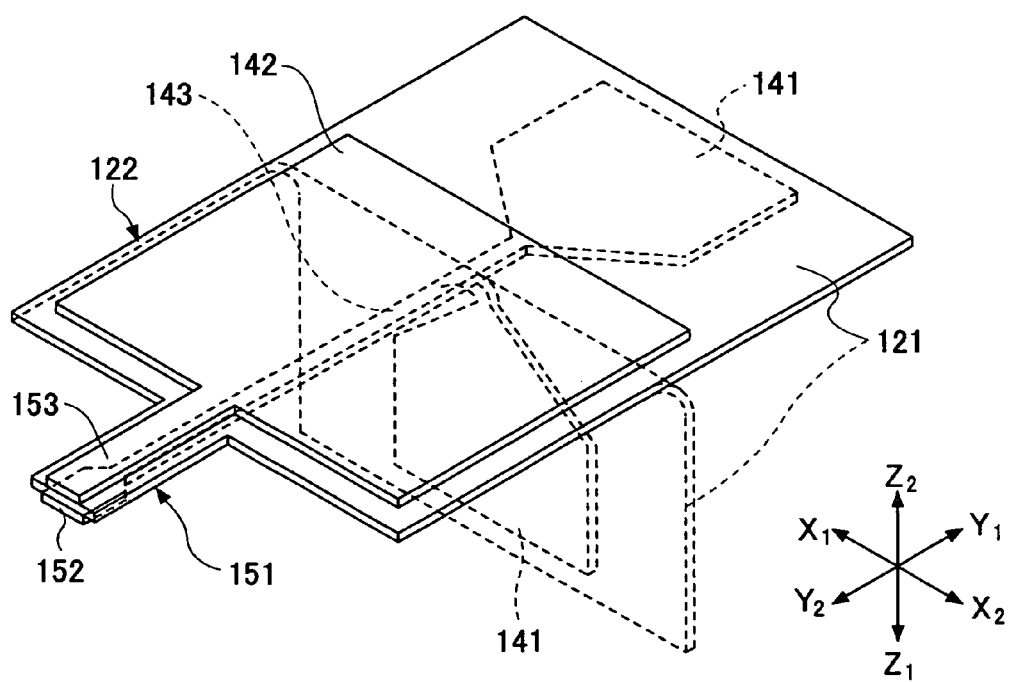

FIGS. 4A and 4B are perspective views of the antenna part 111 according to an embodiment of the present invention.

In the antenna part 111, an element pattern 141, a ground pattern 142, and a strip-line 14 are formed on the flexible printed wiring board 121 with a conductive material (e.g. aluminum, copper) by performing a patterning process on the flexible printed wiring board 121 of the antenna part 111.

The flexible printed wiring board 111 has a flexible property. The flexible printed wiring board 111 is formed of a resin material (e.g. PET, polyimide, FR-4) and has a thickness which is substantially no greater than 0.1 mm.

The element pattern 141 according to an embodiment of the present invention is formed by applying a conductive material (e.g. aluminum, copper) on the planes of the flexible printed wiring board 111 in the Y1 direction and in the Z1 direction. The element pattern 141 is formed into a shape similar to a baseball home plate. It is to be noted that the shape of the element pattern 141 is obtained by cutting a tip part and both sides of a longitudinal section of a droplet (teardrop) shaped element.

The ground pattern 142 according to an embodiment of the present invention is formed by applying a conductive material (e.g. aluminum, copper) on the planes of the flexible printed wiring board 111 in the Z2 direction and in the Y2 direction. The ground pattern 142 is formed covering half the area of the flexible printed wiring board 111.

The strip-line 143 according to an embodiment of the present invention is formed by applying a conductive material (e.g. aluminum, copper) on the planes of the flexible printed wiring board 111 in the Z1 direction and in the Y2 direction. The strip-line 143 is formed on a manner extending in the Y2 direction. One end of the strip-line 143 is connected to the element pattern 122 and the other end of the strip-line 143 is connected to a connection part 151 formed at a distal end part of the flexible printed wiring board 121 in the Y2 direction. It is to be noted that the width of the strip-line 114 and the thickness of the flexible printed wiring board are set to attain a characteristic impedance of approximately 50Ω. For example, the width of the strip-line 114 and the thickness of the flexible printed wiring board may be set so that the strip-line 14 becomes wider as the flexible printed wiring board 111 becomes thicker and that the strip-line 14 becomes narrower as the flexible printed wiring board 111 becomes thinner. More specifically, in a case where the thickness of the base material of the flexible printed wiring board 121 ranges from approximately 0.08 mm to 0.14 mm, the width of the strip-line 143 becomes approximately 200 μm.

The connection part 151 is provided in a manner projecting in the Y2 direction from a Y2 direction end plane of the flexible printed wiring board 121.

In the vicinity of the connection part 151, a connection pad 152 is formed on the plane of the flexible printed wiring board 121 in the Z1 direction, and another connection pad 153 is formed on the plane of the flexible printed wiring board 121 in the Z2 direction. The connection pad 152 contacts a terminal situated in the Z1 direction of an upper part of the FPC connector 133, and the connection pad 153 contacts another terminal situated in the Z2 direction of a lower part of the FPC connector 133. The upper and lower terminals of the FPC connector 133 are soldered to the wiring pattern of the printed wiring plate 131 for communicating signals between the element pattern 141 of the antenna part 111 and the process circuit mounted on the printed wiring board 131 and for setting the ground pattern 142 to ground level.

Since the flexible printed wiring board 121 is used as the base material of the antenna part 111, the antenna part 111 can be bent in a manner illustrated with broken lines in FIGS. 4A and 4B. By bending the element pattern 141 in a prescribed angle with respect to the ground pattern 142 (as illustrated with the broken lines in FIGS. 4A and 4B) various properties (VSWR, loss, directivity) are improved compared to disposing the element pattern 141 and the ground pattern 142 on the same plane.

[Attachment of Antenna Part 111]

It is to be noted that, although the antenna part 111 is attached to the printed wiring board 131 by using the FPC connector 133 according to an embodiment of the present invention, the antenna part 111 may be attached to the printed wiring board 131 by using another alternative method(s) or component(s).

First Modified Example

For example, a connecting part 212 of the antenna part 111 may be directly soldered to a connection pattern of the printed wiring board 131.

Figure 5A:
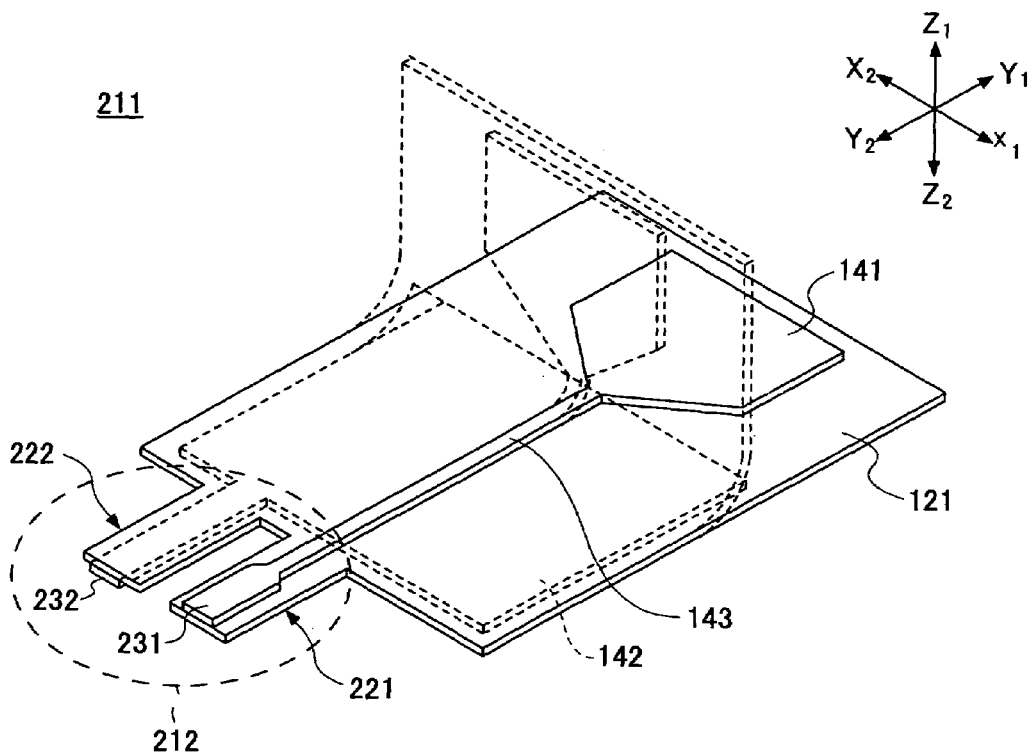
FIGS. 5A and 5B are perspective views of a first modified example of an antenna part (element) according to an embodiment of the present invention.
Figure 5B:
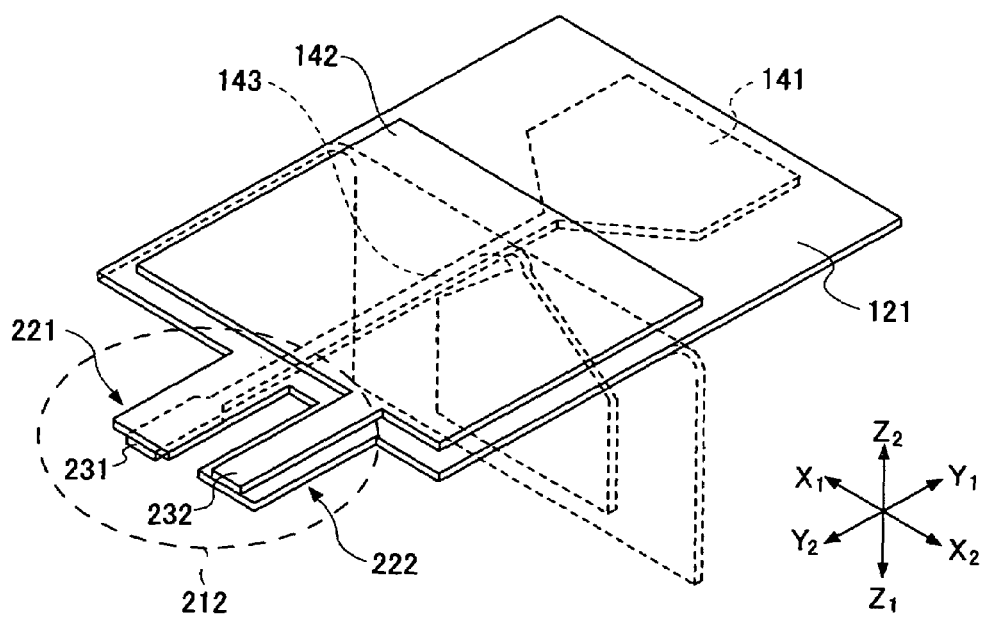
Figure 6A:
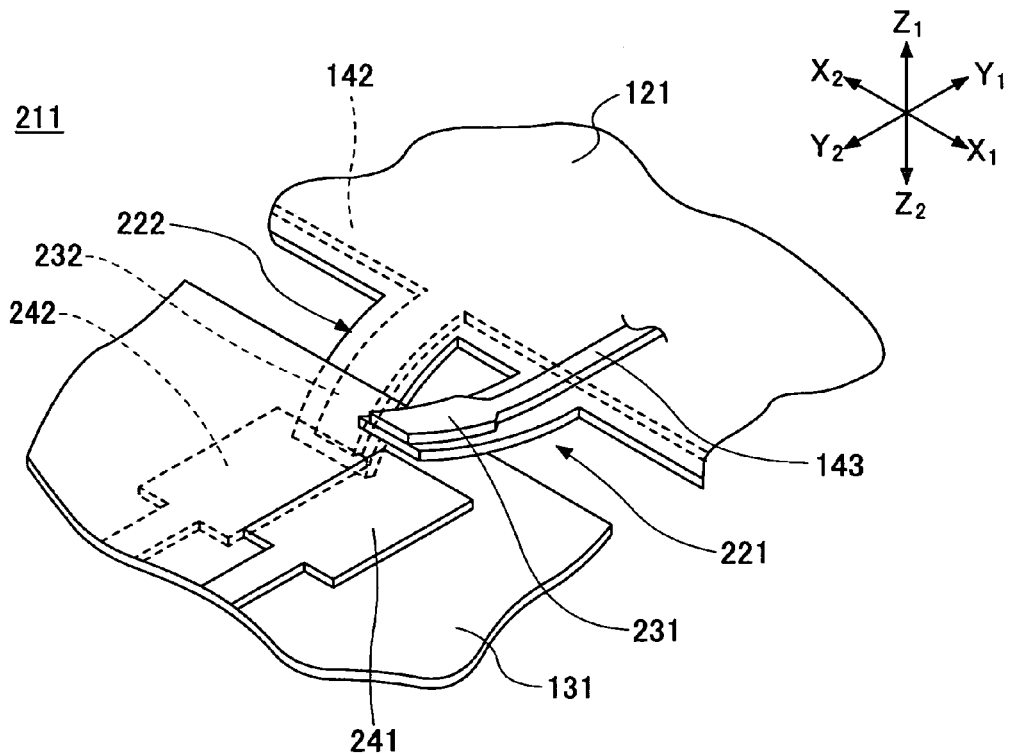
FIGS. 6A and 6B are perspective views for describing the connection state of the antenna part (element) of the first modified example.
Figure 6B:
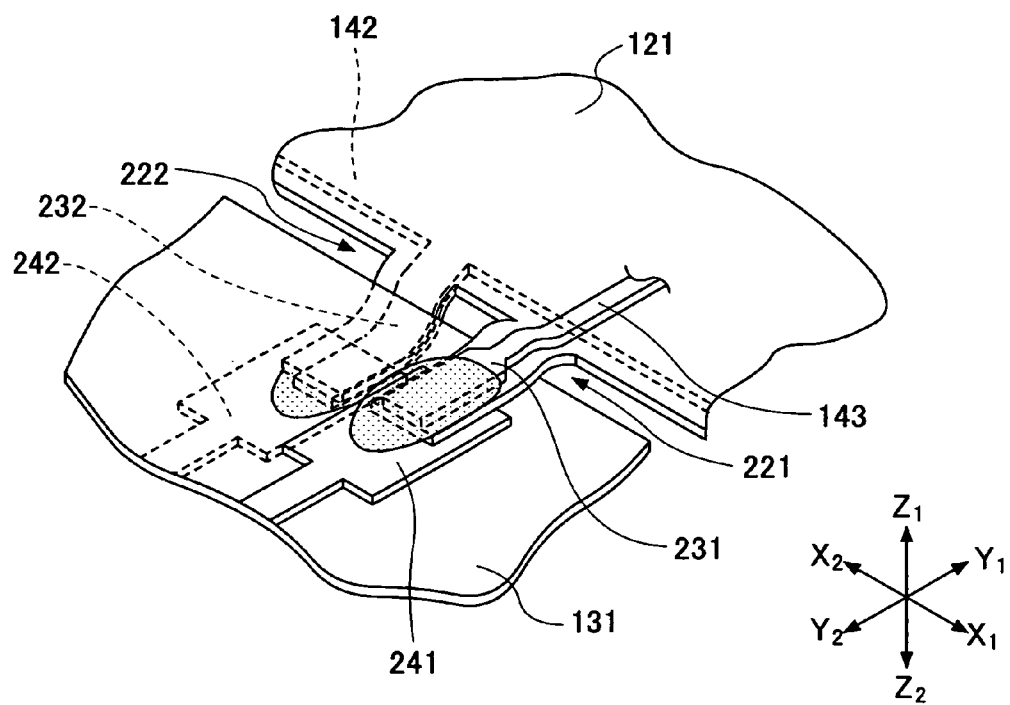

FIGS. 5A and 5B are perspective views of the antenna part 211 according to the first modified example of the present invention. FIGS. 6A and 6B are schematic drawings for describing the connection of the antenna part 211 according to the first modified example of the present invention. In the drawings of the first modified example of the present invention, like components are denoted by like numerals as of FIGS. 3, 4A and 4B of the above-described embodiment of the present invention and are not further described.

The antenna part 211 according to the first modified example of the present invention includes a connection part 212 having a configuration which is different from that of the antenna part 111. The connection part 212 includes a first connection part 221 and a second connection part 222.

The first connection part 221 is formed at the area where the strip line 143 extends in the Y2 direction from a Y2 direction end part of the flexible printed wiring board 121 in a manner projecting from the Y2 direction end part of the flexible printed wiring board 121. The first connection part 221 has a connection pad 231 formed on its plane facing the Z1 direction. The connection pad 231 is connected to the Y2 direction end part of the strip line 143.

The second connection part 222 is formed adjacent to the first connection part 221 in the X2 direction in a manner projecting from the Y2 direction end part of the flexible printed wiring board 121 in the Y2 direction. The second connection part 222 has a connection pad 232 formed on its plane facing the Z2 direction. The connection pad 232 is connected to the ground pattern 142.

As shown in FIGS. 6A and 6B, first and second connection pads 241 and 242 are formed on the printed wiring board 131 (to which the antenna part 211 is to be soldered). The first connection pad 241 is formed on a Z1 direction plane (Z1 side of the Z-Y plane) of the printed wiring board 131 at a position corresponding to the first connection part 221. Furthermore, the second connection pad 242 is formed on a Z2 direction plane of the printed wiring board 131 at a position corresponding to the second connection part 222. As shown in FIG. 6A, the first connection part 221 of the antenna part 211 is bent in the Z1 direction and the second connection part 222 of the antenna part 211 is bent in the Z2 direction, such that the printed wiring board 131 is sandwiched therebetween. In sandwiching the printed wiring board 131, the first connection part 221 is positioned in a manner facing the first connection pad 241 of the printed wiring board 131 and the second connection part 222 is positioned in a manner facing the second connection pad 242 of the printed wiring board 131.

Then, the connection pad 231 of the first connection part 221 is soldered to the first connection pad 241 of the printed wiring board 131 on the Z1 direction plane of the printed wiring board, and the connection pad 232 of the second connection part 222 is soldered to the second connection pad 242 of the printed wiring board 131 on the Z2 direction plane of the printed wiring board 131.

Thereby, the printed wiring board 131 is connected to the antenna part 211.

Although the antenna part 211 is soldered to the printed wiring board 131 on both planes of the printed wiring board 131 in the above-described first modified example, the antenna part may also be soldered to one of the planes of the printed wiring board 131.

Second Modified Example

Figure 7A:
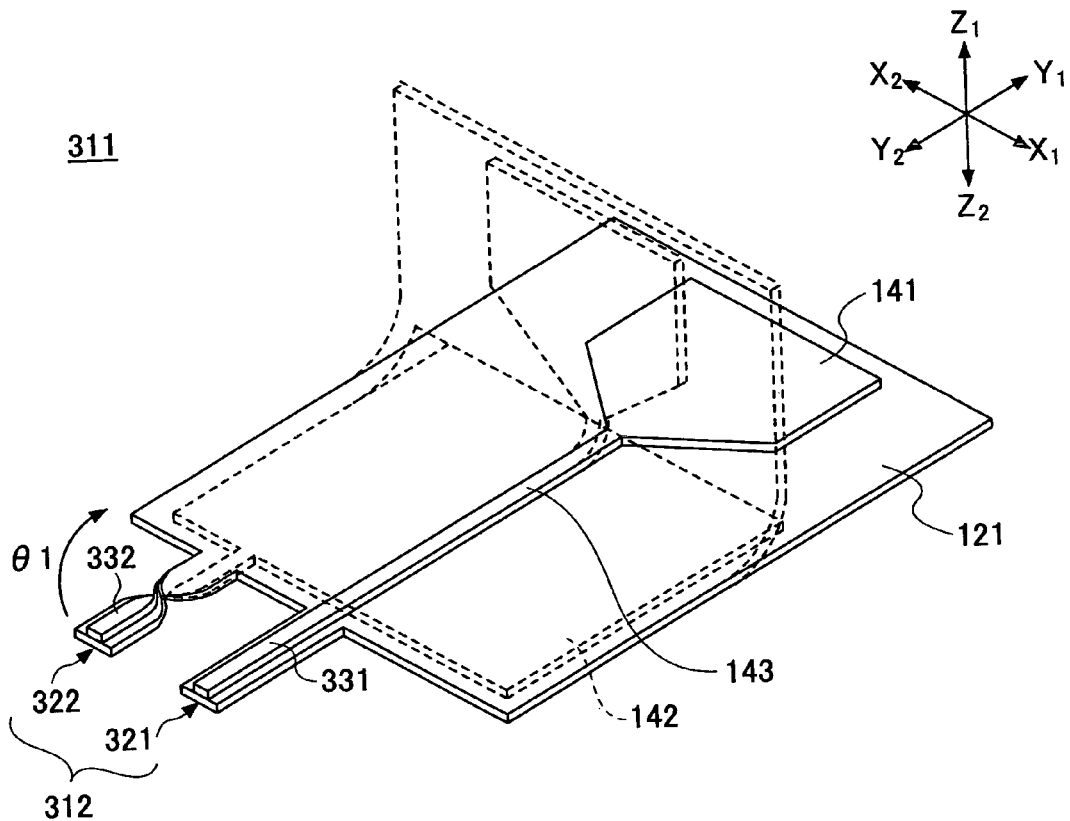
FIGS. 7A and 7B are perspective views of a second modified example of antenna part (element) according to an embodiment of the present invention.
Figure 7B:
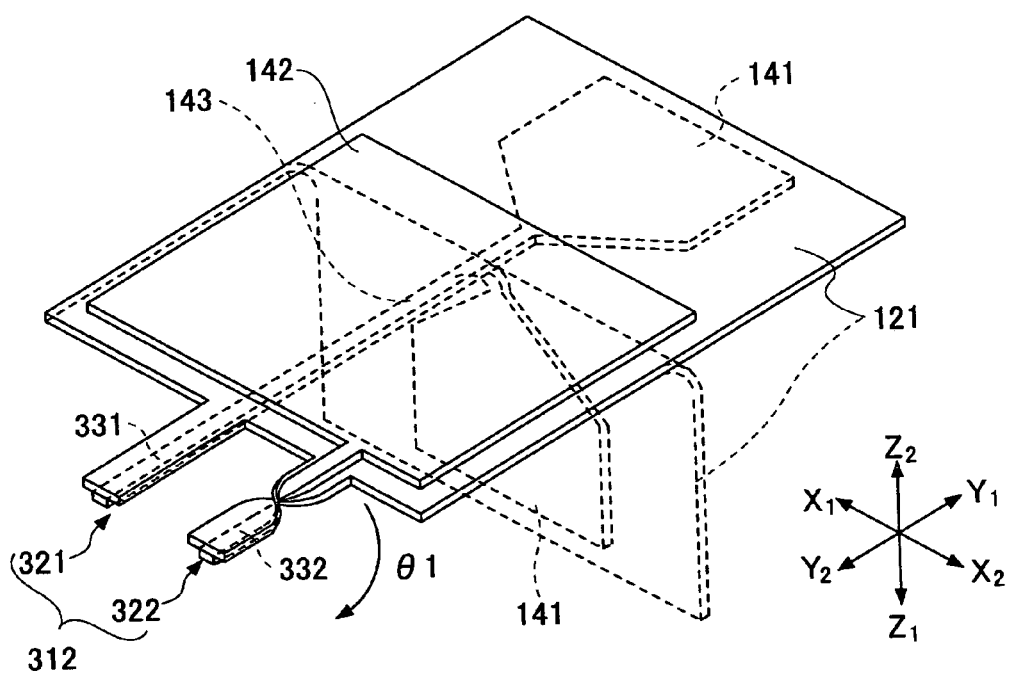
Figure 8A:
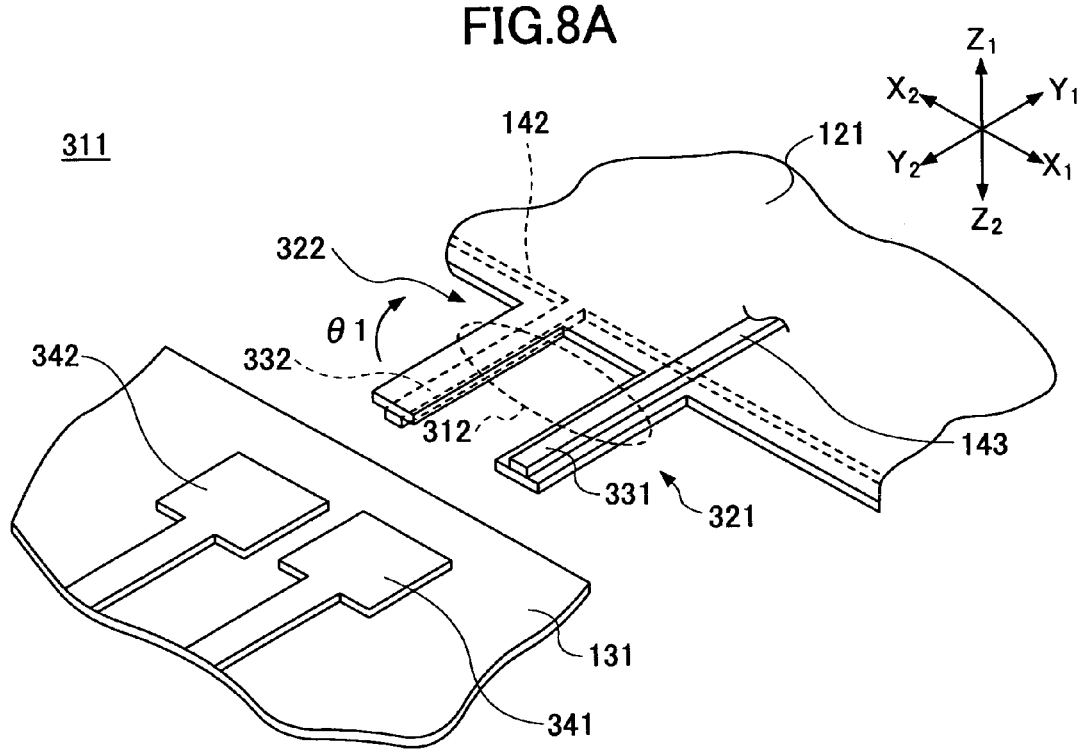
FIGS. 8A and 8B are perspective views for describing the connection state of the antenna part (element) of the second modified example.
Figure 8B:
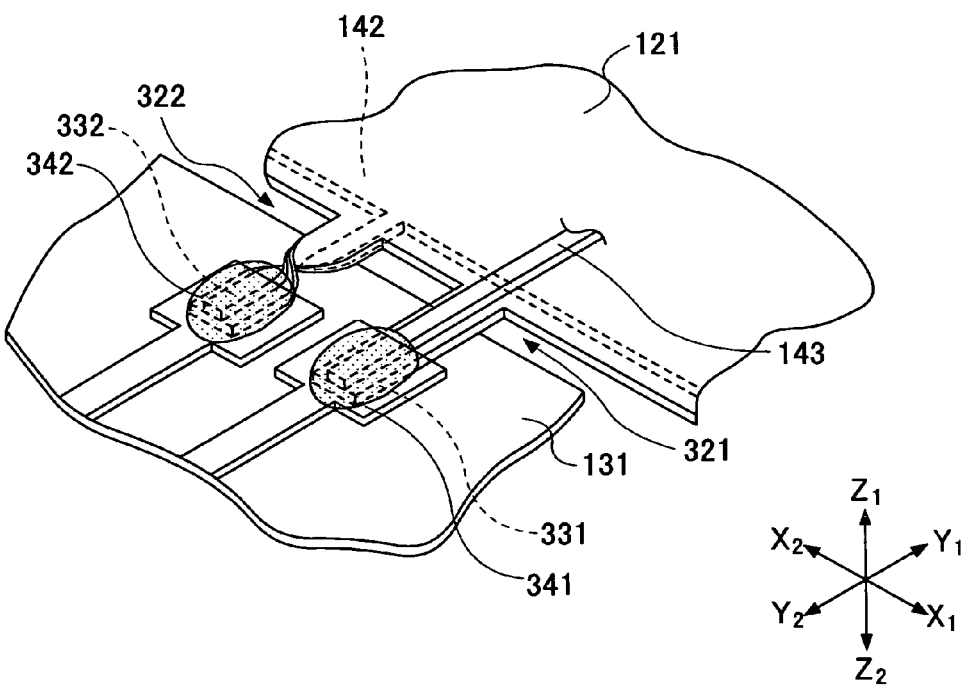

FIGS. 7A and 7B are perspective views of the antenna part 311 according to the second modified example of present invention. FIGS. 8A and 8B are schematic drawings for describing the connection of the antenna part 311 according to the second modified example of the present invention. In the drawings of the second modified example of the present invention, like components are denoted by like numerals as of FIGS. 3, 4A and 4B of the above-described embodiment of the present invention and are not further described.

The antenna part 311 according to the second modified example of the present invention includes a connection part 312 having a configuration which is different from that of the antenna part 111. The connection part 312 includes a first connection part 321 and a second connection part 322.

The first connection part 321 is formed at the area where the strip line 143 extends in the Y2 direction from a Y2 direction end part of the flexible printed wiring board 121 in a manner projecting in the Y2 direction from the Y2 direction end part of the flexible printed wiring board 121. The first connection part 321 has a connection pad 331 formed on its plane facing the Z1 direction. The connection pad 331 is connected to the Y2 direction end part of the strip line 143. The first connection part 321 is formed with a predetermined length such that the front and back planes of the first connection part 321 can be reversed by twisting the first connection part 321 in a θ1 direction.

The second connection part 322 is formed adjacent to the first connection part 321 in the X2 direction in a manner projecting in the Y2 direction from the Y2 direction end part of the flexible printed wiring board 121. The second connection part 322 has a connection pad 332 formed on its plane facing the Z2 direction. The connection pad 332 is connected to the ground pattern 142.

As shown in FIGS. 8A and 8B, first and second connection pads 341 and 342 are formed on the printed wiring board 131 (to which the antenna part 311 is to be soldered). The first connection pad 341 is formed on a Z1 plane of the printed wiring board 131 at a position corresponding to the first connection part 321. Furthermore, the second connection pad 342 is formed on a Z2 plane of the printed wiring board 131 at a position corresponding to the second connection part 322. As shown in FIG. 8A, the first connection part 321 of the antenna part 311 is positioned facing the first connection pad 341 of the printed wiring board 131 and the second connection part 322 of the antenna part 311 is positioned facing the second connection pad 342 of the printed wiring board 131 by twisting the second connection part 322 in the θ1 direction.

Then, the connection pad 331 of the first connection part 321 is soldered to the first connection pad 341 of the printed wiring board 131 on the Z1 direction plane of the printed wiring board, and the connection pad 332 of the second connection part 322 is soldered to the second connection pad 342 of the printed wiring board 131 on the Z1 direction plane of the printed wiring board 131.

Thereby, one side (plane) of the printed wiring board 131 is connected to the antenna part 311.

Third Modified Example

Although the antenna part is directly soldered to the printed wiring board in the above-described embodiment of the present invention, the antenna part and the printed wiring board may alternatively be connected via a coaxial cable.

Figure 9A:
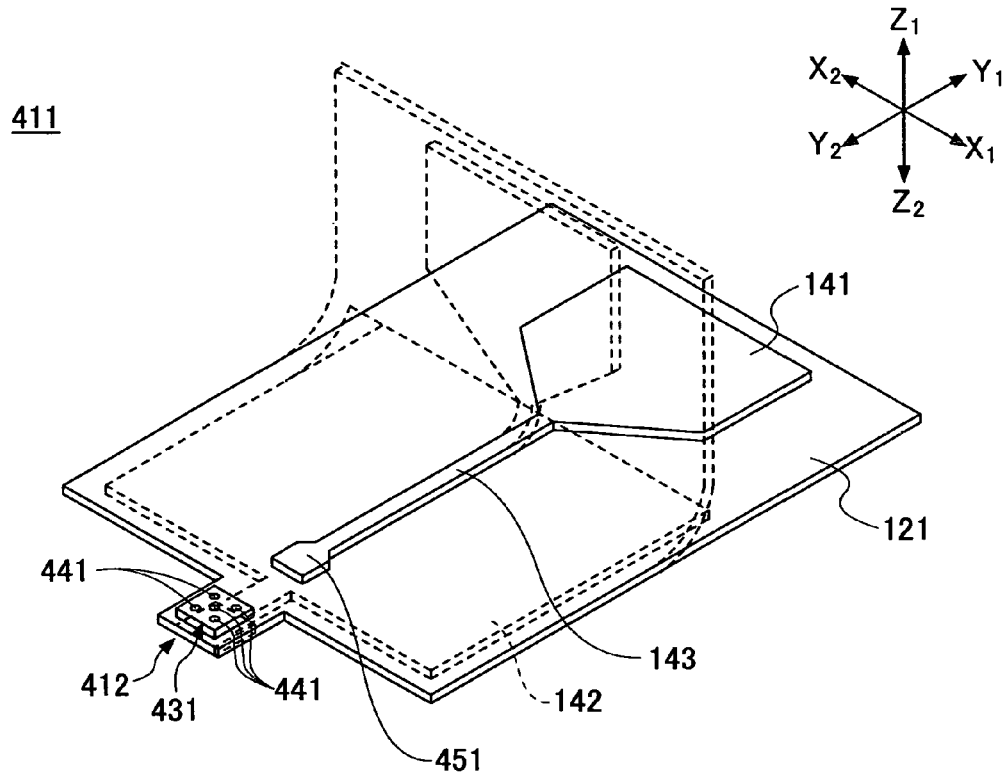
FIGS. 9A and 9B are perspective views of a third modified example of antenna part (element) according to an embodiment of the present invention.
Figure 9B:
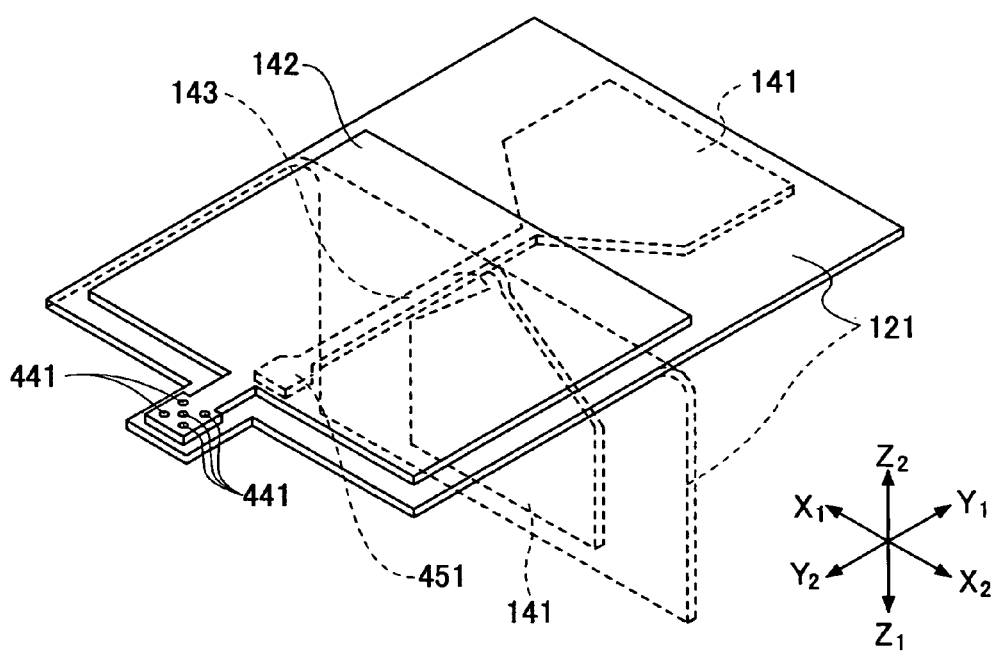
Figure 10A:
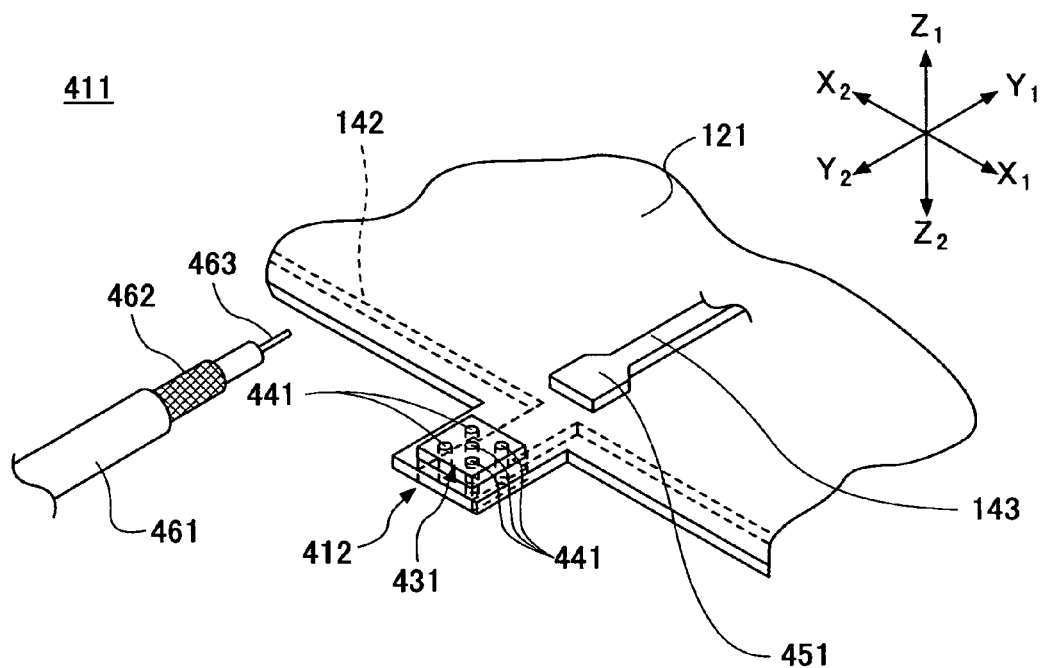
FIGS. 10A and 10B are perspective views for describing the connection state of the antenna part (element) of the third modified example.
Figure 10B:
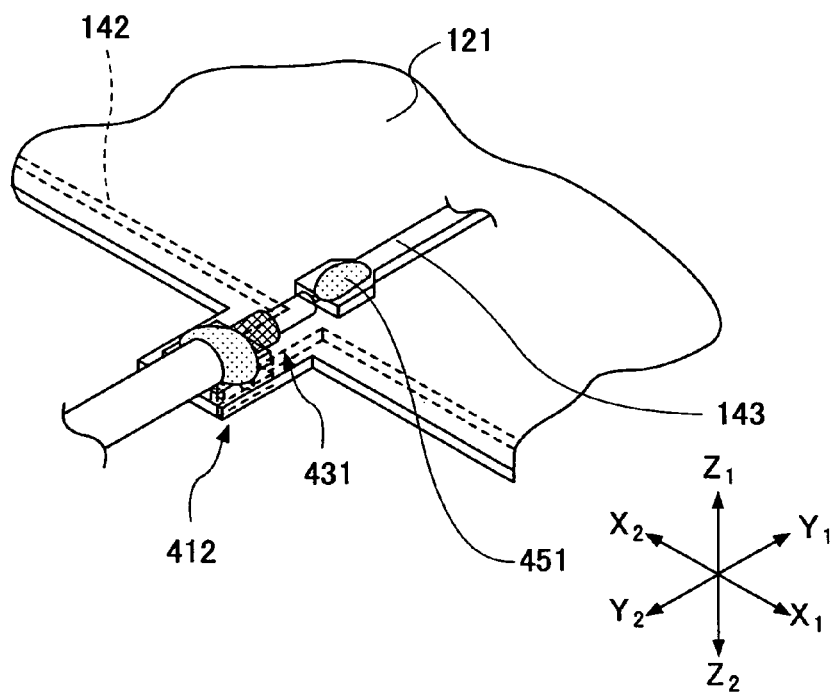

FIGS. 9A and 9B are perspective views of the antenna part 411 according to the third modified example of present invention. FIGS. 10A and 10B are schematic drawings for describing the connection of the antenna part 411 according to the third modified example of the present invention. In the drawings of the third modified example of the present invention, like components are denoted by like numerals as of FIGS. 3, 4A and 4B of the above-described embodiment of the present invention and are not further described.

The antenna part 411 according to the third modified example of the present invention includes a connection part 412 having a configuration which is different from that of the antenna part 111. The connection part 412 is formed at the area where the strip line 143 extends in the Y2 direction from a Y2 direction end part of the flexible printed wiring board 121 in a manner projecting in the Y2 direction from the Y2 direction end part of the flexible printed wiring board 121. The connection part 412 has a connection pad 431 formed on its plane facing the Z1 direction. The connection pad 431 is connected to the ground pattern 142 on the Z2 direction side via a through hole(s) 441.

The strip-line 143 is connected to a connection pad 451 which is positioned in the Y1 direction with respect to the connection part 412.

As shown in FIG. 10A, a coaxial cable 461 connects the antenna part 411 and the flexible printed wiring board 121 by mounting its shield 462 on the connection pad 431, positioning its core wire 463 on the connection pad 451, and soldering the shield 462 to the connection pad 431 and/or the core wire 463 to the connection pad 451.

Although the coaxial cable 461 is connected to the antenna part 411 by soldering the shield 462 to the connection pad 431 in the above-described modified example, the coaxial cable 461 may also be directly soldered to the ground pattern 142 from the back side of the connection part 412.

Fourth Modified Example

Figure 11A:
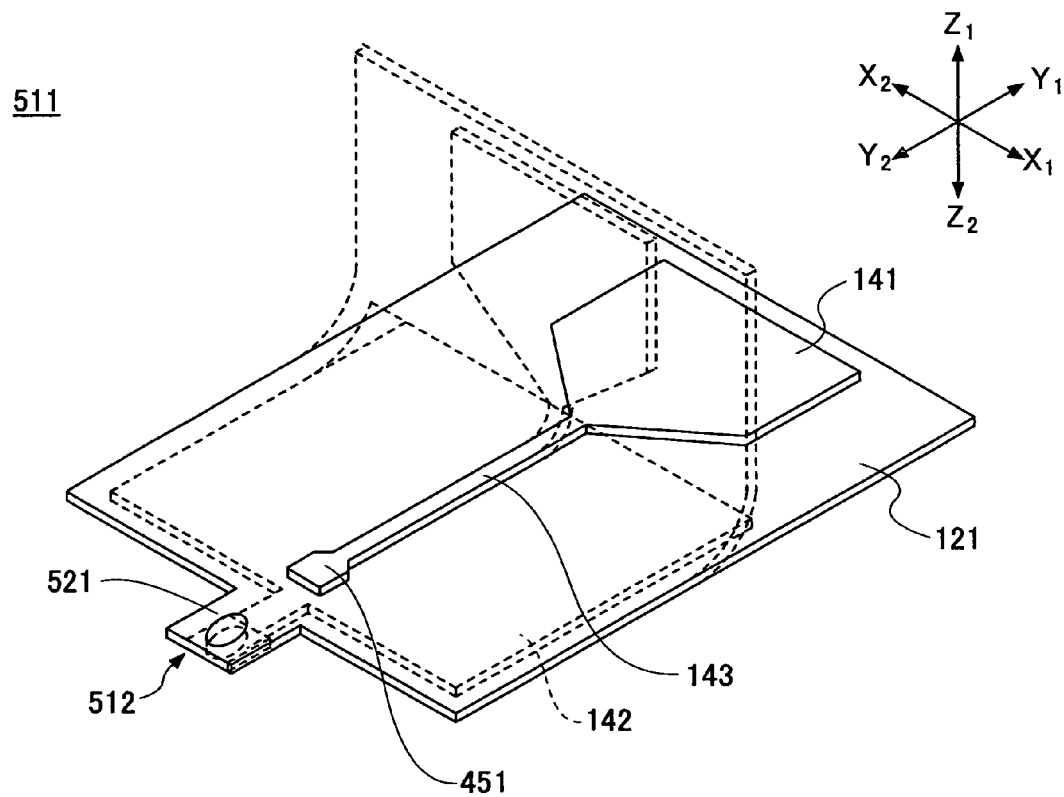
FIGS. 11A and 11B are perspective views of a fourth modified example of antenna part (element) according to an embodiment of the present invention.
Figure 11B:
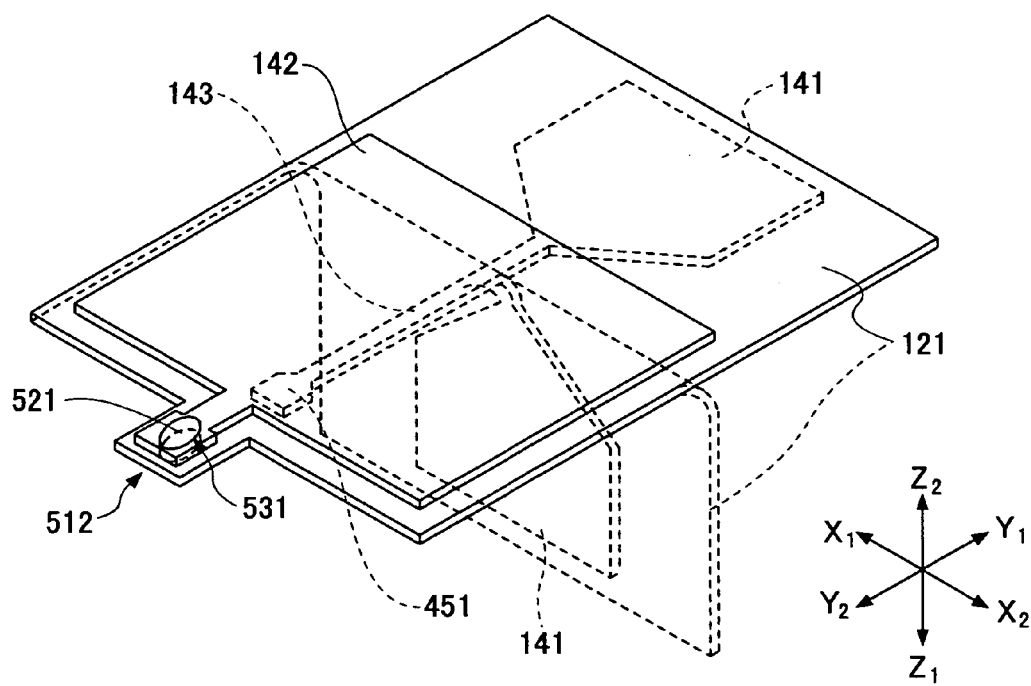
Figure 12A:
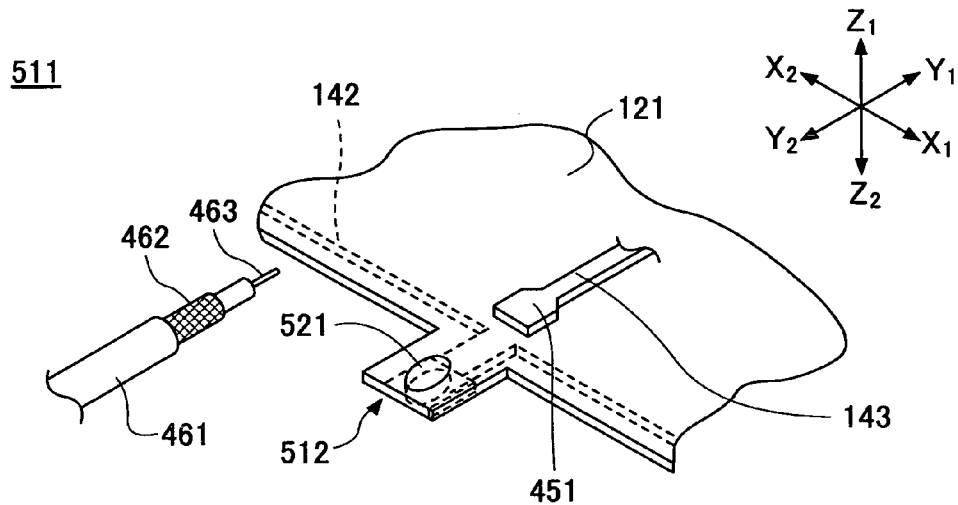
FIGS. 12A-12C are perspective views for describing the connection state of the antenna part (element) of the fourth modified example.
Figure 12B:
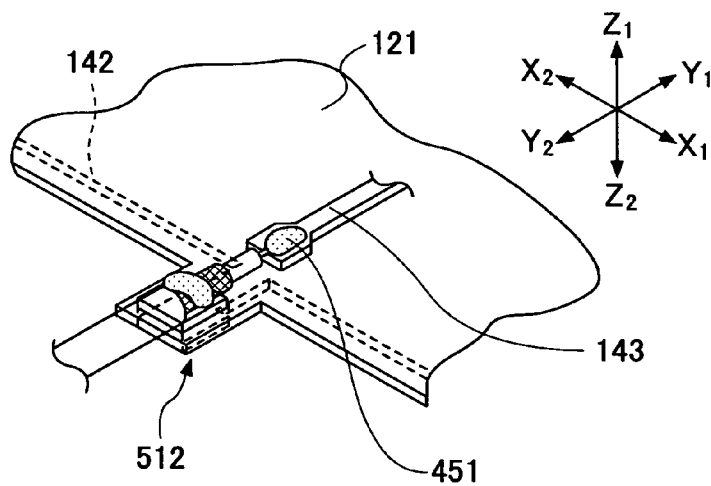
Figure 12C:
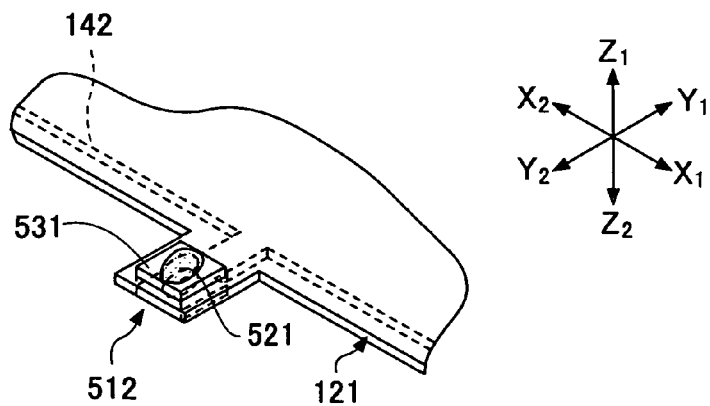

FIGS. 11A and 11B are perspective views of the antenna part 511 according to the fourth modified example of present invention. FIGS. 12A-12C are schematic drawings for describing the connection of the antenna part 511 according to the fourth modified example of the present invention. In the drawings of the fourth modified example of the present invention, like components are denoted by like numerals as of FIGS. 9A, 9B, 10A, and 10B of the above-described embodiment of the present invention and are not further described.

The antenna part 511 according to the fourth modified example of the present invention includes a connection part 512 having a configuration which is different from that of the antenna part 111. The connection part 512 is formed at the area where the strip line 143 extends in the Y2 direction from a Y2 direction end part of the flexible printed wiring board 121 in a manner projecting in the Y2 direction from the Y2 direction end part of the flexible printed wiring board 121. The connection part 512 is provided with a through-hole 521. The through-hole 521 is a hole penetrating through the Z1 and Z2 planes of the flexible printing wiring board 121. A connection pad 531, which is connected to the ground pattern 142, is formed around the through-hole 521 on the Z2 direction plane of the connection part 512.

As shown in FIG. 12A, a coaxial cable 461 connects the antenna part 511 and the flexible printed wiring board 121 by mounting its shield 462 above the through-hole 521. Then, the shield 462 is soldered to the connection pad 531 on the Z2 direction plane of the connection part 512 via the through-hole 521. The core wire 463 is soldered to the connection pad 451 on its Z1 direction plane. Accordingly, the core wire 463 is connected to the connection pad 451, and the shield 462 is connected to the connection pad 531. Thereby, the coaxial cable 461 is connected to the antenna part 511 and the flexible wiring board 121.

Fifth Modified Example

FIGS. 13A-13D are schematic drawings for describing the configuration of the printed wiring board 121 according to an embodiment of the present invention.

Figure 13A:
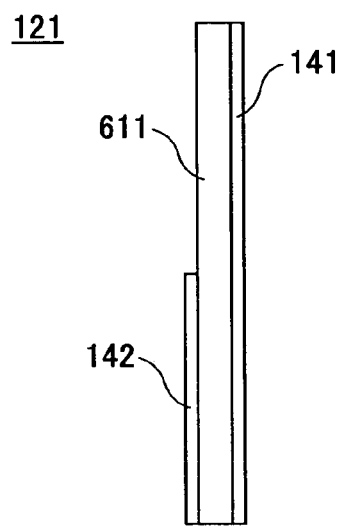
FIGS. 13A-13D are schematic drawings each showing an exemplary configuration of a printed wiring board according to an embodiment of the present invention.
Figure 13B:
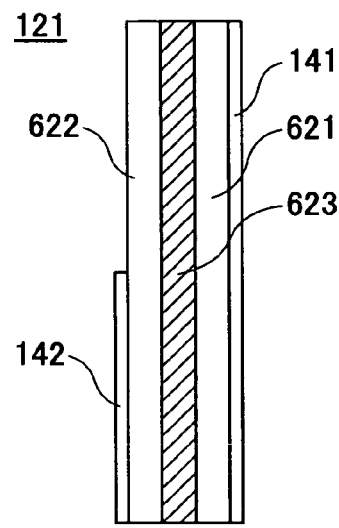

As shown in FIG. 13A, the printed wiring board 121 according to the above-described embodiment of the present invention is formed having a single layer of a base material 611. In an alternative example shown in FIG. 13B, the printed wiring board 121 may be formed having two layers of base materials 621, 622 that are adhered to each other by an adhesive agent 623. With this alternative example, the width of the strip-line 143 can be broadened since the space between the element pattern 141 and the ground pattern 142 can be increased. Thereby, the strip-line 143 can be, for example, prevented from being broken off.

Figure 13C:
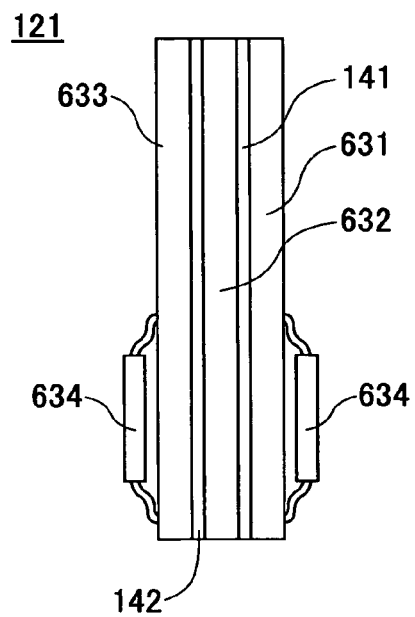

In another alternative example shown in FIG. 13C, the element pattern 141 may be provided between a base material 631 and a base material 632, and the ground pattern 142 may be provided between the base material 632 and a base material 633. In this alternative example, a surface mounted electronic component(s) 634 may be mounted on the surface of the printed wiring board 121 as shown in FIG. 13C.

Figure 13D:
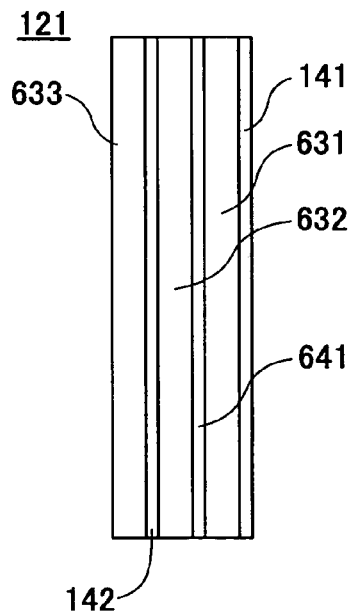

In yet another alternative example shown in FIG. 13D, the element pattern 141 may be provided on the surface side of the base material 631, the ground pattern 142 may be provided between the base material 632 and the base material 633, and a power source pattern 641 may be provided between the base material 631 and the base material 632. Furthermore, a surface mounted electronic component (not shown) may be mounted on the surface side of the base material 633.

Other Examples

Although a monopole type antenna is used in the above-described embodiment of the present invention for describing the antenna apparatus of the present invention, a dipole type antenna (ultra wideband dipole antenna) may also be used.

Figure 14:
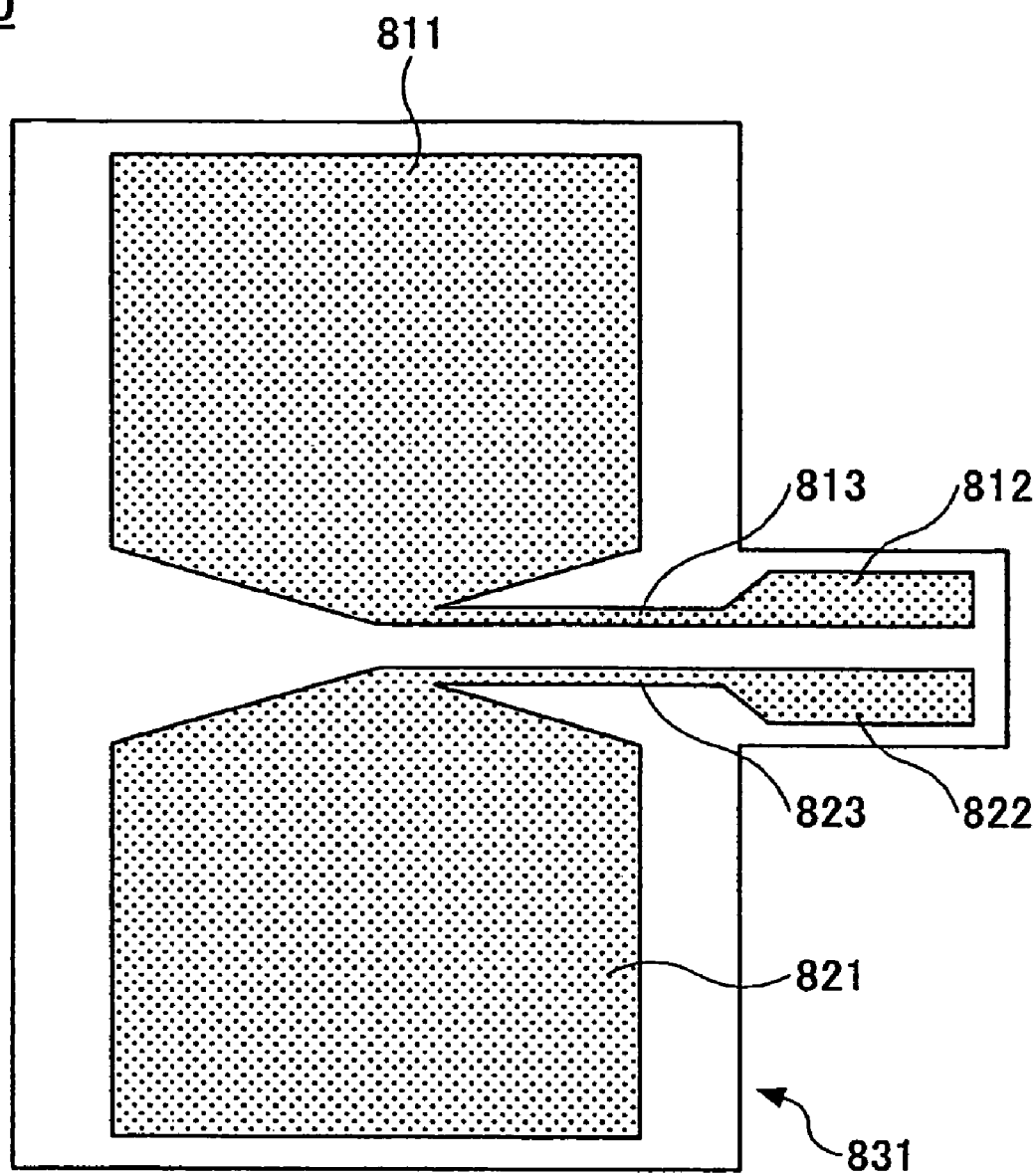
FIG. 14 is a schematic drawing showing an exemplary configuration of a dipole type antenna apparatus according to an embodiment of the present invention.

FIG. 14 is a schematic drawing showing an exemplary configuration of a dipole type antenna apparatus 800 according to an embodiment of the present invention.

The antenna apparatus 800 includes a flexible printed wiring board 831 on which a first element pattern 811, a strip-line 813 for connecting the first element pattern 811 to a connection pad 812, a second element pattern 821, and a strip-line 823 for connecting the second element pattern 821 to a connection pad 822 are formed.

The dipole type antenna apparatus 800 can attain the same effects and performances as those of the above-described monopole type antenna apparatus 100.

Mounting Examples

Next, examples (methods) for mounting the antenna apparatus of the present invention onto various electronic devices (e.g. a mouse, a keyboard, a mobile phone) are described.

First Mounting Example

Figure 15:
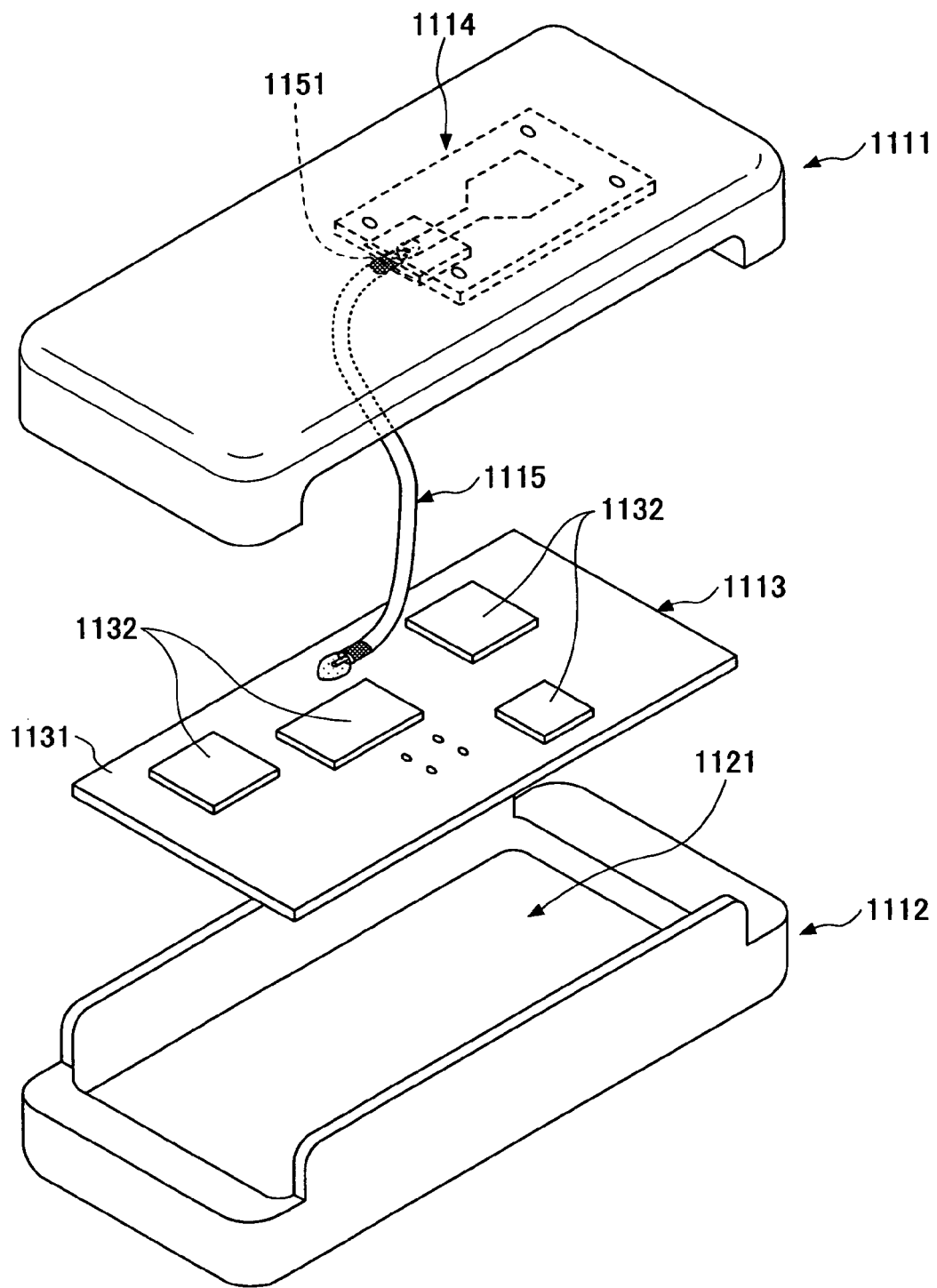
FIG. 15 is an exploded perspective view of a first mounting example according to an embodiment of the present invention.
Figure 16:
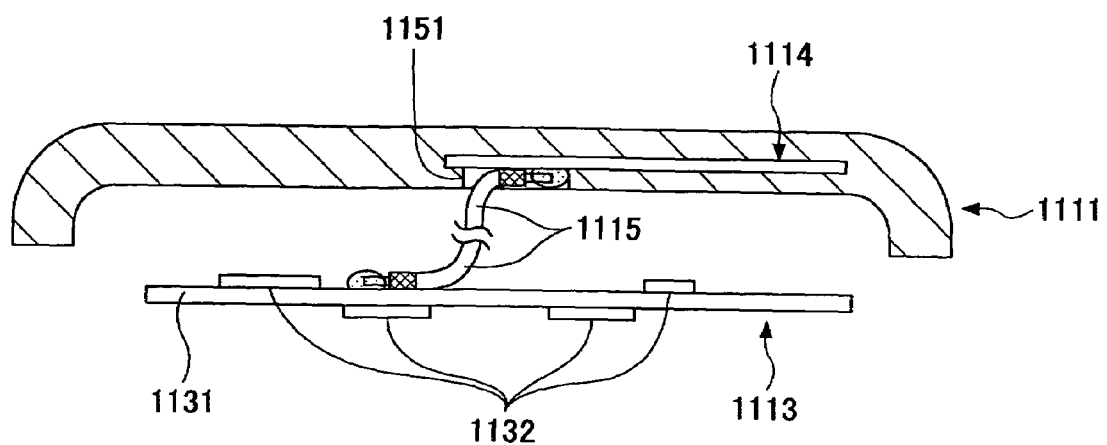
FIG. 16 is a cross-sectional view of the first mounting example according to an embodiment of the present invention.

FIG. 15 is an exploded perspective view for describing the first mounting example according to an embodiment of the present invention, and FIG. 16 is a cross-sectional view for describing the first mounting example according to an embodiment of the present invention.

In FIG. 15, an electronic device 1100 includes housings 1111, 1112, a circuit board 1113, an antenna apparatus 1114, and a coaxial cable 1115.

The housings 1111, 1112 are molded with a resin material, for example. An installment portion 1121 is obtained by combining the housings 1111, 1112 together. The circuit board 1113 is installed in the installment portion 1121. The circuit board 1113 includes a printed wiring board 1131 on which an electronic component 1132 is mounted.

The same as the above-described antenna apparatus 100, the antenna apparatus 1114 has a flexible printed wiring board on which conductive patterns including an element pattern and a ground pattern are formed. Since the antenna apparatus 1114 is thinly formed, the antenna apparatus 100 can be insert-molded to the housing 1111. Thereby, the antenna apparatus 1114 can be integrally formed with the housing 1111. The antenna apparatus 1114, having the tip of a microline in an exposed state at an opening part 1151 of the housing 1111, is connected to the circuit board 1113 via the coaxial cable 1115.

The coaxial cable 1115 has one end connected to the antenna apparatus 1114 and another end connected to the circuit board 1113. The antenna apparatus 1114 and the coaxial cable 1115 may be connected in a manner as shown in FIGS. 9A-10B of the third modified example or in a manner shown in FIGS. 11A-12C of the fourth modified example.

Thereby, a signal line of the coaxial cable 1115 is connected to the element pattern of the antenna apparatus 1114, and a ground (GND) line of the coaxial cable 1115 is connected to the GND pattern of the antenna apparatus 1114.

With the first mounting example, little or no space is required for mounting the antenna apparatus 1114 since the antenna apparatus 1114 is integrally formed with the housing 1111. This enables size-reduction of the electronic device 1100.

Second Mounting Example

Figure 17:
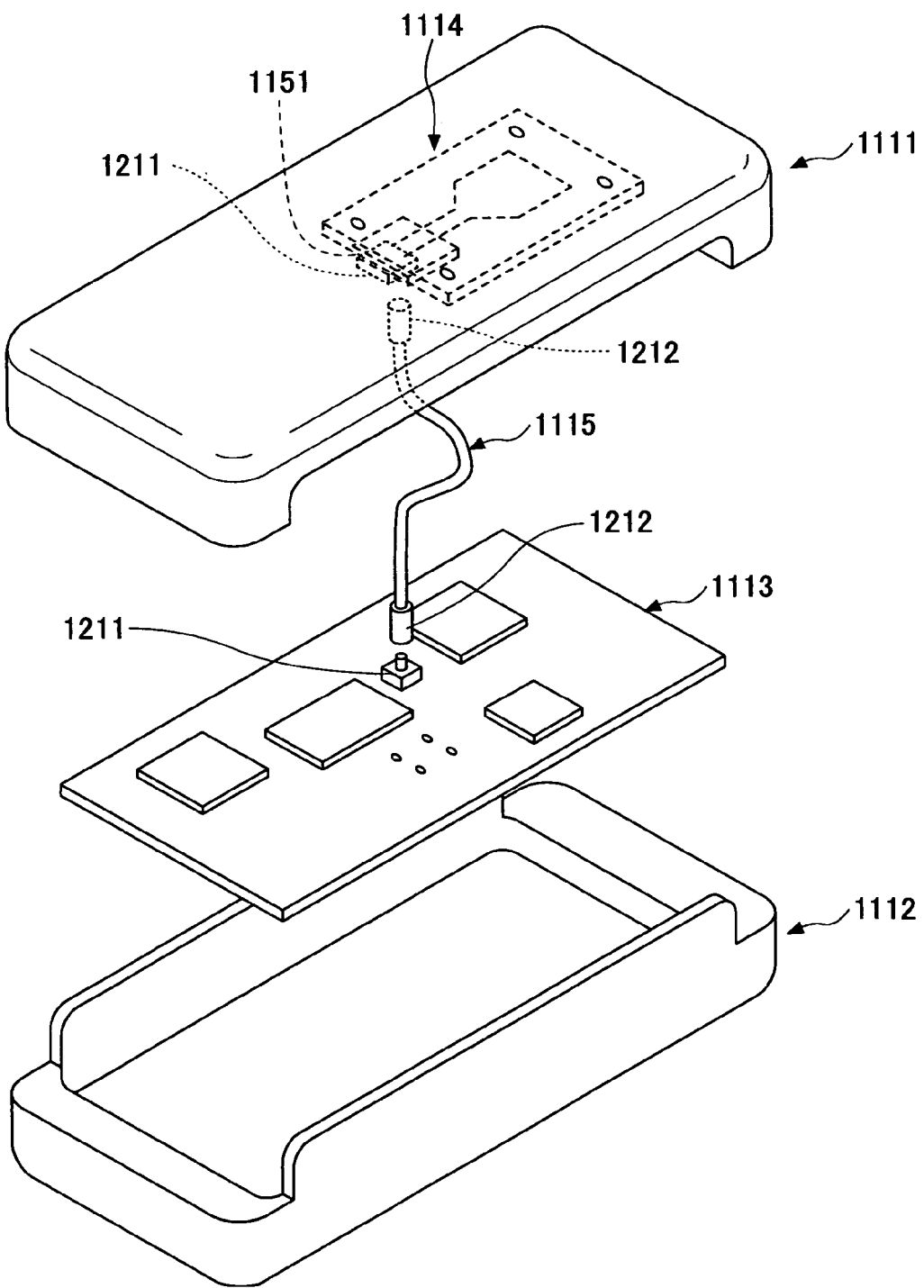
FIG. 17 is an exploded perspective view of a second mounting example according to an embodiment of the present invention.
Figure 18:
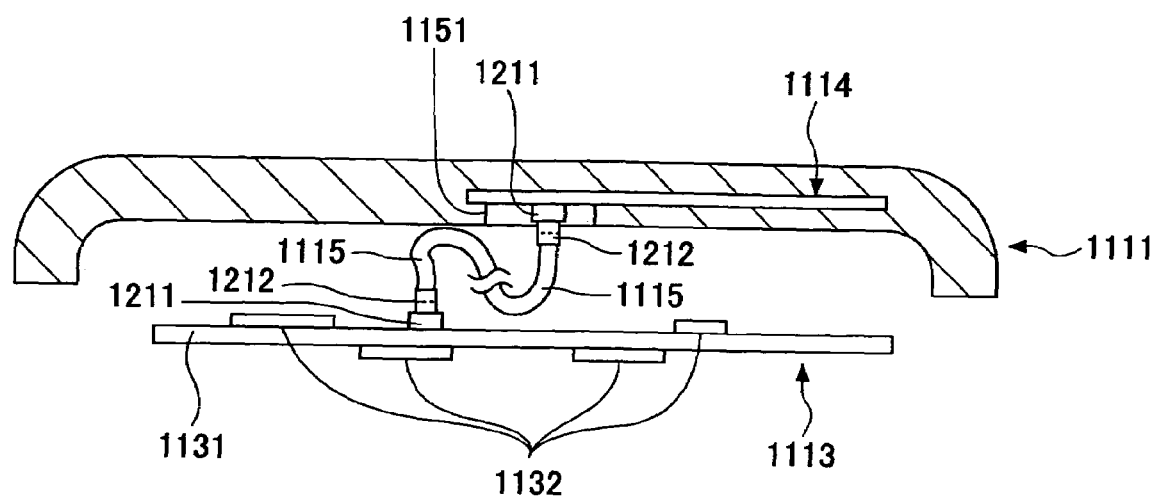
FIG. 18 is a cross-sectional view of the second mounting example according to an embodiment of the present invention.

FIG. 17 is an exploded perspective view for describing the second mounting example according to an embodiment of the present invention, and FIG. 18 is a cross-sectional view for describing the second mounting example according to an embodiment of the present invention. In FIGS. 17 and 18, like components are denoted by like numerals as of FIGS. 15 and 16 of the first mounting example and are not further described.

In FIG. 17, an electronic device 1200 includes a circuit board 1113 and an antenna apparatus 1114 that are connected to a coaxial cable 1115 by socket connectors 1211 and plug connectors 1212.

The socket connectors 1211 are mounted on the circuit board 1113 and the antenna apparatus 1114. The plug connectors 1212 are attached to each end of the coaxial cable 1115. By connecting the plug connectors 1212 of the coaxial cable 1115 to the socket connectors 1211 of the circuit board 1113 and the antenna apparatus 1114, the circuit board 1113 and the antenna apparatus 1114 are connected via the coaxial cable 1115.

With the second mounting example, the circuit board 1113 and the antenna apparatus 1114 can be easily connected to the coaxial cable 1115.

Although the connection between the coaxial cable 1115 and the circuit board 1113 and the connection between the coaxial cable 1115 and the antenna apparatus 1114 are achieved by using connectors on both ends of the coaxial cable 1115 according to the above-described second mounting example, the connections may be achieved by using a single connector on one of the ends of the coaxial cable 1115.

Furthermore, although the connectors used in the above-described second mounting example are surface mounting type connectors dedicated to be mounted on a surface portion, other connectors such as edge mounting type connectors dedicated to be mounted on an edge portion may alternatively used as long as the connectors are enable easy connection of the coaxial cable 1115.

Third Mounting Example

Figure 19:
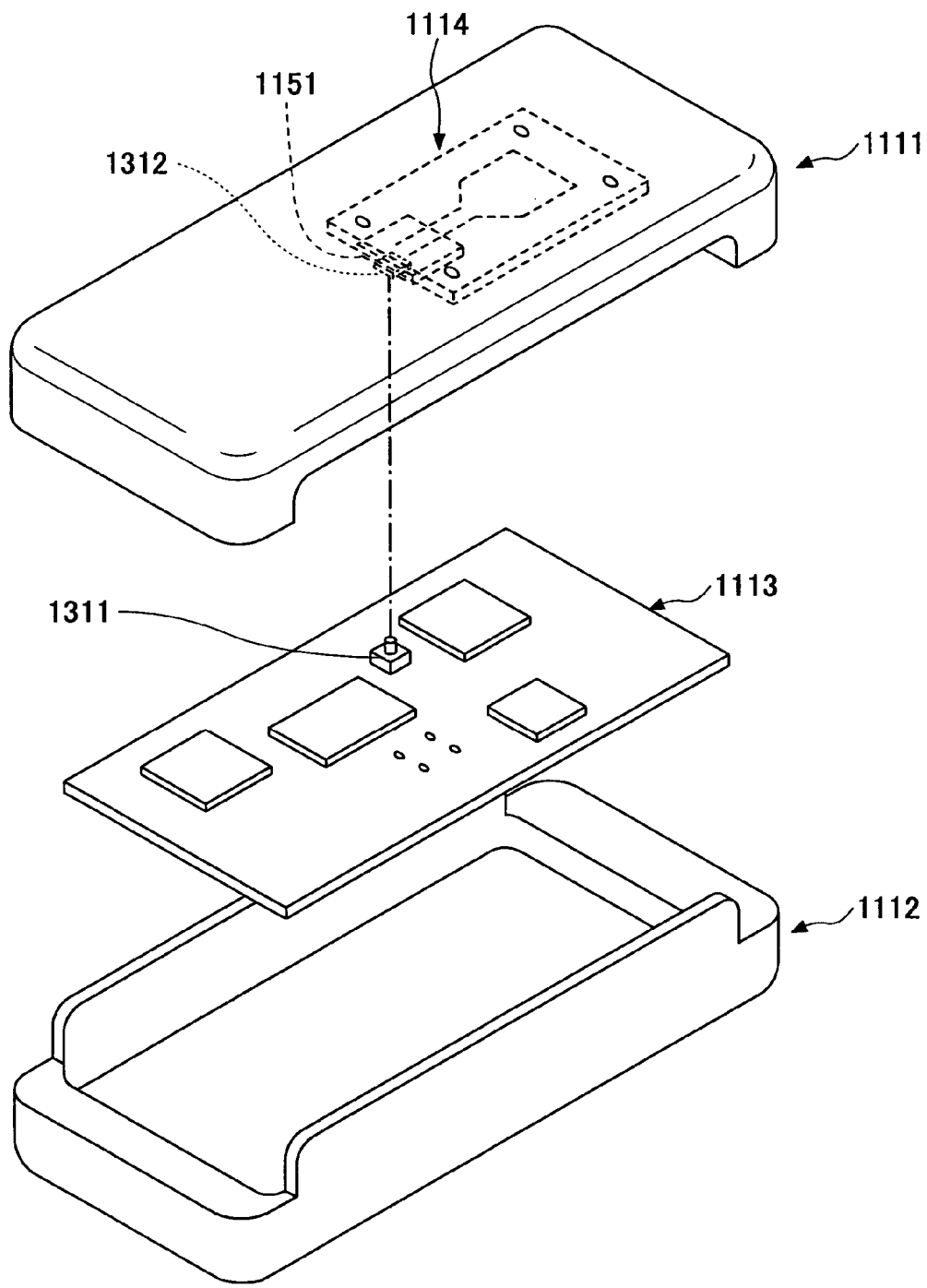
FIG. 19 is an exploded perspective view of a third mounting example according to an embodiment of the present invention.
Figure 20:
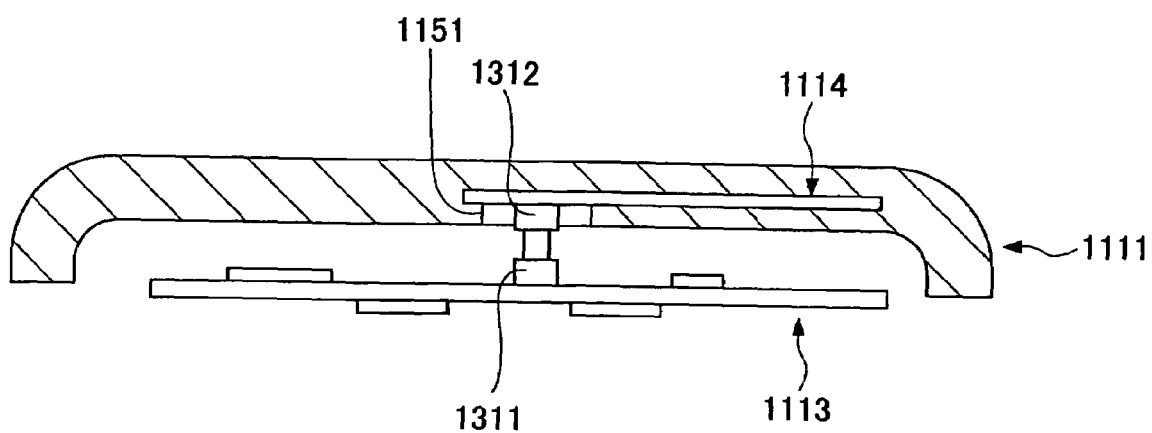
FIG. 20 is a cross-sectional view of the third mounting example according to an embodiment of the present invention.

FIG. 19 is an exploded perspective view for describing the third mounting example according to an embodiment of the present invention, and FIG. 20 is a cross-sectional view for describing the third mounting example according to an embodiment of the present invention. In FIGS. 19 and 20, like components are denoted by like numerals as of FIGS. 17 and 18 of the second mounting example and are not further described.

In FIG. 19, an electronic device 1300 includes a circuit board 1113 and an antenna apparatus 1114 that are directly connected by a socket connector 1311 and a plug connector 1312.

The socket connector 1311 is mounted on the circuit board 1113. The plug connector 1312 is mounted on the antenna apparatus 1114. When the housing 1111 is coupled to the housing 1112, the socket connector 1311 and the plug connector 1312 become attached in a manner facing each other. That is, by coupling the housing 1111 and the housing 1112 together, the plug connector 1312 of the antenna apparatus 1114 is inserted into the socket connector 1311 of the circuit board 1113. Thereby, the circuit board 1113 and the antenna apparatus 1114 are connected.

With the third mounting example, no cable is necessary since the circuit board 1113 and the antenna apparatus 1114 are directly connected. Furthermore, the circuit board 1113 and the antenna apparatus 1114 can easily be connected by simply coupling the housing 1111 and the housing 1112 together.

Fourth Mounting Example

Figure 21:
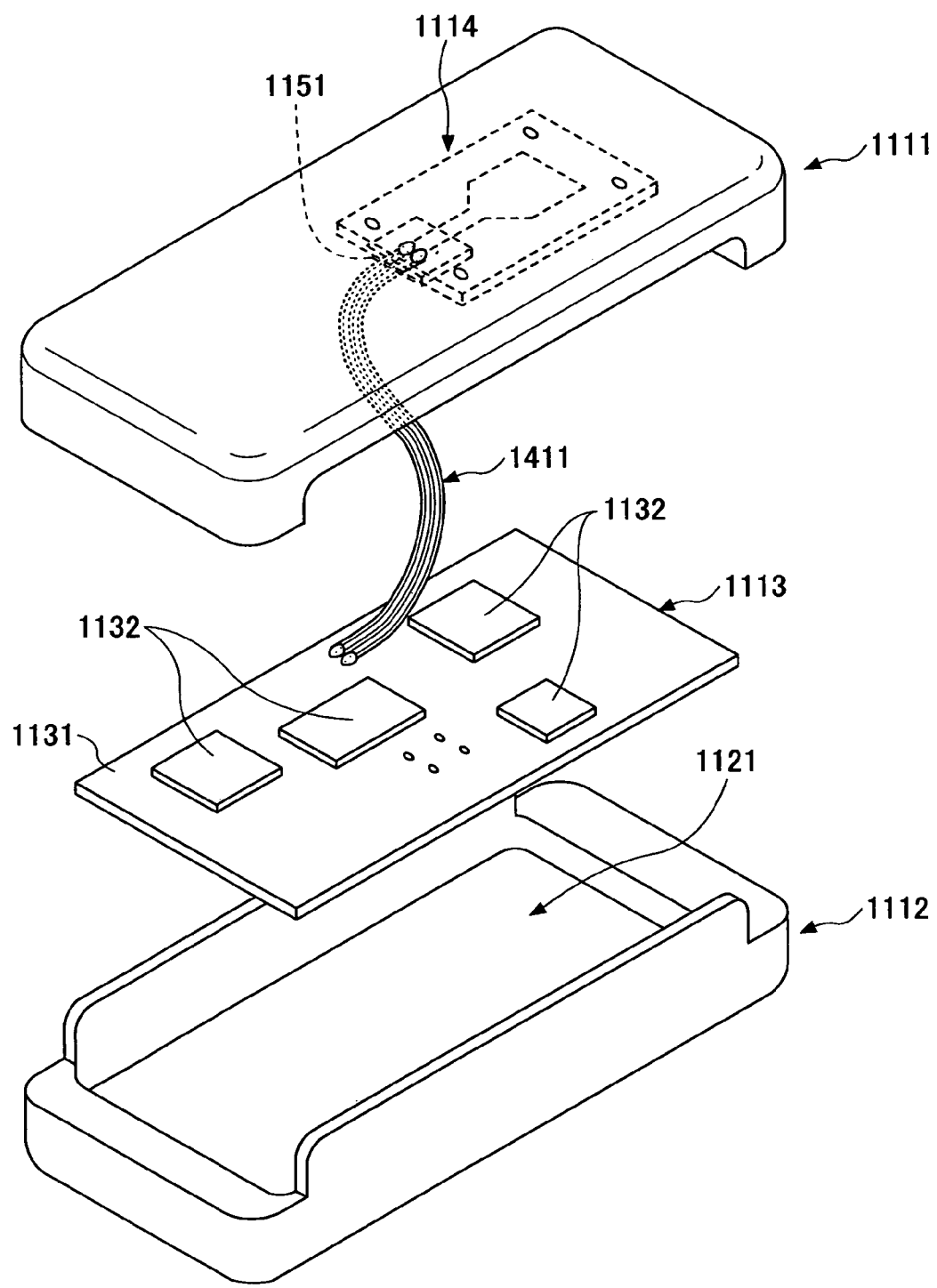
FIG. 21 is an exploded perspective view of a fourth mounting example according to an embodiment of the present invention.
Figure 22A:
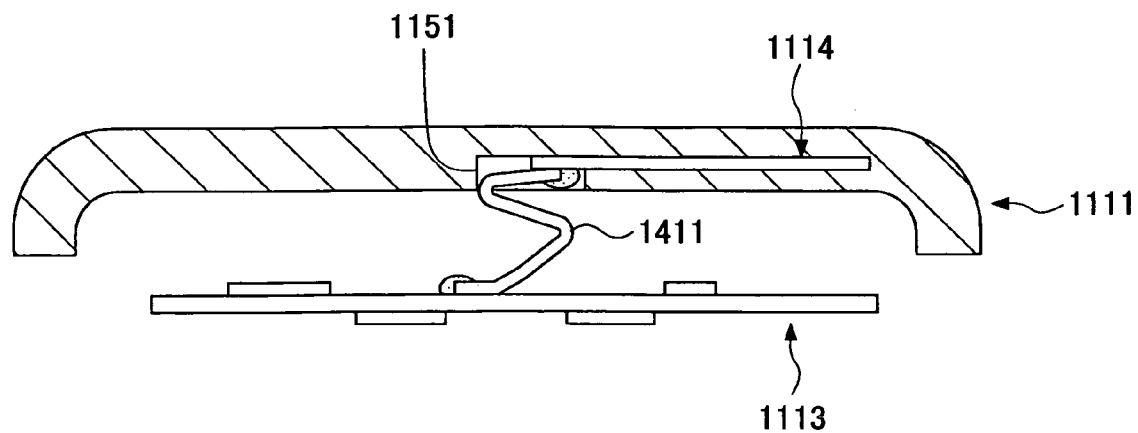
FIGS. 22A-22B are schematic drawings of the fourth mounting example according to an embodiment of the present invention.
Figure 22B:
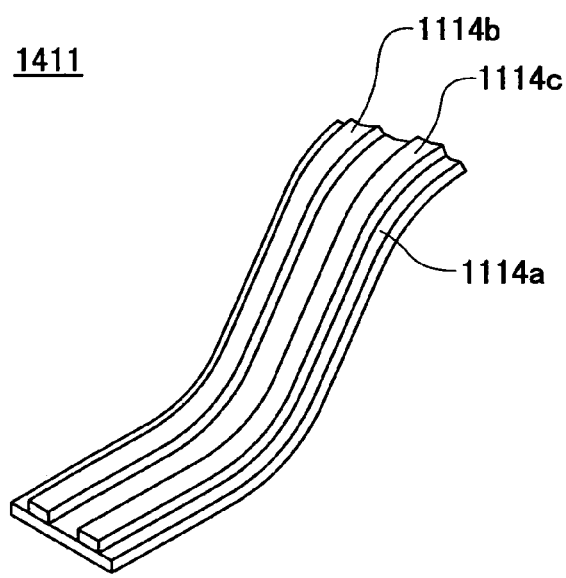

FIG. 21 is an exploded perspective view for describing the fourth mounting example according to an embodiment of the present invention, and FIGS. 22A and 22B are schematic drawings for describing a main portion of the fourth mounting example according to an embodiment of the present invention. In FIGS. 21, 22A, and 22B, like components are denoted by like numerals as of FIGS. 15 and 16 of the first mounting example and are not further described.

In FIG. 21, an electronic device 1400 includes a circuit board 1113 and an antenna apparatus 1114 that are connected by a FPC cable 1411 (as an alternative of the coaxial cable in the first mounting example). The FPC cable 1411 formed by molding a flexible printed wiring board into a ribbon-like shape. The FPC cable 1411 includes a flexible substrate 1114a having wirings 1411b, 1411c disposed on one of its planes (See FIG. 22B). The wiring 1411b is connected to an element pattern of the antenna apparatus 1114, and the wiring 1411c is connected to a ground pattern of the antenna apparatus 1114.

In this example, the FPC cable 1411 is soldered to the circuit board 1113 and the antenna apparatus 1114 in a manner shown in FIGS. 4-8.

Although the connection between the circuit board 1113 and the FPC cable 1411 and the connection between the antenna apparatus 1114 and the FPC cable 1411 are achieved by soldering according to this fourth mounting example, the connections may also be achieved by attaching connectors to the circuit board 1113 and the antenna apparatus 1114 and inserting the ends of the FPC cable 1411 into the connectors of the circuit board 1113 and the antenna apparatus 1114.

Fifth Mounting Example

Figure 23:
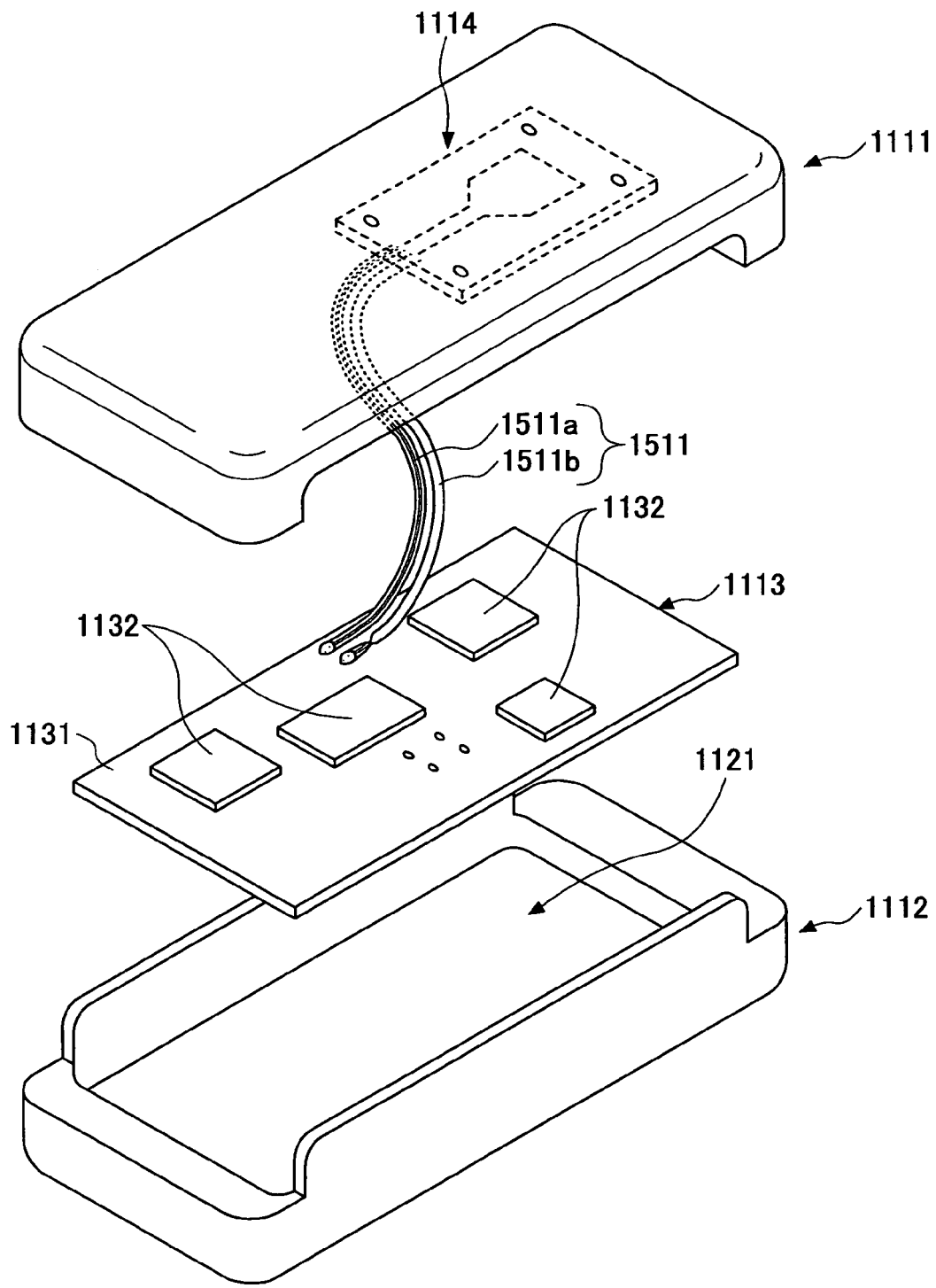
FIG. 23 is an exploded perspective view of a fifth mounting example according to an embodiment of the present invention.
Figure 24A:
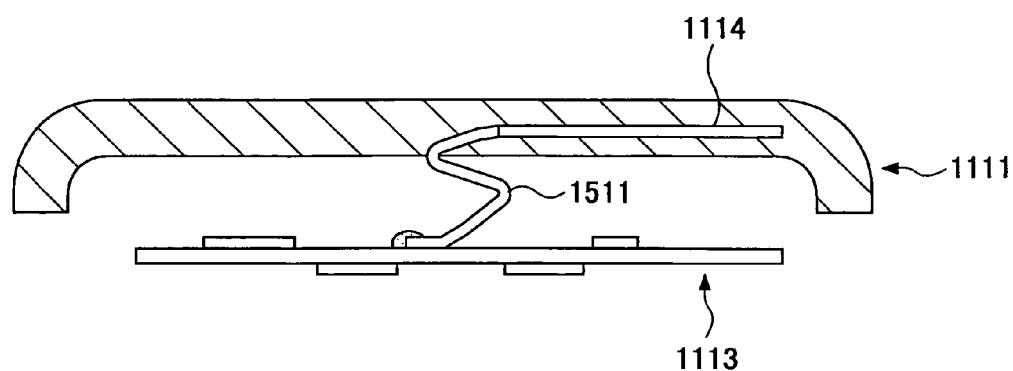
FIGS. 24A-24B are schematic drawings of the fifth mounting example according to an embodiment of the present invention.
Figure 24B:
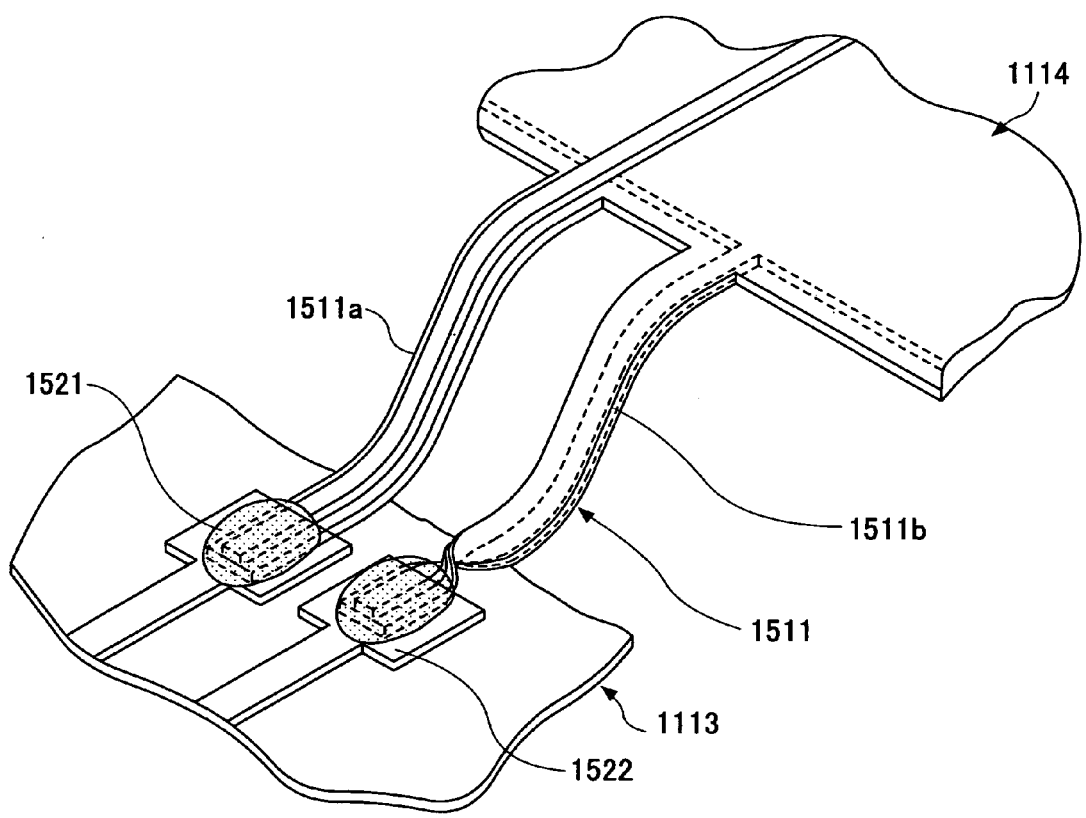

FIG. 23 is an exploded perspective view for describing the fifth mounting example according to an embodiment of the present invention, and FIGS. 24A and 24B are schematic drawings for describing a main portion of the fifth mounting example according to an embodiment of the present invention. In FIGS. 23, 24A and 24B, like components are denoted by like numerals as of FIGS. 21, 22A and 22B of the fourth mounting example and are not further described.

In FIG. 23, an electronic device 1500 includes an antenna apparatus 1114 integrally formed with a cable portion 1511. The cable portion 1511 has a cable-like configuration that is formed by extending a flexible printed wiring board included in the antenna apparatus 1114. The cable portion 1511 includes a signal cable 1511a and a ground cable 1511b. As shown in FIG. 24B, the tip of the signal cable 1511a is soldered to an antenna connection pattern 1521 of the circuit board 1113.

Furthermore, as shown in FIG. 24B, the tip of the ground cable 1511b is soldered to a ground pattern 1522 of the circuit board 1113 after twisting the ground cable 1511b such that the tip of the front and back sides of the ground cable are switched.

Sixth Mounting Example

Figure 25:
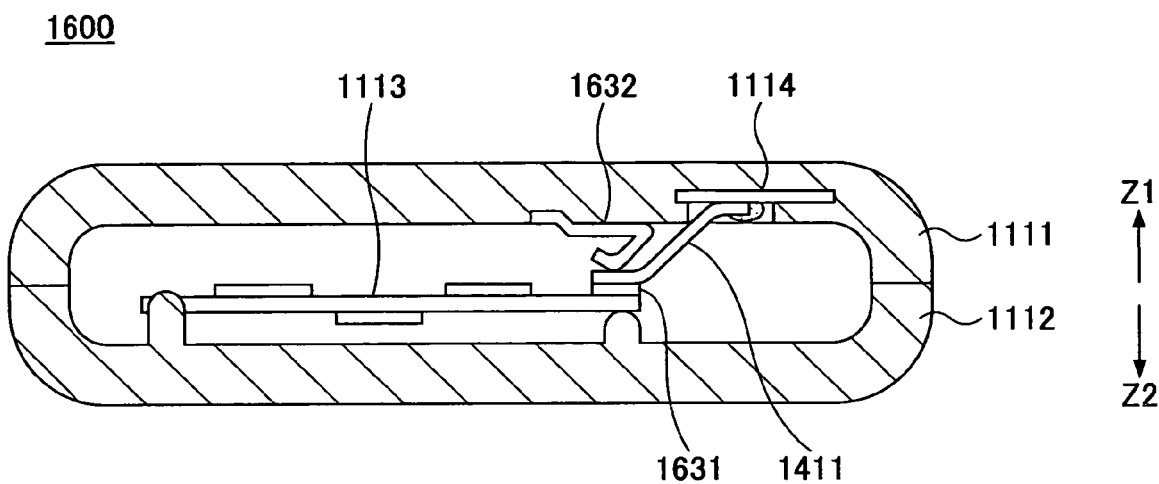
FIG. 25 is a cross-sectional view of a sixth mounting example according to an embodiment of the present invention.
Figure 26A:
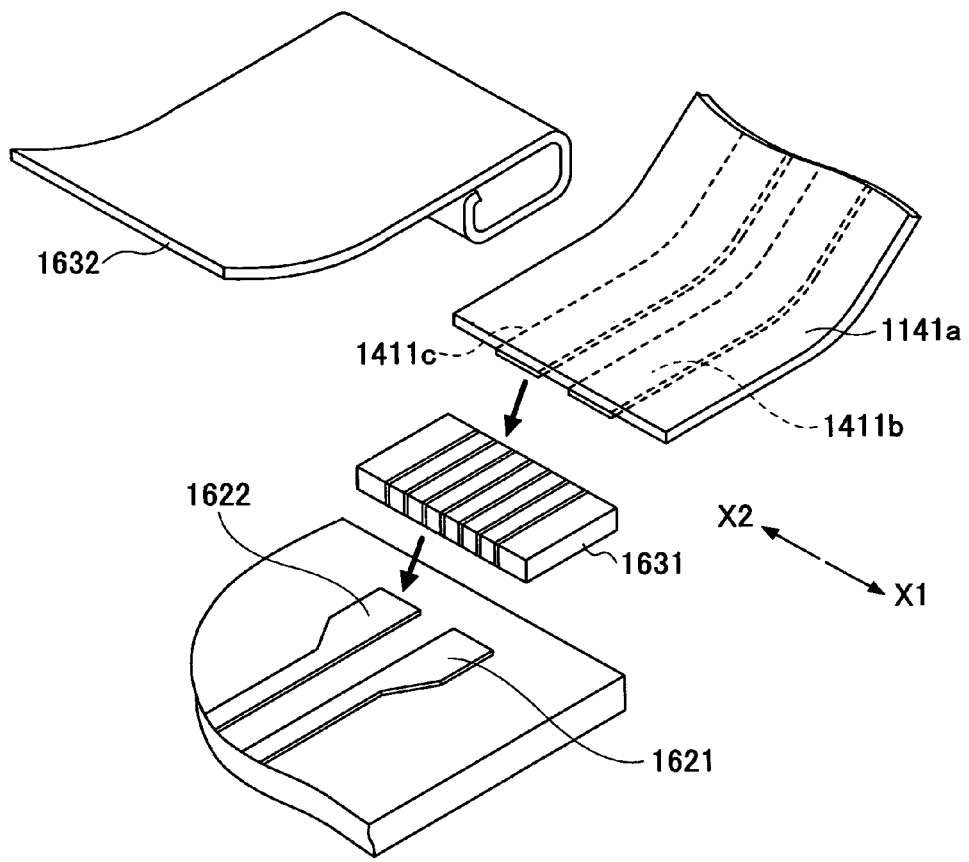
FIGS. 26A and 26B are schematic drawings of the sixth mounting example according to an embodiment of the present invention.
Figure 26B:
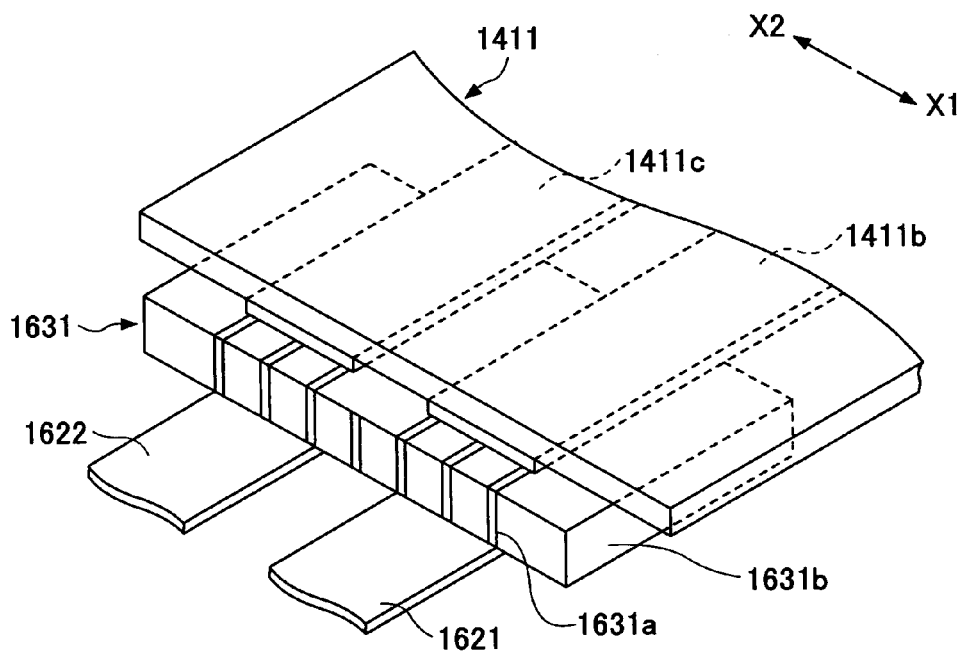

FIG. 25 is a cross-sectional view of the sixth mounting example according to an embodiment of the present invention, and FIGS. 26A and 26B are perspective views for describing a main portion of the sixth mounting example according to an embodiment of the present invention. In FIGS. 25, 26A and 26B, like components are denoted by like numerals as of FIGS. 21, 22A and 22B of the fourth mounting example and are not further described.

As shown in FIGS. 25 and 26A, an electronic device 1600 includes an anisotropic conductive rubber 1631 provided between the tip of an FPC cable 1411 and the patterns (including antenna connection pattern 1621, ground pattern 1622) of the circuit board 1113. The antenna apparatus 1114 and the circuit board 1113 included in the electronic device 1600 are connected by having the tip of the FPC cable 1411 pressed against circuit board 1113 (toward direction Z2) by an elastic member (in this example, a spring) 1632 when coupling the housing 1111 and the housing 1112 together. In the sixth mounting example, wiring patterns 1411b and 1411c are provided on a plane 1411a in the Z2 direction of the FPC cable 1411.

The anisotropic conductive rubber 1631 includes conductors 1631a and insulators 1631b that are layered in the X1-X2 directions as shown in FIGS. 26A and 26B. Thereby, the anisotropic conductive rubber 1631 is configured to have a conductive property in the Z1-Z2 directions but not in the X1-X2 directions.

The spring 1632 is situated at a position corresponding to the antenna connection pattern 1621 and the ground pattern 1622 of the housing 1111.

In the sixth mounting example, by matching the pattern of the FPC cable 1411 with the patterns (including the antenna connection pattern 1621 and the ground pattern 1622) of the circuit board 1113 and coupling the housing 1111 and the housing 1112 together, the tip of the FPC cable 1411 is urged toward the direction of the circuit board 1113 by the spring 1632. As a result, the FPC cable 1611 can be easily connected with the antenna connection pattern 1621 and the ground pattern 1622 of the circuit board 1113 via the anisotropic conductive rubber 1631.

Seventh Mounting Example

Figure 27:
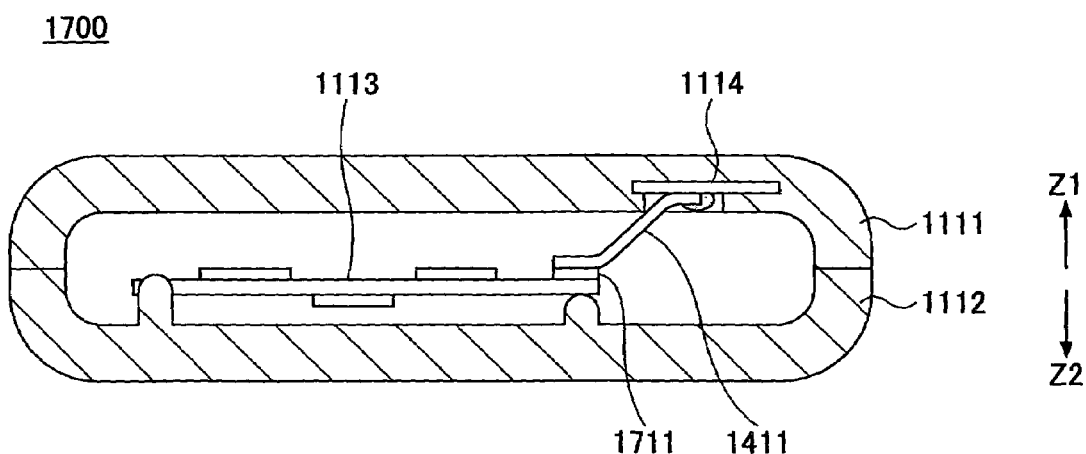
FIG. 27 is a cross-sectional view of a seventh mounting example according to an embodiment of the present invention.
Figure 28A:
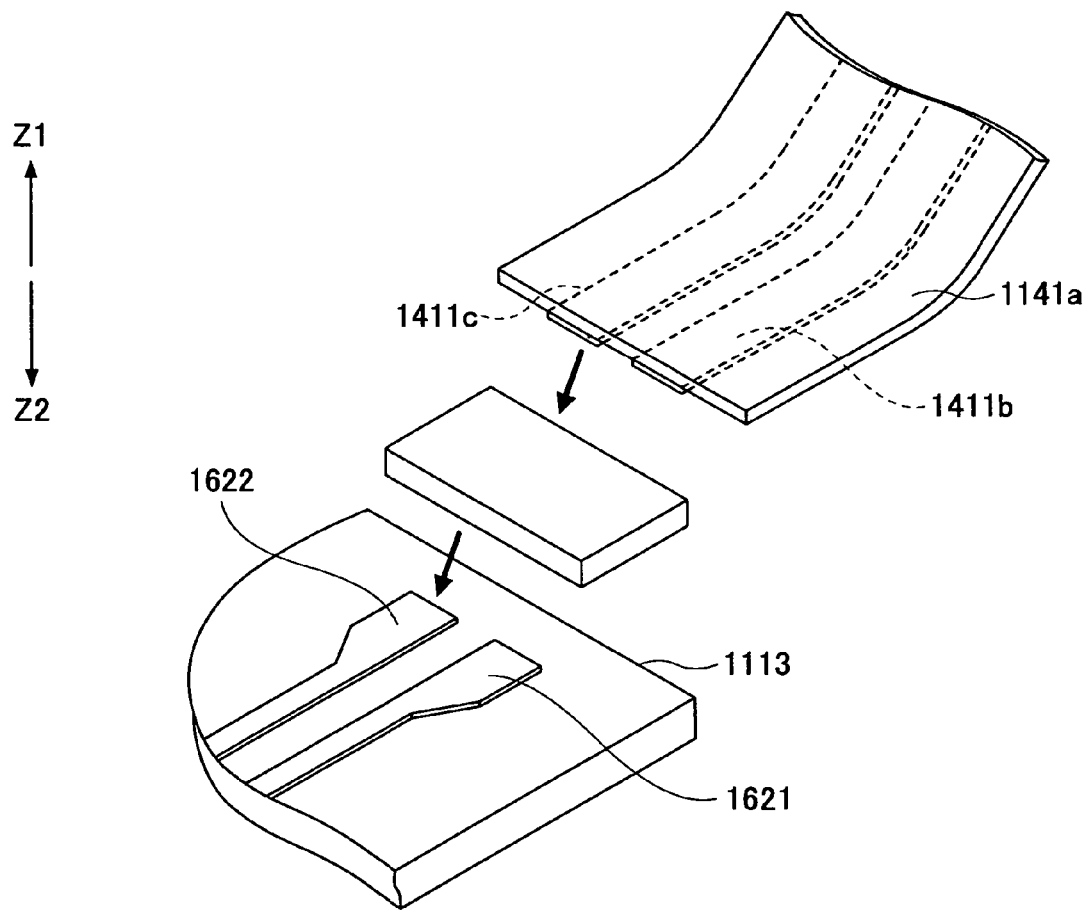
FIGS. 28A and 28B are schematic drawings of the seventh mounting example according to an embodiment of the present invention.
Figure 28B:
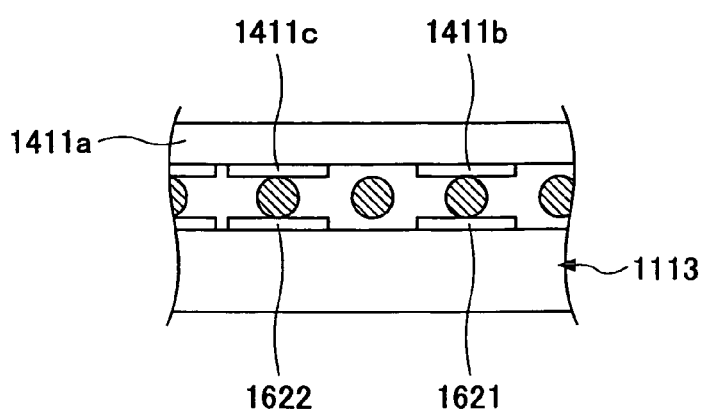

FIG. 27 is a cross-sectional view of the seventh mounting example according to an embodiment of the present invention, FIG. 28A is a perspective view for describing a main portion of the seventh mounting example according to an embodiment of the present invention, and FIG. 28B is a cross-sectional view for describing a main portion of the seventh mounting example according to an embodiment of the present invention. In FIGS. 27, 28A and 28B, like components are denoted by like numerals as of FIGS. 25, 26A and 26B of the sixth mounting example and are not further described.

As shown in FIG. 27, an electronic device 1700 includes an anisotropic conductive film 1711 provided between the tip of an FPC cable 1411 and the patterns (including antenna connection pattern 1621, ground pattern 1622) of the circuit board 1113. The antenna apparatus 1114 and the circuit board 1113 included in the electronic device 1700 are connected by performing thermal compression bonding on the anisotropic conductive film 1711 toward the Z2 direction. The anisotropic conductive film 1711 includes thermoset resin mixed with conductive particles. By performing thermal compression bonding on the anisotropic conductive film 1711, conductive particles can be provided between the antenna connection pattern 1621 and the wiring 1411b of the FPC cable 1411 as well as between the ground pattern 1622 and the wiring 1411c of the FPC cable 1411. Accordingly, a conductive property can be attained in the Z1-Z2 direction (thermal compression direction).

With the seventh mounting example, by matching the pattern of the FPC cable 1411 with the patterns (including the antenna connection pattern 1621) of the circuit board 1113 and performing thermal compression bonding on the anisotropic conductive film 1711, the FPC cable 1411 can be easily connected with the circuit board 1113 (including the antenna connection pattern 1621).

Eighth Mounting Example

Figure 29:
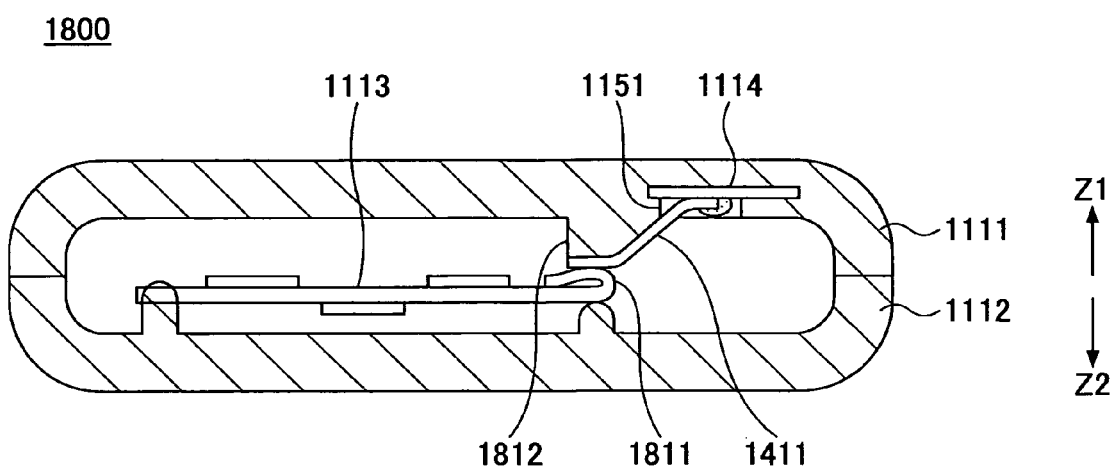
FIG. 29 is a cross-sectional view of an eighth mounting example according to an embodiment of the present invention.
Figure 30A:
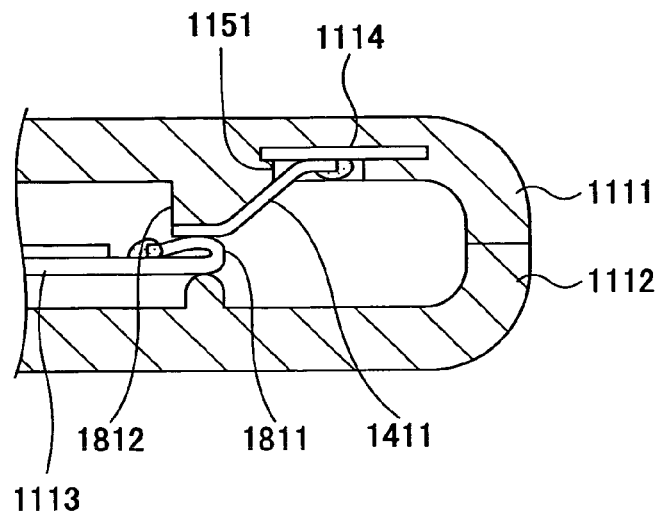
FIGS. 30A and 30B are schematic drawings of the eighth mounting example according to an embodiment of the present invention.
Figure 30B:
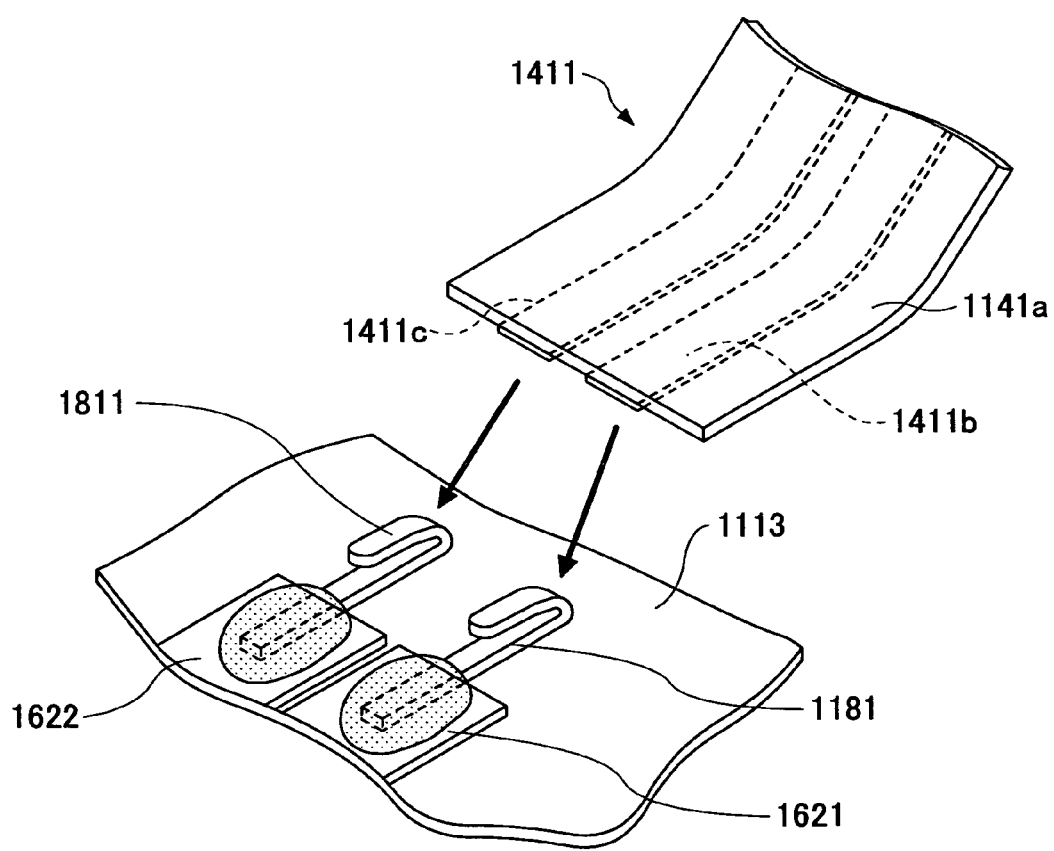

FIG. 29 is a cross-sectional view of the eighth mounting example according to an embodiment of the present invention, FIG. 30A is a cross-sectional view for describing a main portion of the eighth mounting example according to an embodiment of the present invention, and FIG. 30B is a perspective view for describing a main portion of the eighth mounting example according to an embodiment of the present invention. In FIGS. 29, 30A and 30B, like components are denoted by like numerals as of FIGS. 27, 28A and 28B of the seventh mounting example and are not further described.

As shown in FIG. 29, an electronic device 1800 includes a contact spring member 1811 that is welded to the antenna connection pattern 1621 of the circuit board 1113. The antenna apparatus 1114 and the circuit board 1113 included in the electronic device 1800 are connected by having the tip of the FPC cable 1411 pressed against the contact spring member 1811 by a protruding part 1812 of the housing 1111 when coupling the housing 1111 and the housing 1112 together. The contact spring member 1811 may be provided to the antenna connection pattern 1621 and connected thereto by using, for example, a contact bonding method.

In the eighth mounting example, the FPC cable 1411 can easily be connected to the circuit board 1113 by coupling the housing 1111 and the housing 1112 together.

Ninth Mounting Example

Figure 31:
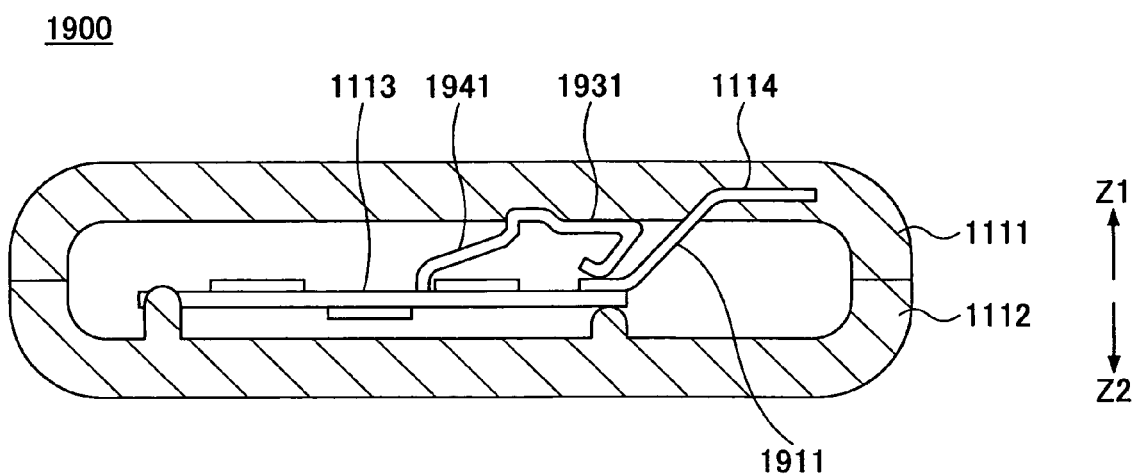
FIG. 31 is a cross-sectional view of a ninth mounting example according to an embodiment of the present invention.
Figure 32:
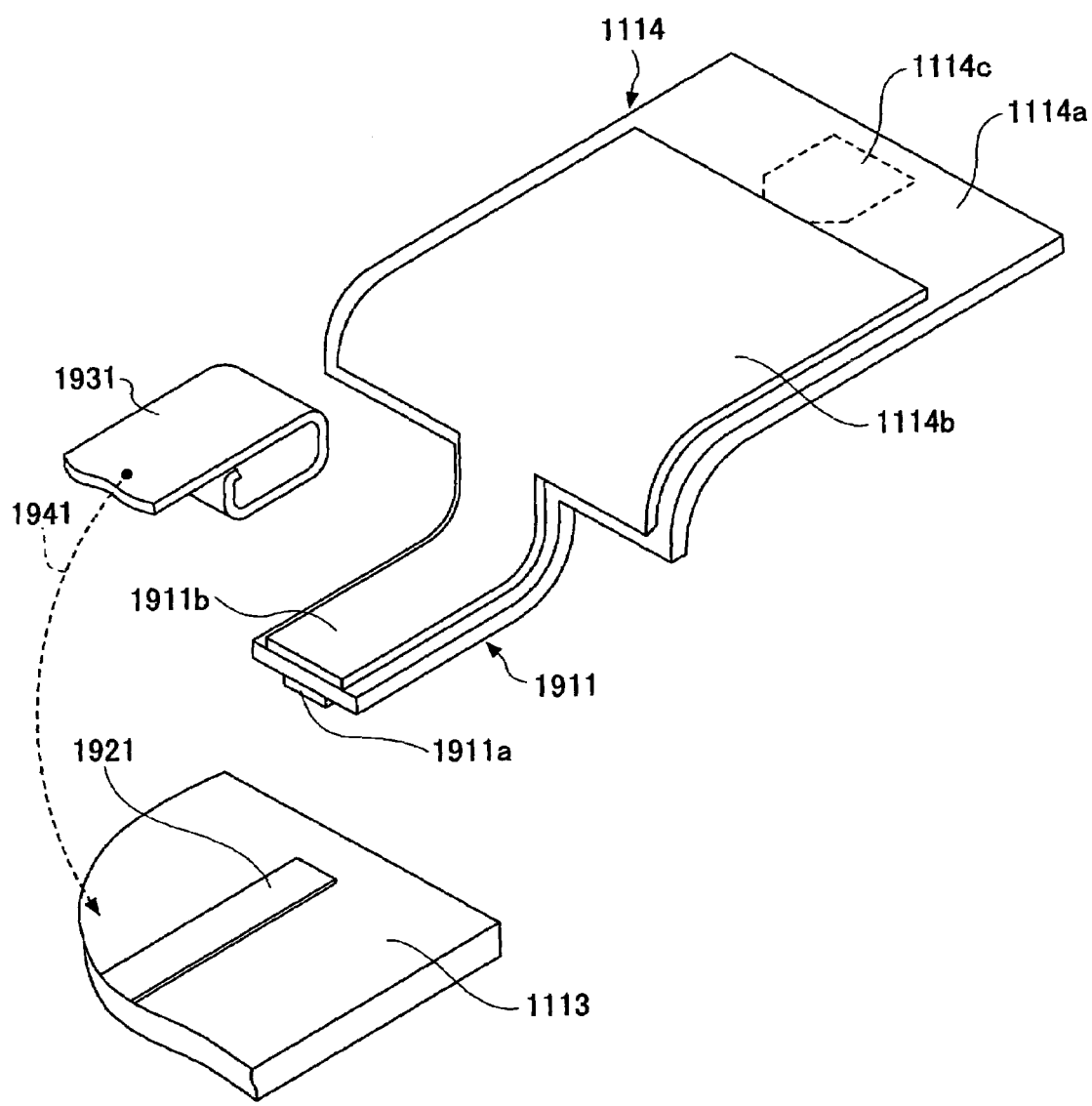
FIG. 32 is an exploded perspective view of the ninth mounting example according to an embodiment of the present invention.

FIG. 31 is a cross-sectional view of the ninth mounting example according to an embodiment of the present invention, and FIG. 32 is a perspective view for describing a main portion of the ninth mounting example according to an embodiment of the present invention. In FIGS. 31 and 32, like components are denoted by like numerals as of FIGS. 25, 26A and 26B of the sixth mounting example and are not further described.

As shown in FIG. 31, an electronic device 1900 includes an antenna apparatus 1114 integrally formed with a cable portion 1911. The cable portion 1911 has a cable-like configuration that is formed by extending a flexible printed wiring board 1114a included in the antenna apparatus 1114. The cable portion 1911 includes a wiring 1911a provided on one side (side facing the Z2 direction) to which an element pattern is contacted and another wiring 1911b provided on the other side (side facing the Z1 direction) to which another element pattern is contacted. The antenna apparatus 1114 has a ground pattern formed on its Z1 direction plane and an element pattern 1141c formed on its Z2 direction plane.

The circuit board 1113 included an antenna connection pattern 1921. A spring 1931 is fixed to the housing 1111 at a position facing the antenna connection pattern 1921. The spring 1931 is connected to the ground pattern of the circuit board 1113 by a cable 1941, for example.

In the ninth mounting example, by placing the cable portion 1911 between the spring 1931 and the antenna connection pattern 1921 of the circuit board 1113, the wiring 1911a (which is connected to the element pattern 1114c) is connected to the antenna connection pattern 1921 and the wiring 1911b (which is connected to the ground pattern 1114b) is connected and ground.

Tenth Mounting Example

Figure 33:
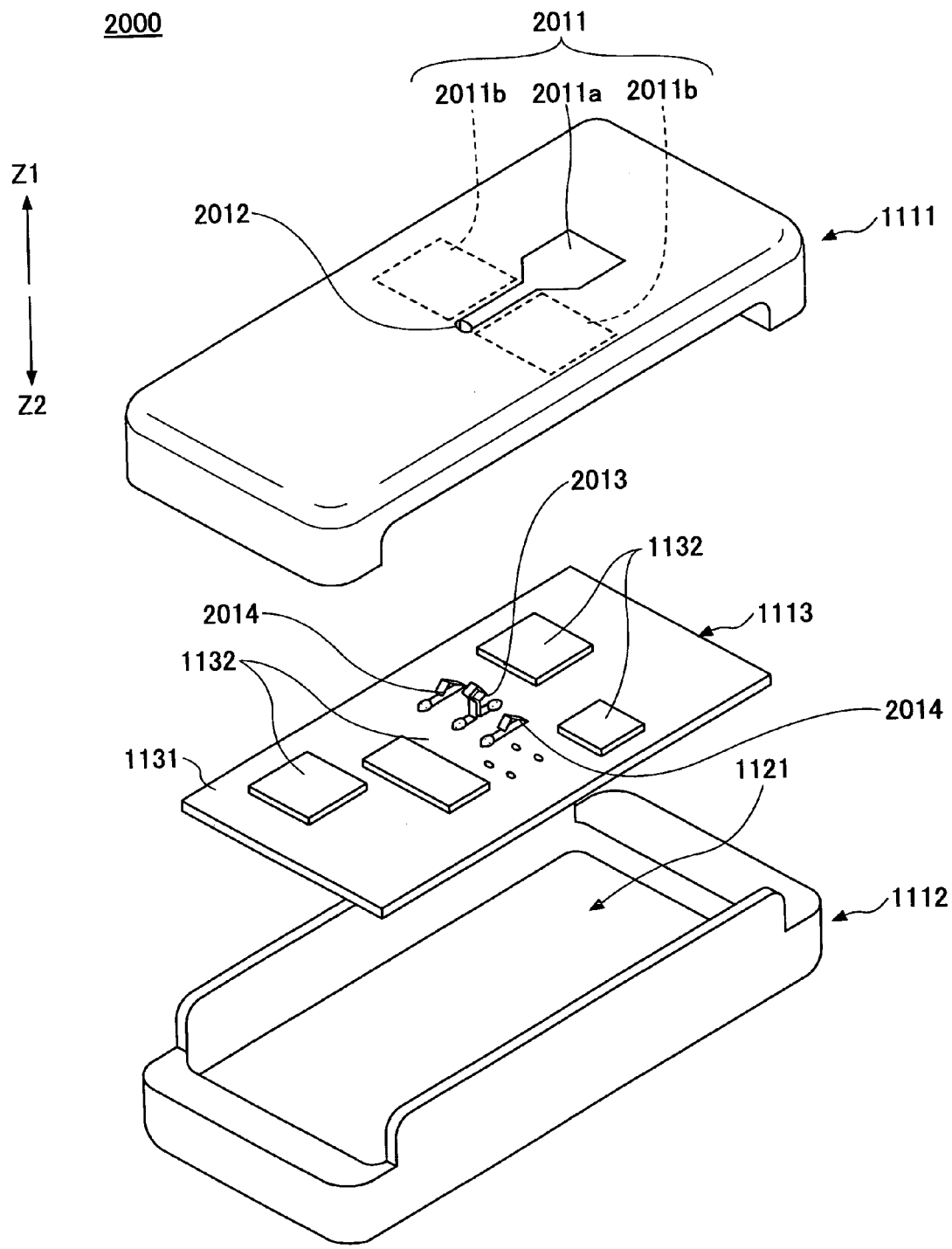
FIG. 33 is an exploded perspective view of a tenth mounting example according to an embodiment of the present invention.
Figure 34:
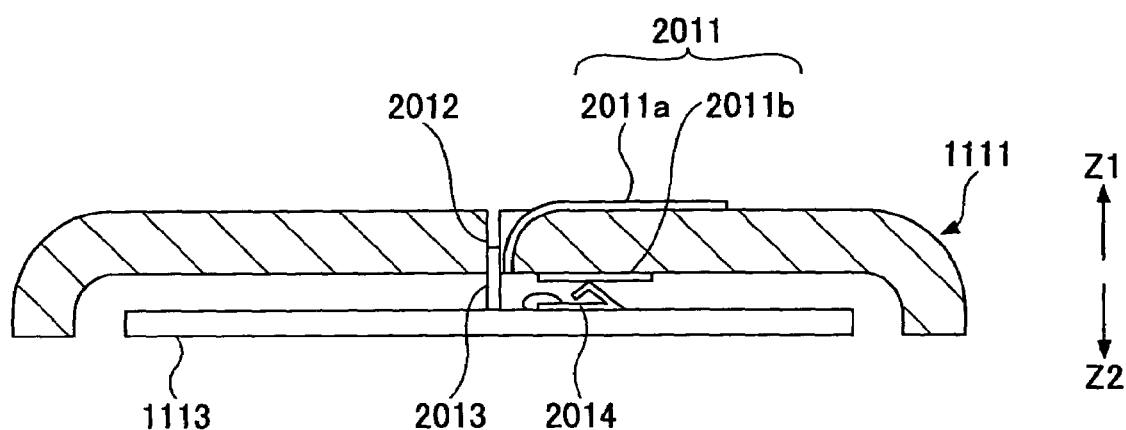
FIG. 34 is a cross-sectional view of the tenth mounting example according to an embodiment of the present invention.

FIG. 33 is an exploded perspective view of the tenth mounting example according to an embodiment of the present invention, and FIG. 34 is a cross-sectional view for describing a main portion of the tenth mounting example according to an embodiment of the present invention. In FIGS. 33 and 34, like components are denoted by like numerals as of FIGS. 19 and 20 of the first mounting example and are not further described.

As shown in FIG. 33, an electronic device 2000 includes an antenna pattern 2011 that is directly patterned onto the surface of the casing 1111. The housing 1111 includes a dielectric material having a predetermined dielectric constant. The antenna pattern 2011 includes an element pattern 2011a and a ground pattern 2011b. The antenna pattern 2011 may be formed (patterned), for example, by insert-molding a metal plate upon molding the housing 1111, performing a depositing method (e.g. metal plating, printing, sputtering, vapor deposition) with use of a conductive paste material or a lamination method after the molding process of the housing 1111.

The element pattern 2011a and the ground pattern 2011b are formed on the housing 1111 at positions similar to the antenna apparatus 1114.

The element pattern 2011a, which is formed on the front side (Z1 direction side) of the housing 1111, is guided to the back side of the housing 1111 via a through-hole 2012 penetrating through the housing 1111. The ground pattern 2011b is formed on the back side (Z2 direction side) of the housing 1111.

A connection pin 2013 is provided on the circuit board 1113 at a position facing the through-hole 2012. A connection spring(s) 2014 is fixed to the circuit board 1113 at a position facing the ground pattern 2011b. The connection pin 2013 is connected to the antenna connection pattern of the circuit board 1113. The connection pin 2013 is inserted into the through-hole 2012 upon coupling the housing 1111. The connection pin 2013 presses against the inner wall of the through-hole 2012 when inserted into the through-hole 2012. Thereby, the connection pin 2013 connects with the element pattern 2011a. Furthermore, the connection spring 2014 is connected with the ground pattern of the circuit board 1113 when the housing 1111 is coupled with the housing 1112. Thereby, the connection spring 2014 is connected to the ground pattern 2011b when coupling the housing 1111.

With the tenth mounting example, by installing the circuit board 1113 in the housing 1111, the antenna pattern 2011 can easily be connected to the circuit board 1113.

The shape of the element pattern 2011a and the ground pattern 2011b is determined depending on, for example, the property desired to be obtained or the dielectric constant of the housing 1111.

Furthermore, other than forming the antenna pattern 2011 by performing the insert-molding method or the metal plating method, the antenna pattern 2011 may also be formed by an in-mold type molding method or a hot stamp type molding method.

The in-mold type molding method is a technique for integrally molding the antenna pattern 2011 to the housing 1111 after a film (e.g. formed by metal vapor deposition) dedicated for in-mold molding is attached to the bottom surface of a metal mold.

Eleventh Mounting Example

Figure 35:
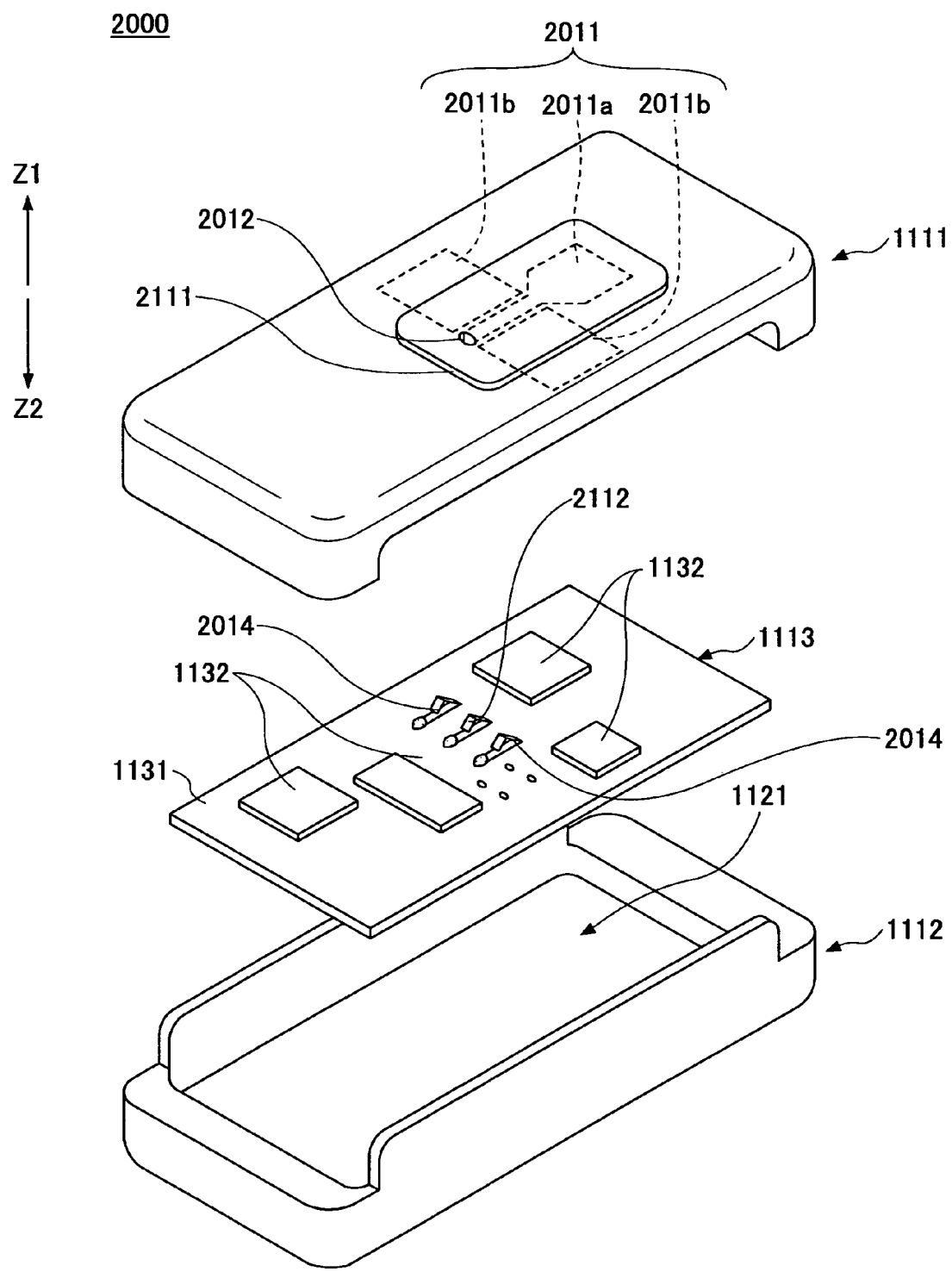
FIG. 35 is an exploded perspective view of an eleventh mounting example according to an embodiment of the present invention.
Figure 36:
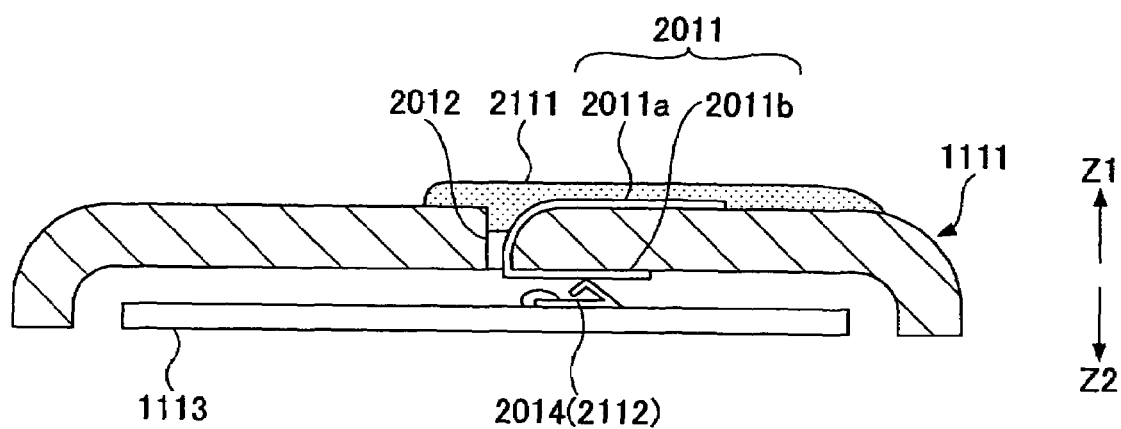
FIG. 36 is a cross-sectional view of the eleventh mounting example according to an embodiment of the present invention.

FIG. 35 is an exploded perspective view of the eleventh mounting example according to an embodiment of the present invention, and FIG. 36 is a cross-sectional view for describing a main portion of the eleventh mounting example according to an embodiment of the present invention. In FIGS. 35 and 36, like components are denoted by like numerals as of FIGS. 33 and 34 of the tenth mounting example and are not further described.

As shown in FIG. 35, an electronic device 2100 includes a protective film 2111 formed on the element pattern 2011a provided on the surface of the housing 1111. The protective film 2111 may alternatively be formed on the entire surface of the housing 1111.

As shown in FIG. 36, the element pattern 2011a is formed in a manner traveling around to the back side of the housing 1111 via the through-hole 2012. Since the protective film 2111 is also formed inside the through-hole 2012, a connection spring 2112 is provided (as an alternative for the connection pin 2013 in the tenth mounting example) for connecting with the antenna pattern 2011a. The connection spring 2112 is soldered to the antenna pattern of the circuit board 1113. When the housing 1111 is coupled with the housing 1112, the back side of the housing 1111 presses against the connection spring 2112, to thereby cause elastic deformation of the connection spring 2112. Accordingly, the connection spring 2112 contacts the element pattern 2011a.

Twelfth Mounting Example

Figure 37:
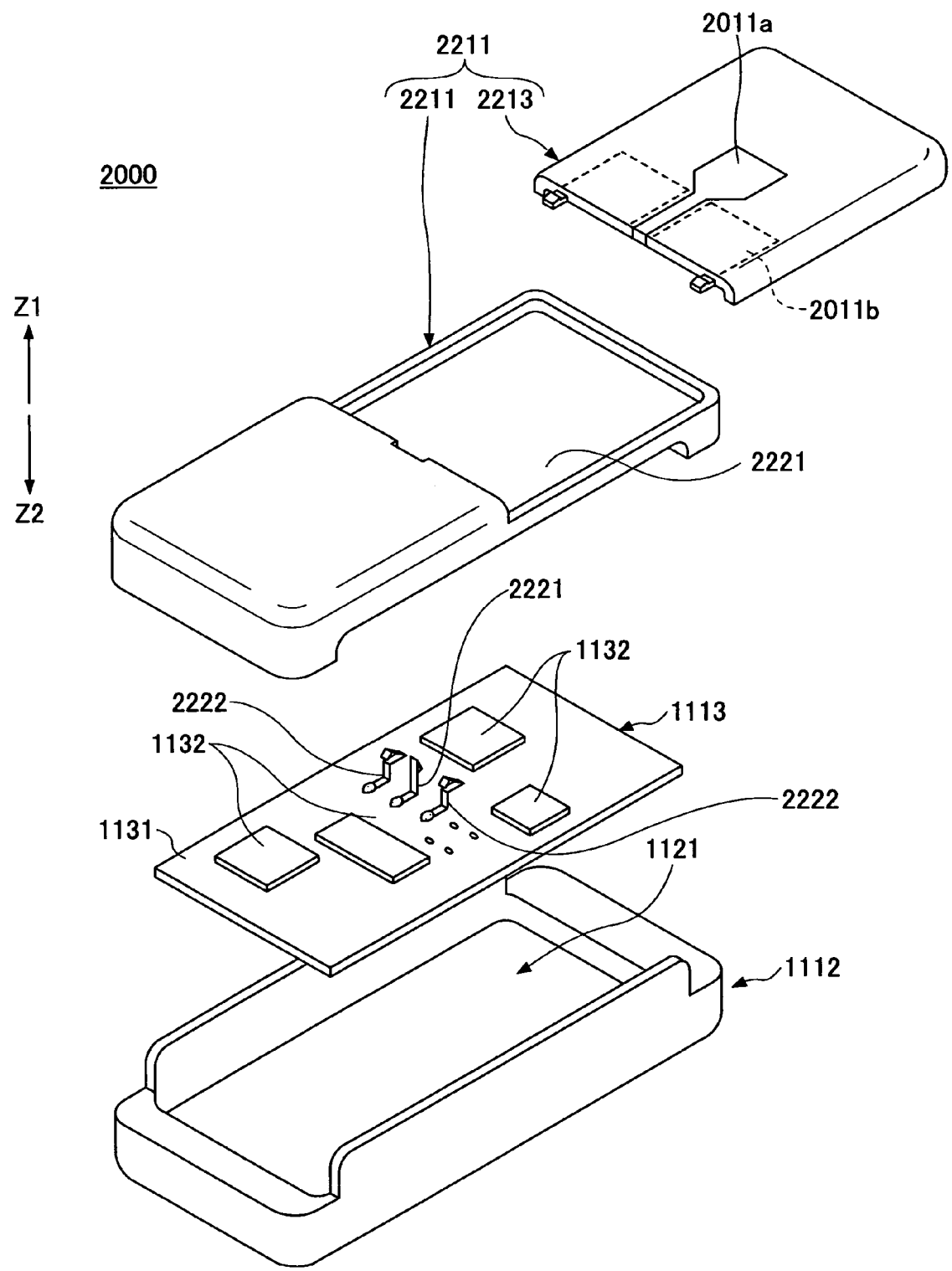
FIG. 37 is an exploded perspective view of a twelfth mounting example according to an embodiment of the present invention.
Figure 38:
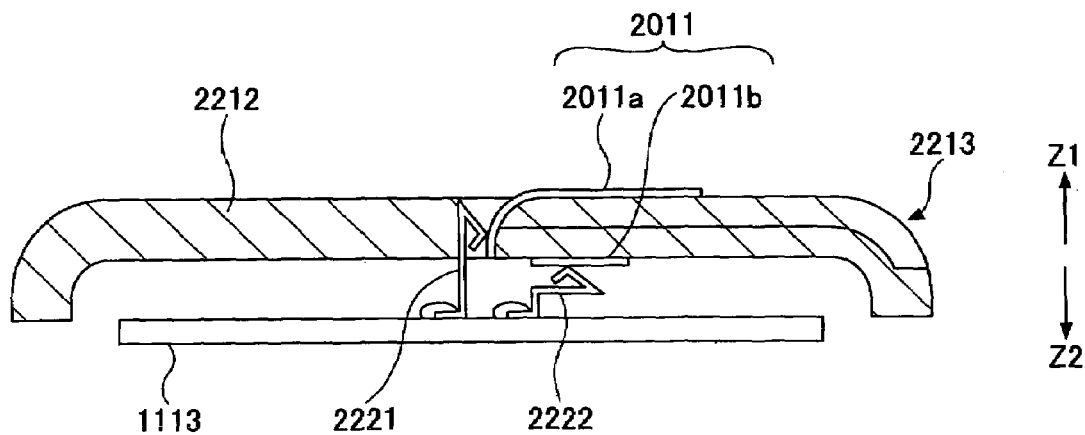
FIG. 38 is a cross-sectional view of the twelfth mounting example according to an embodiment of the present invention.

FIG. 37 is an exploded perspective view of the twelfth mounting example according to an embodiment of the present invention, and FIG. 38 is a cross-sectional view for describing a main portion of the twelfth mounting example according to an embodiment of the present invention. In FIGS. 37 and 38, like components are denoted by like numerals as of FIGS. 33 and 34 of the tenth mounting example and are not further described.

As shown in FIG. 37, an electronic device 2200 includes a housing 22111 provided with a housing body 2212 and a cover 2213. An installment portion 2221 is provided between the housing body 2212 and the cover 2213. For example, a battery pack may be installed in the installment portion 2221.

In this twelfth mounting example, the antenna pattern 2011 is directly patterned (formed) on the cover 2113. The element pattern 2011a and the ground pattern 2011b are formed on the cover 2113 at positions similar to the antenna apparatus 1114. The element pattern 2011a, which is formed on the front side (Z1 direction side) of the cover 2213, is guided to the edge plane of the cover 2213. The ground pattern 2011b is formed on the back side (Z2 direction side) of the cover 2213.

A connection spring 2221 is provided on the circuit board 1113 in a manner facing the edge plane of the cover 2213. Another connection spring 2222 is provided on the circuit board 1113 in a manner facing the ground pattern 2011b. The connection spring 2221, which is connected to the antenna connection pattern of the circuit board 1113, is inserted between the housing body 2212 and the cover 2213 upon coupling the cover 2213 with the housing body 2212. The connection spring 2221 contacts the element pattern 2011a at the edge plane of the cover 2213. Thereby, the element pattern 2011a is connected to the circuit board 1113.

Furthermore, the connection spring 2222 connects to the ground pattern 2011b of the circuit board 1113 upon coupling the cover 2213 with the housing body 2212. Thereby, the ground pattern 2011b is connected to the circuit board 1113.

Alternatively, in a manner similar to the eleventh mounting example, the element pattern 2011a may be connected to the circuit board 1113 by a connection spring at the back side of the cover 2213. Furthermore, in a manner similar to the eleventh mounting example, a protective film may be provided on the element pattern 2011a.

Other Mounting Examples

Although the above-described mounting examples are applied to an antenna apparatus having conductive patterns (including an element pattern and a ground pattern) formed on a flexible printed wiring board, the mounting examples may also be applied to an antenna apparatus having conductive patterns (including an element pattern and a ground pattern) formed on, for example, a ceramic substrate or an epoxy resin substrate.

Figure 39A:
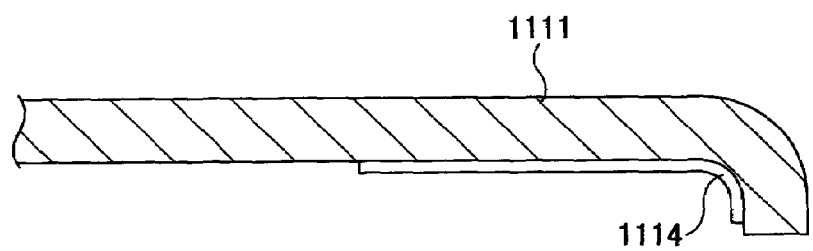
FIGS. 39A-39B are schematic drawings of other mounting examples according to an embodiment of the present invention.
Figure 39B:
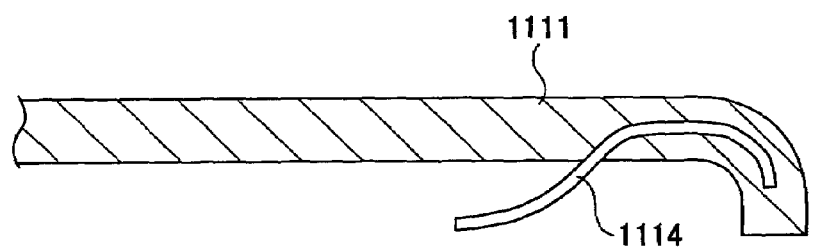

Although the antenna apparatus in the above-described mounting examples is provided on a flat plane area of the housing 1111 or the cover 2213, the antenna apparatus may also be provided on a curved area of the housing 1111 or the cover 2213 (see, for example, FIG. 39A) by using, for example, a printing method. The antenna apparatus may also be provided inside a curved area of the housing 1111 or the cover 2213 (see, for example, FIG. 39B) by using, for example, an insert-molding method. The antenna apparatus may also be provided on an area between the flat plane area and the curved area of the housing 1111 or the cover 2213.

Figure 40:
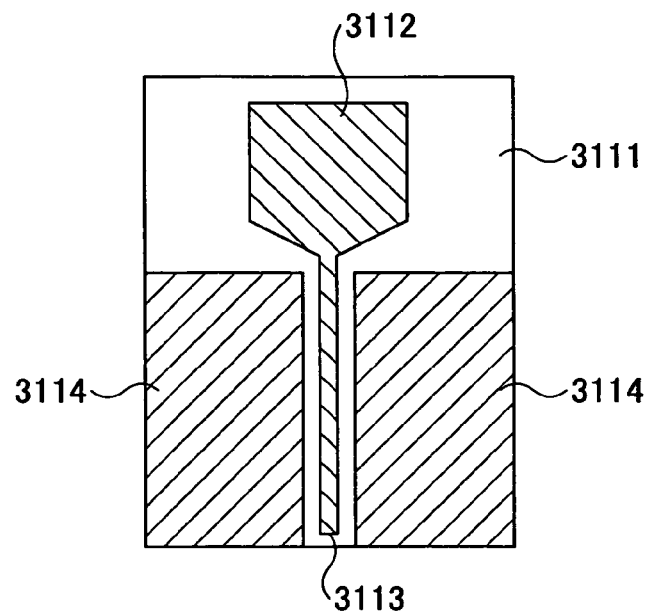
FIG. 40 is a schematic drawing of an antenna apparatus (UWB antenna apparatus) of a coplanar waveguide type that is formed on one side of a dielectric member according to an embodiment of the present invention.
Figure 41:
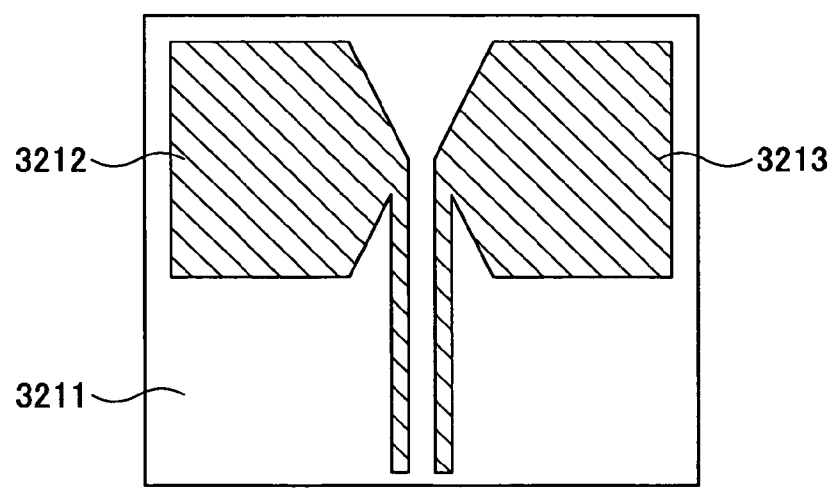
FIG. 41 is a schematic drawing of a dipole type antenna apparatus according to an embodiment of the present invention.

Although the above-described mounting examples are applied to a micro-strip type UWB antenna apparatus having patterns formed on both sides of a dielectric material, the above-described mounting examples may also be applied to other types of antenna apparatuses. For example, there is: a coplanar waveguide type UWB antenna apparatus having conductive patterns (including, for example, an element pattern 3112, a transmission line 3113, and a ground pattern 3114) formed on a single side of a dielectric substrate 3111 as shown in FIG. 40; a dipole type antenna apparatus having element patterns 3212, 3213 formed on a single side of a dielectric substrate 3211 as shown in FIG. 41; and an antenna apparatus having a chip antenna 3312, a micro-strip-line 3313, and a ground pattern 3314 formed on a dielectric substrate 3311 as shown in FIGS. 42A and 42B. Furthermore, the above-described mounting examples may also be applied to a chip antenna.

Since the antenna apparatuses shown in FIGS. 40 and 41 have a conductive pattern(s) formed on a singe side of a printed wiring board, it is particularly easy to apply the fourth, sixth, or the ninth mounting example to the antenna apparatuses shown in FIGS. 40 and 41. Furthermore, the fourth, sixth, or the ninth mounting example may also be easily applied to the antenna apparatus shown in FIGS. 42A and 42B by providing a conductive pattern(s) on a single side of said antenna apparatus including a chip antenna and a micro-strip-line.

Although the antenna apparatus 1114 in the above-described mounting examples is described as being insert-molded inside the housing 1111, the antenna apparatus 1114 may also be insert-molded during the molding process of the housing 1111, such that the antenna apparatus 1114 is exposed on the front side of the housing 1111 (as shown in FIG. 43A) or the back side of the housing 1111 (as shown in FIG. 43B). In insert-molding the antenna apparatus 1114 in such manner, the antenna apparatus 1114 is placed on a surface of a die (mold). Therefore, it is easy to set the antenna apparatus 1114 to the die (mold). In addition, since no component (e.g. pin) is required for keeping the antenna apparatus 1114 at a center position of the die (mold), there is no need to form holes in the surface of the housing 1111.

In the tenth and eleventh mounting examples, the element pattern 2011a is provided on the front side of the housing 1111, and the ground pattern 2011b is provided on the back side of the housing 1111. However, it is also possible to provide the element pattern 2011a on the back side of the housing 1111 and the ground pattern 2011b on the front side of the housing 1111.

Applied Examples

Next, various applied examples (examples to which the antenna apparatus of the present invention is applied) are described.

First Applied Example

Figure 44:
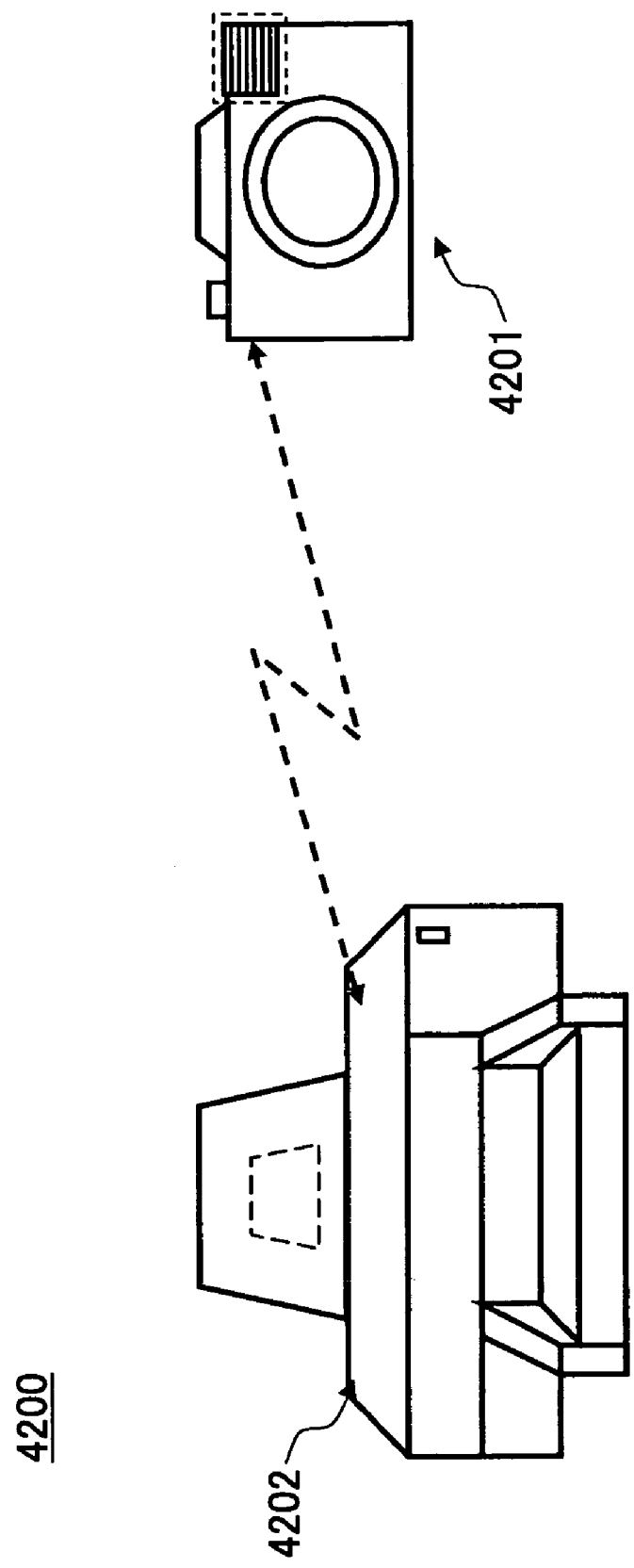
FIG. 44 is a schematic drawing showing a first applied example of a system to which an embodiment of an antenna apparatus of the present invention is applied.

FIG. 44 is a schematic drawing showing a configuration of a system 4200 to which an antenna apparatus according to an embodiment of the present invention is applied.

The system 4200 includes a digital camera 4201 and a printer 4202.

The digital camera 4201 and the printer 4202 perform data communications by using ultra wideband wireless technology such as UWB. An antenna apparatus (e.g. UWB antenna apparatus) according to the foregoing embodiment of the present invention is mounted to the digital camera 4201 and the printer 4202.

[Digital Camera 4201]

Figure 45:
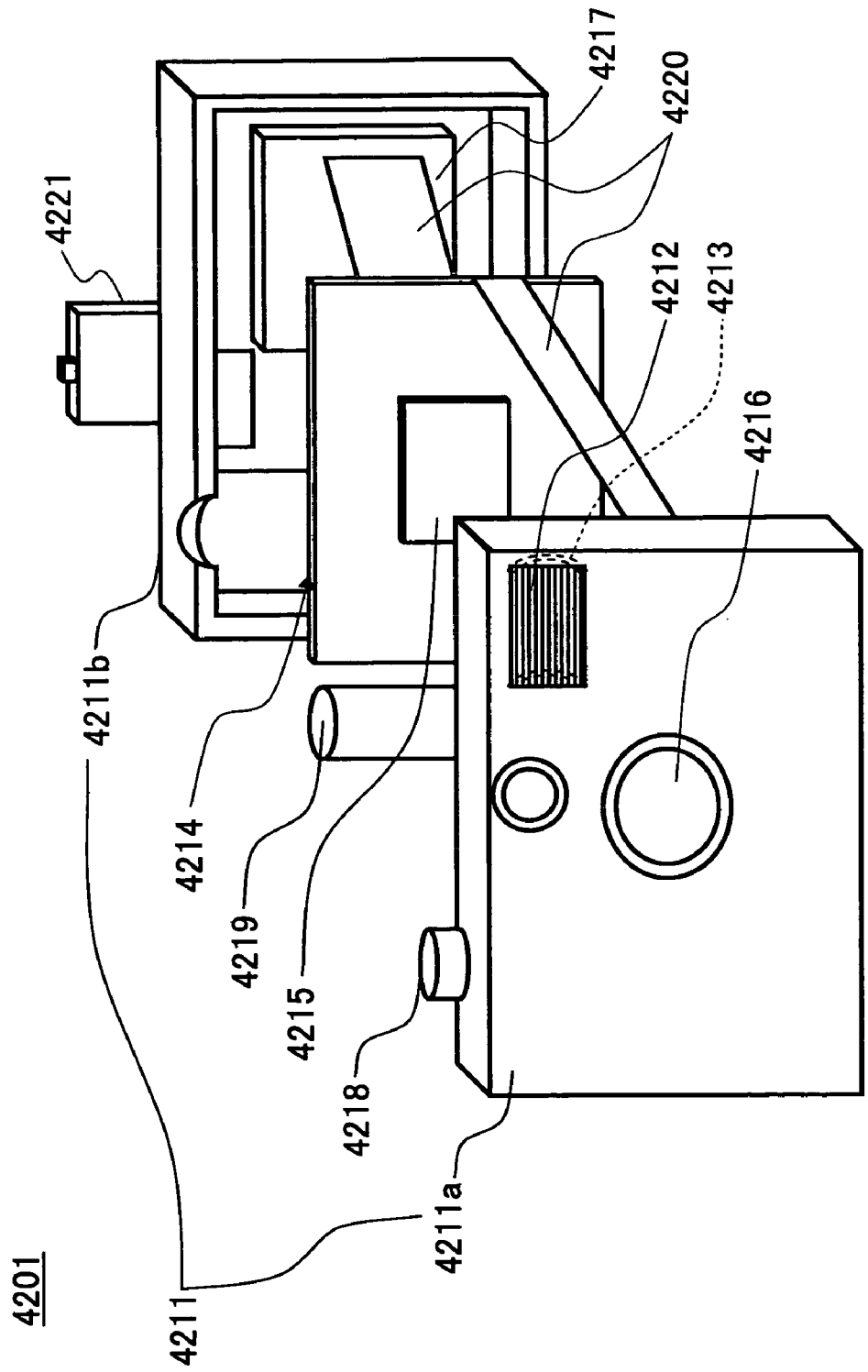
FIG. 45 is a schematic drawing of a digital camera according to an embodiment of the present invention.

FIG. 45 is a schematic drawing showing an exemplary configuration of the digital camera 4201.

The digital camera 4201 includes, for example, a housing 4211, a flash part 4212, an antenna apparatus 4213, a circuit board 4214, a CCD 4215, an optical system 4216, a liquid crystal panel 4217, a shutter button 4218, a battery 4219, a cable 4220, and a battery cover 4221.

The housing 4211 is made of, for example, a metal material and includes a front case 4211a and a rear case 4211b. The flash part 4212 and the optical system 4216 are attached to the front case 4211a.

The flash part 4212 is connected to the circuit board 4214 via the cable 4220. The flash part 4212 is illuminated by drive signals from the circuit board 4214. The optical system 4216 is also connected to the circuit board 4214 via the cable 4220. The optical system 4216 is controlled by drive signals from the circuit board 4214 for operating on the shutter, the focus, or the aperture thereof.

Figure 46:
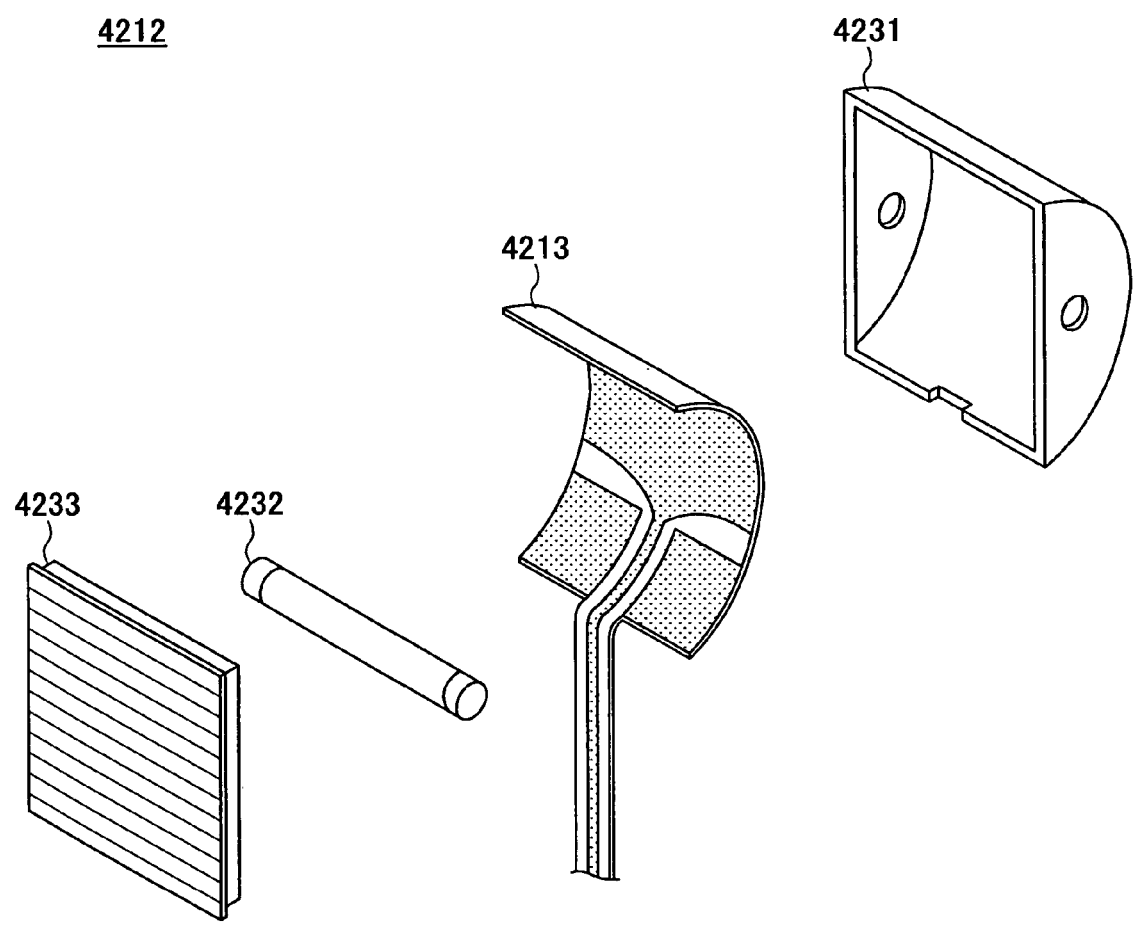
FIG. 46 is an exploded perspective view of a digital camera according to an embodiment of the present invention.

FIG. 46 is an exploded perspective view showing a main portion of the digital camera 4201 according to an embodiment of the present invention.

The flash part 4212 includes a reflection part 4231, a stroboscopic tube 4232, and a lens part 4233. The flash part 4212 is provided at an opening part of the housing 4211. The reflection part 4231 has a grooved front face. The antenna apparatus 4213 is mounted to the grooved front face of the reflection part 4231. The antenna apparatus includes a flexible substrate (including, for example, a PET material or a FR4 material) on which an element pattern (antenna element pattern) and a ground pattern are formed. The element pattern and the ground pattern are formed of a conductive material having high reflectivity.

The antenna apparatus 4213 is connected to the circuit board 4214. Accordingly, the antenna apparatus 4213 is not only used for performing data communications with the printer 4202 but also for serving as a reflection mirror.

The stroboscopic tube 4232 is attached to the front side of the antenna apparatus 4213 and is illuminated by drive signals transmitted from the circuit board 4214. The light emitted from the stroboscopic tube 4232 is reflected by the antenna apparatus 4213 and is emitted out from a perforated plane of the reflection part 4231. The lens part 4233 is mounted to the perforated plane of the reflection part 4231.

The lens part 4233 is formed of, for example, a glass material or a transparent resin material. The lens part 4233 serves to condense or diffuse the light from the stroboscopic tube 4232 and the antenna apparatus 4213 and emit the condensed or diffused light.

In this first applied example, by integrally mounting the antenna apparatus 4213 to the flash part 4212 provided at the opening part (non-metallic portion) of the housing 4211, the antenna apparatus 4213 can function as an apparatus for performing data communications and also as a reflection mirror of the stroboscopic tube 4232.

Although the antenna apparatus 4213 in this first applied example is mounted to the reflection plane of the flash part 4212, the antenna apparatus 4213 may alternatively be mounted to a back face (back plane) of the liquid crystal panel 4217 (described below).

Figure 47:
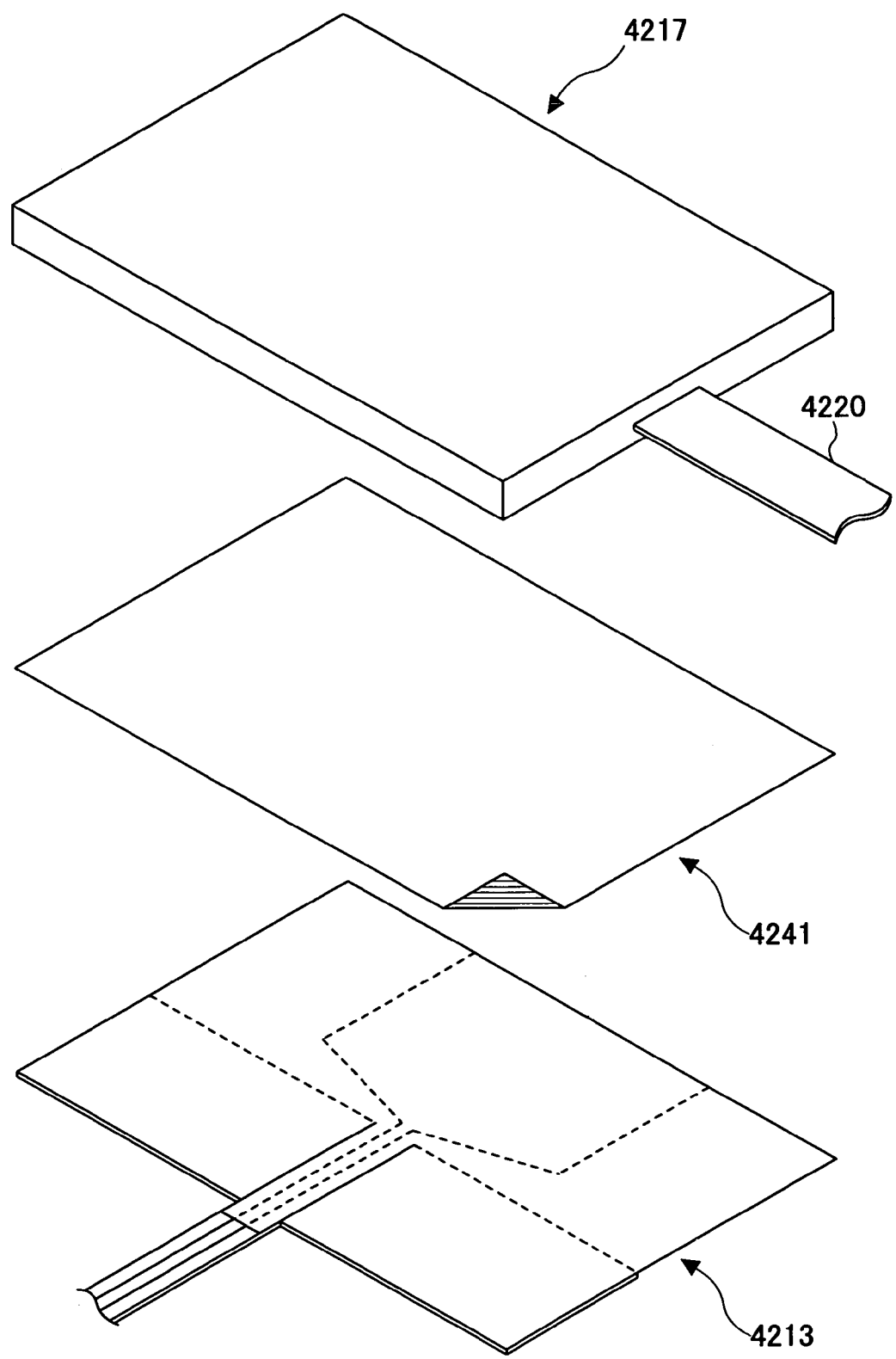
FIG. 47 is a schematic drawing of a modified example of a digital camera according to an embodiment of the present invention.
Figure 48:
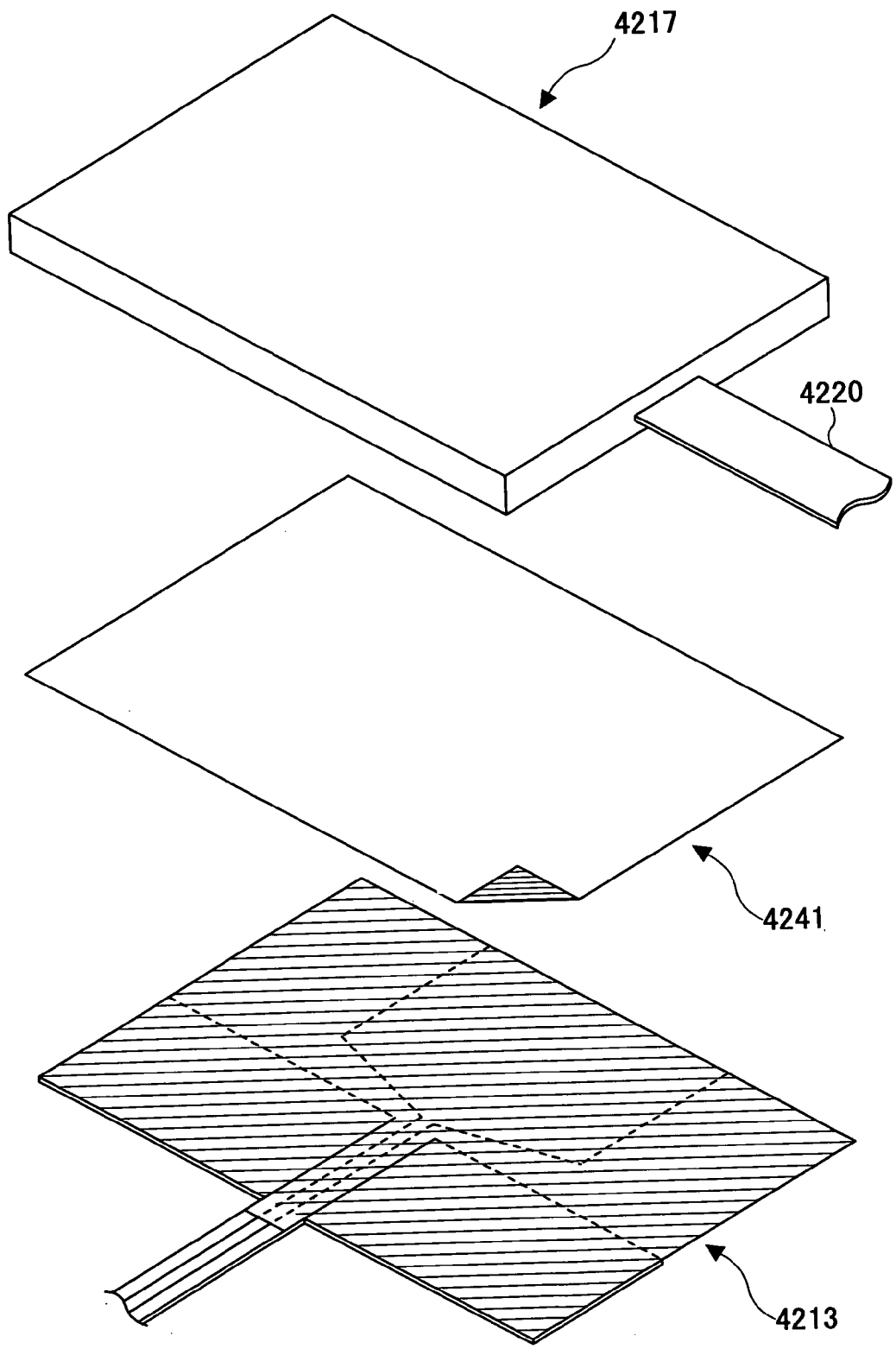
FIG. 48 is a schematic drawing of another modified example of a digital camera according to an embodiment of the present invention.

FIGS. 47 and 48 are schematic drawings showing modified examples of the main portion of the digital camera 4201 according to an embodiment of the present invention.

In the modified example shown in FIG. 47, the antenna apparatus 4213 is provided on a back face of the liquid crystal panel 4217. A film 4241 is provided between the liquid crystal panel 4217 and the antenna apparatus 4213 for preventing the element pattern (antenna element pattern) and the ground pattern of the antenna apparatus 4213 from transmitting to the liquid crystal panel 4217. The film 4241 is formed of a material having a light blocking property. The film 4241 has two planes in which one plane facing the antenna apparatus 4213 has a black color and the other plane facing the liquid crystal panel 4217 has a white color. This prevents the element pattern and the ground pattern of the antenna apparatus 4213 from transmitting through the film 4241. In addition, the light escaping to the back side from the backlight of the liquid crystal panel 4217 can be reflected back to the liquid crystal panel 4217, to thereby enhance the light of the backlight of the liquid crystal panel 4217.

Furthermore, in another modified example shown in FIG. 48, the antenna apparatus 4213 is colored black. This further prevents the element pattern and the ground pattern of the antenna apparatus 4213 from transmitting through the film 4241 and reaching the liquid crystal panel 4217.

Although the antenna apparatus 4213 in the above-described modified examples is disposed on the rear side of the liquid crystal panel 4217, an antenna element pattern and a ground pattern may alternatively by formed on the front side of the liquid crystal panel 4217 by providing a transparent conductive film thereto.

[Printer 4202]

Figure 49:
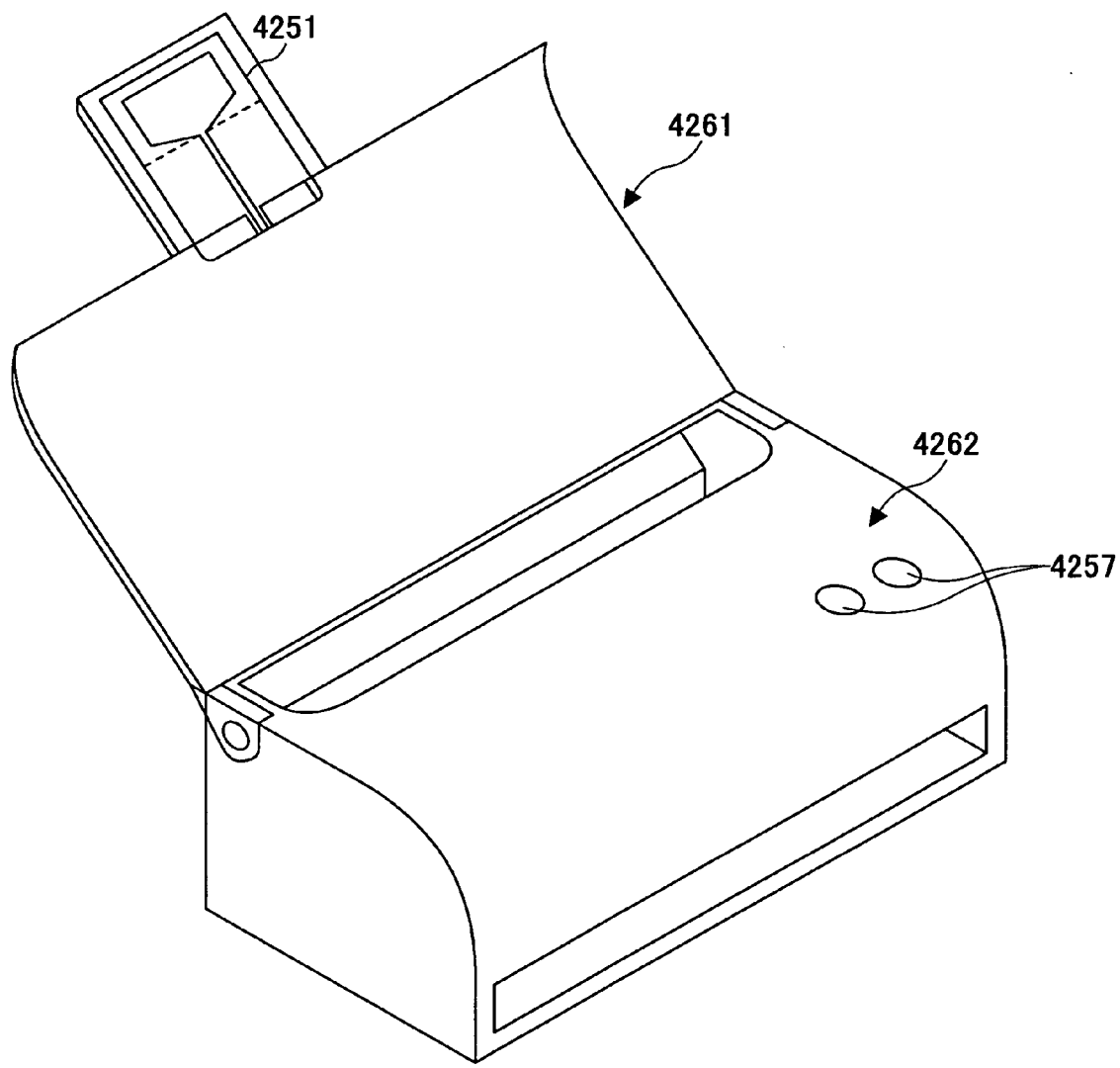
FIG. 49 is a schematic drawing of a printer according to an embodiment of the present invention.
Figure 50:
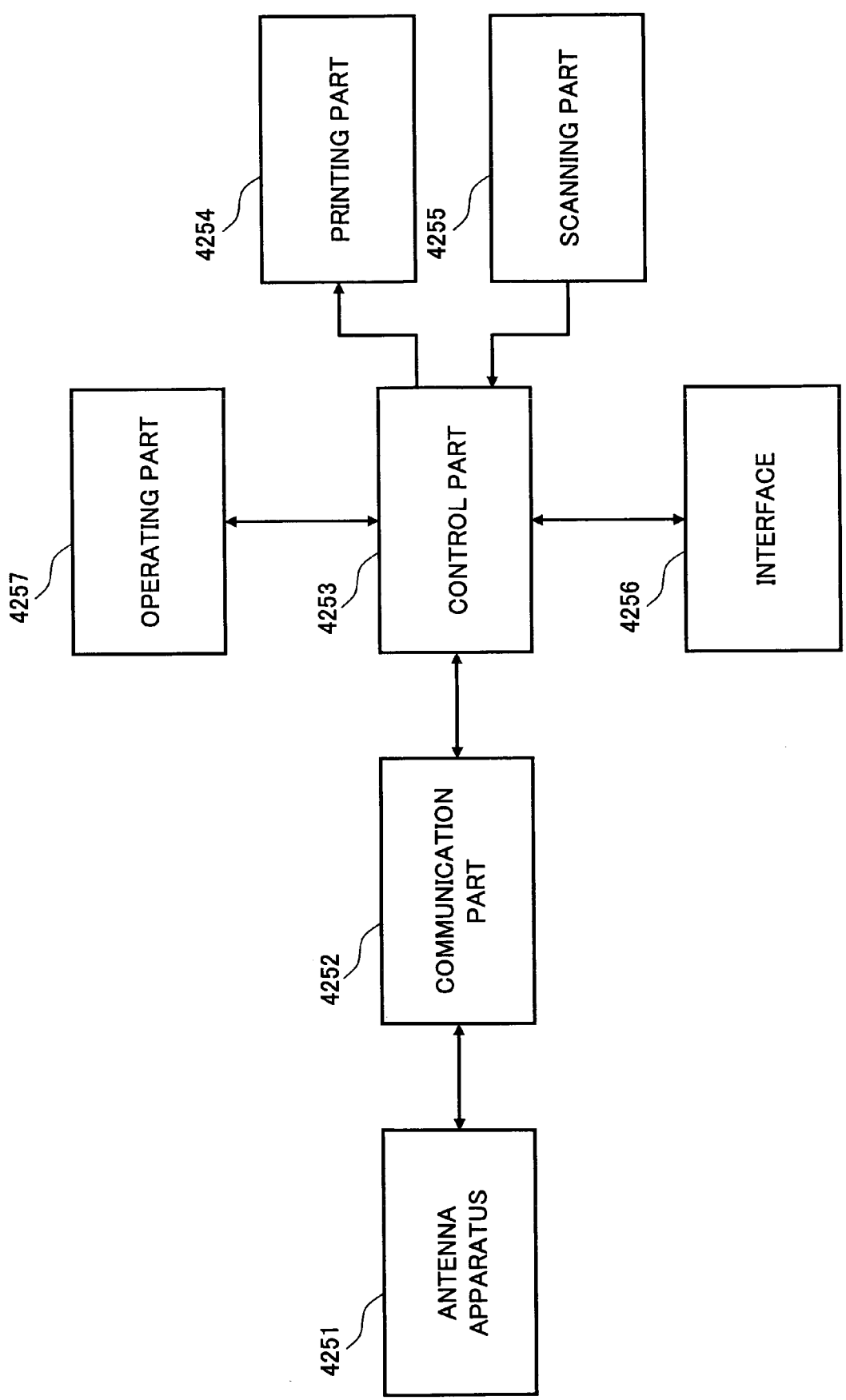
FIG. 50 is a block diagram of a printer according to an embodiment of the present invention.
Figure 51:
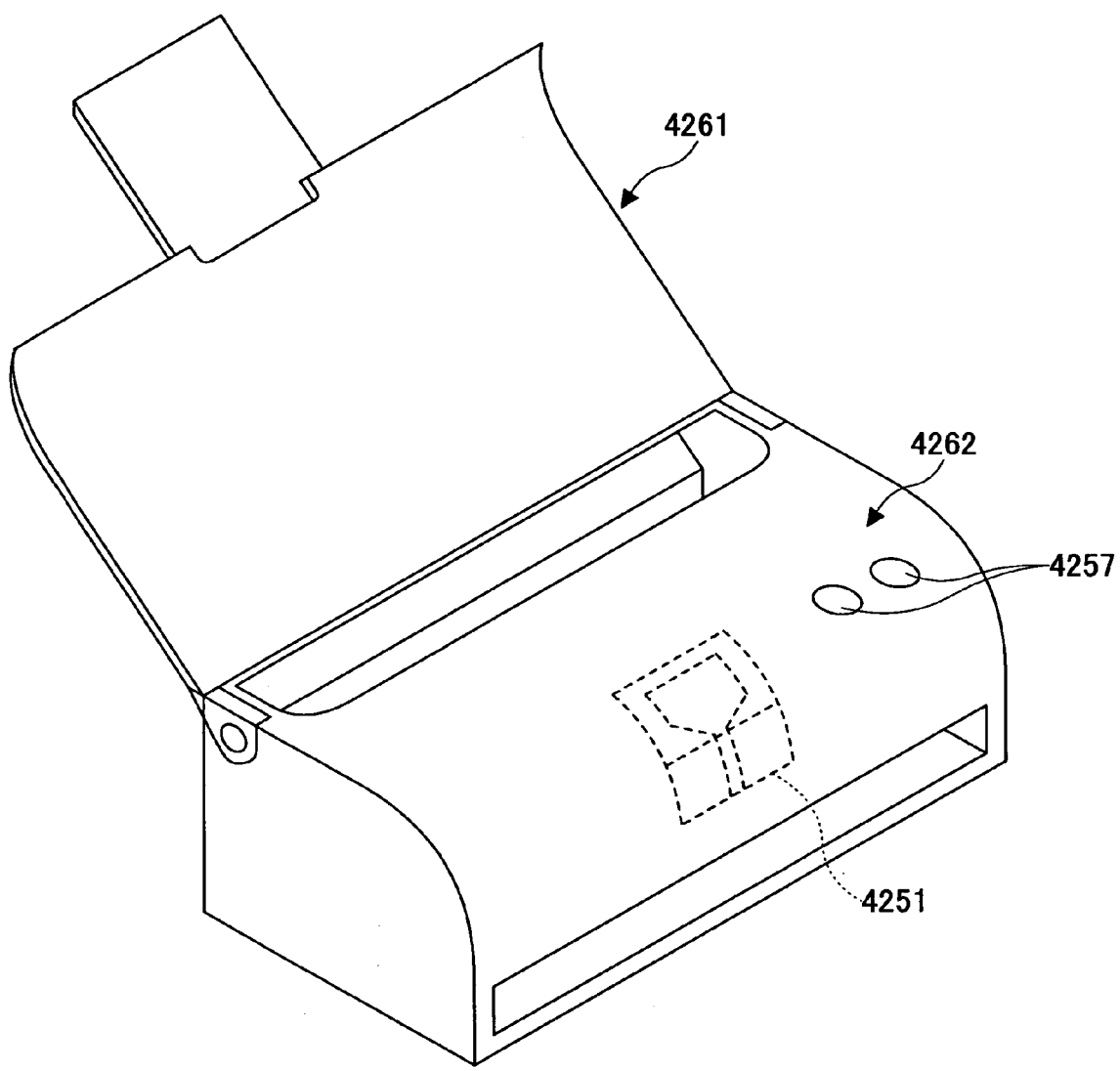
FIG. 51 is a schematic drawing of a modified example of a printer according to an embodiment of the present invention.

FIG. 49 is a schematic drawing showing an exemplary configuration of the printer 4202, FIG. 50 is a block diagram of an exemplary configuration of the printer 4202, and FIG. 51 is a schematic drawing showing another exemplary configuration of the printer 4202.

The printer 4202 is a printer provided with a scanning function. The printer 4202 includes an antenna apparatus 4251, a communication part 4252, a control part 4253, a printing part 4254, a scanning part 4255, an interface 4256, and an operating part 4257.

In the printer 4202, the antenna apparatus 4251 and the communication part 4252 serve to perform UWB communication with the digital camera 4201. For example, when the printer 4202 receives image data from the digital camera 4201, the control part 4253 controls the printing part 4254 and instructs the printing part 4254 to print the image data. The antenna apparatus 4251 is mounted to, for example, an upper part of a document/paper tray 4261 of the printer 4202 by using one of the above-described mounting methods shown in FIGS. 15-43B. As shown in FIG. 51, the antenna apparatus 4251 may be mounted on the front side of the housing 4262 by using one of the above-described mounting methods shown in FIGS. 15-43B.

In another example, the scanning part 4255 reads a document and transmits the image data of the read document to a computer via the control part 4243 and the interface 4256. In yet another example, the control part 4253 transmits the read image data of the document to a computer via the communication part 4252 and the antenna apparatus 4251.

Second Applied Example

Figure 52:
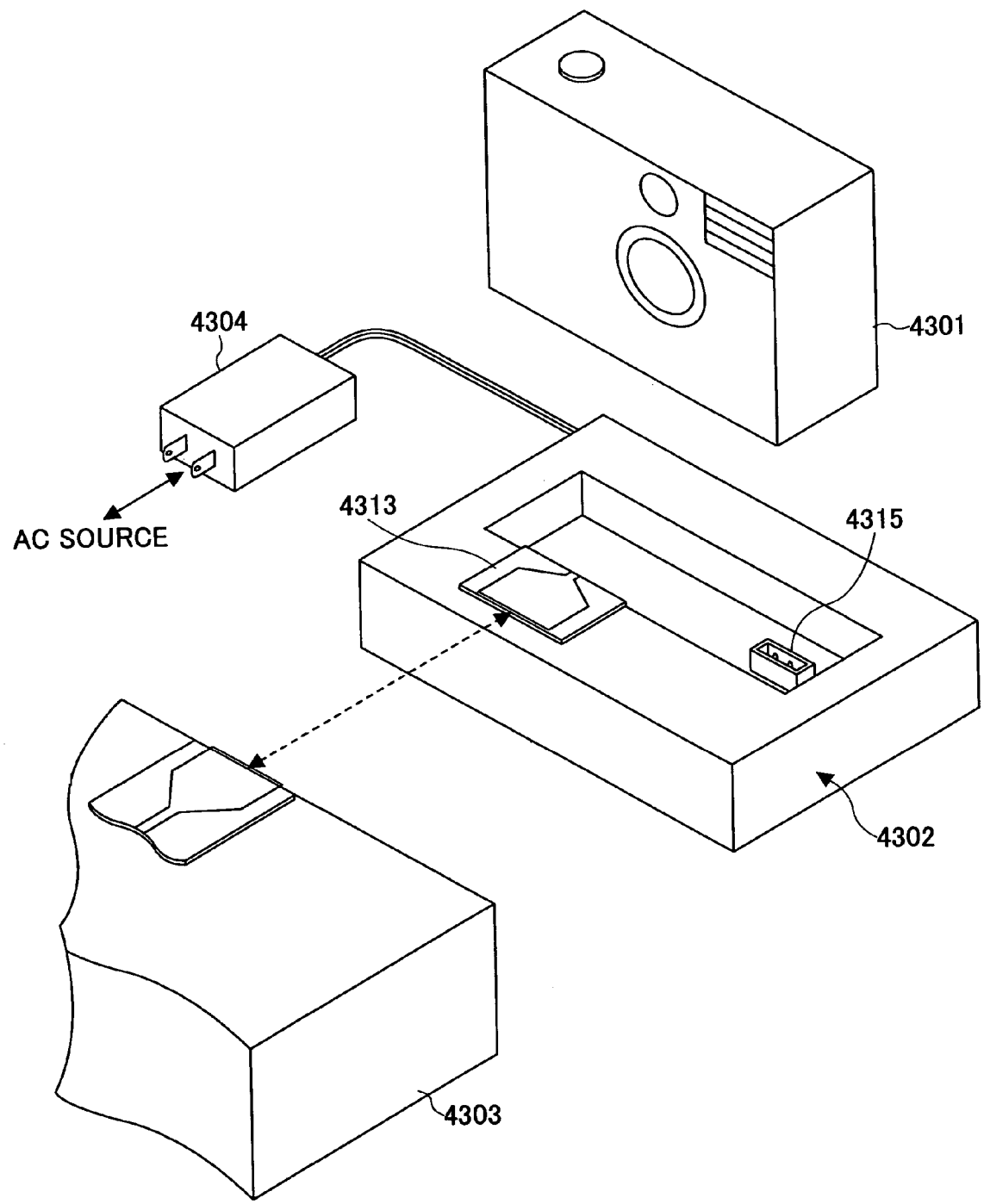
FIG. 52 is a schematic drawing showing a second applied example of a system to which an embodiment of an antenna apparatus of the present invention is applied.

FIG. 52 is a schematic drawing showing a configuration of a system 4300 to which an antenna apparatus according to an embodiment of the present invention is applied. In FIG. 52, like components are denoted by like numerals as of FIG. 44 and are not further explained.

The system 4300 is for charging a digital camera 4301 by mounting the digital camera 4301 on a cradle 4302 and for performing data communications with an external device 4303 via the cradle 4302. The cradle 4302 is supplied with electric power from an AC power source via an AC adapter 4304.

Figure 53:
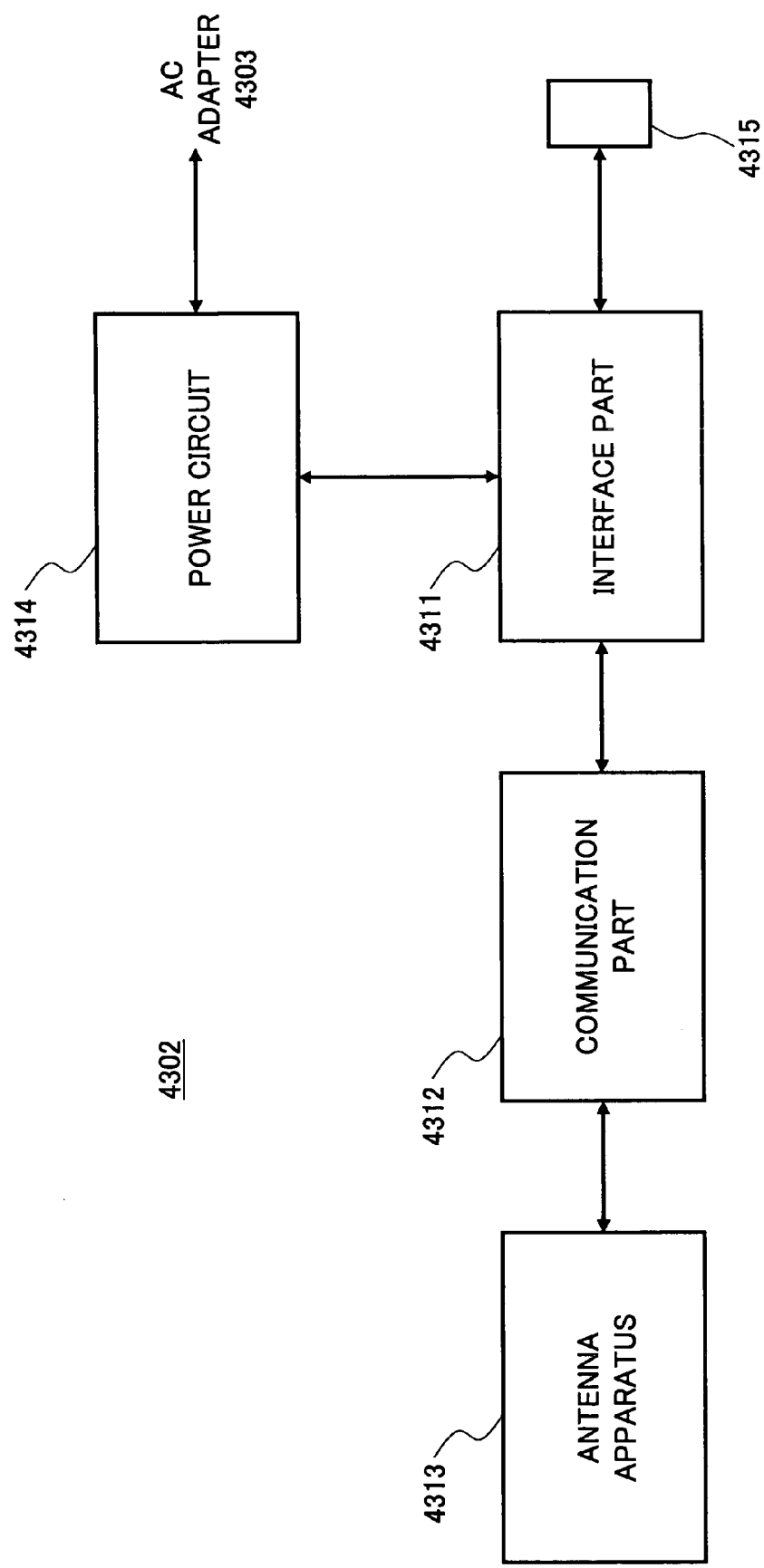
FIG. 53 is a block diagram of a cradle according to an embodiment of the present invention.

FIG. 53 is a block diagram of an exemplary configuration of the cradle 4302.

As shown in FIG. 53, the cradle 4302 includes an interface part 4311, a communication part (communication apparatus) 4312, an antenna apparatus 4313, and a power circuit 4314.

The interface part 4311, which is connected to the digital camera 4301 via the connector 4315, serves an interface between the digital camera 4301 and the communication apparatus 4312. The communication apparatus 4312 communicates with, for example, the printer 4202 via the antenna apparatus 4313.

The antenna apparatus 4313 is mounted to a housing 4321 of the cradle 4302 by the above-described mounting methods shown in FIGS. 15-43B.

The power circuit 4314 charges the digital camera 4301 via the interface 4312 and the connector 4315 by the direct current supply from the AC adapter 4303.

Third Applied Example

Figure 54:
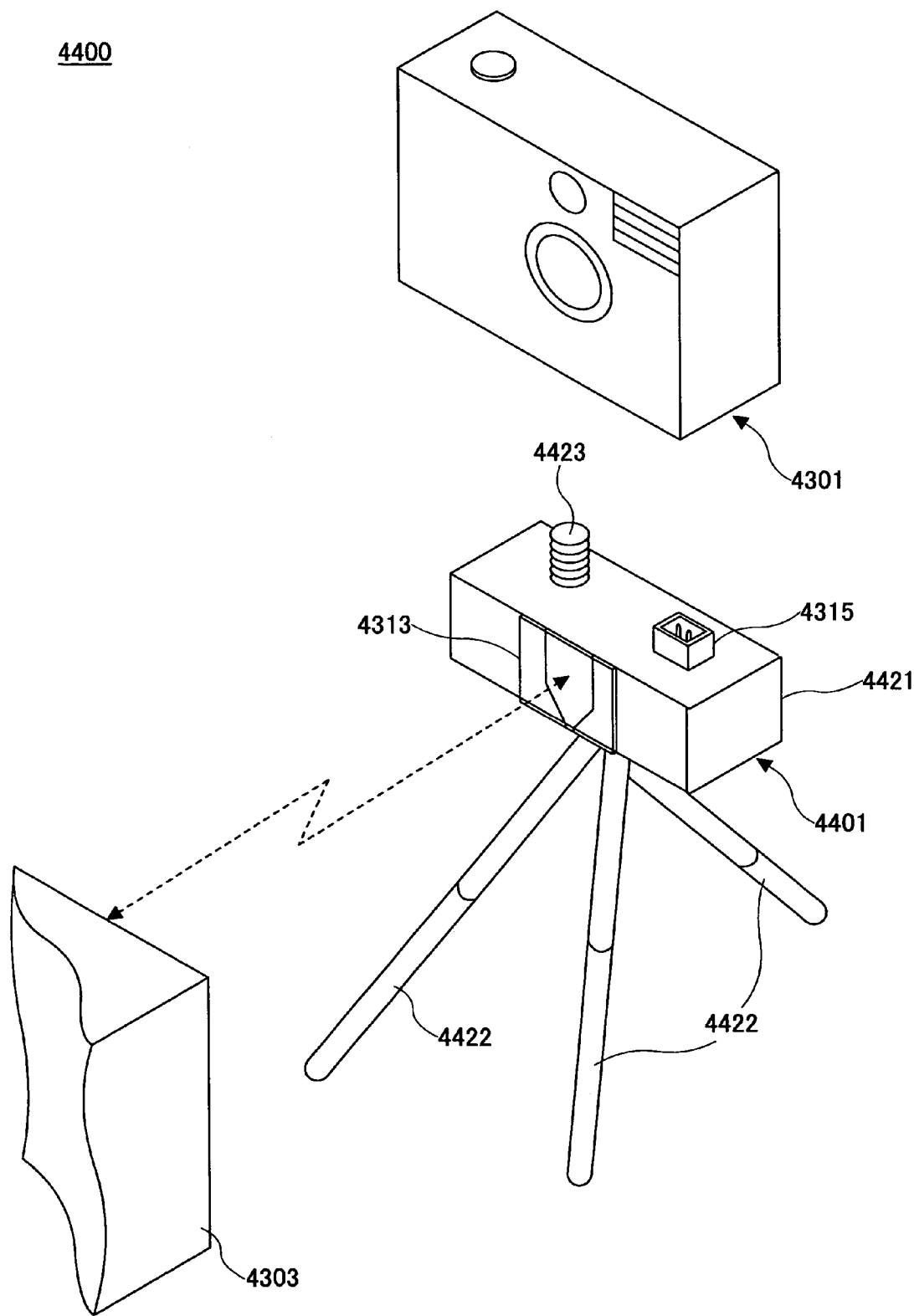
FIG. 54 is a schematic drawing showing a third applied example of a system to which an embodiment of an antenna apparatus of the present invention is applied.

FIG. 54 is a schematic drawing showing a configuration of a system 4400 to which an antenna apparatus according to an embodiment of the present invention is applied. In FIG. 54, like components are denoted by like numerals as of FIG. 52 and are not further explained.

The system 4400 is for mounting a digital camera 4301 on a tripod 4401 and performing communications between the digital camera 4301 and an external device (e.g. a printer, a remote control device) via an antenna apparatus 4313 mounted (adhered) to the front surface of the tripod 4401.

The tripod 4401 includes a base part 4421 and a leg part 4422. The leg part 4422 has three legs extending downwards from the lower portion of the base part 4421. The leg part may be telescopic (expandable and contractable). A screw part 4423 is provided on a top plane of the base part 4421 for securing the digital camera 4301 to the base part 4421. The screw part 4423 can be fastened to a screw hole provided at a bottom plane of the digital camera 4301. A connector 4315 is also provided on the top plane of the base part 4421 for engaging with a connector of the digital camera 4301.

The communications and the power supply of the digital camera 4301 are performed through the connector 4315.

Figure 55:
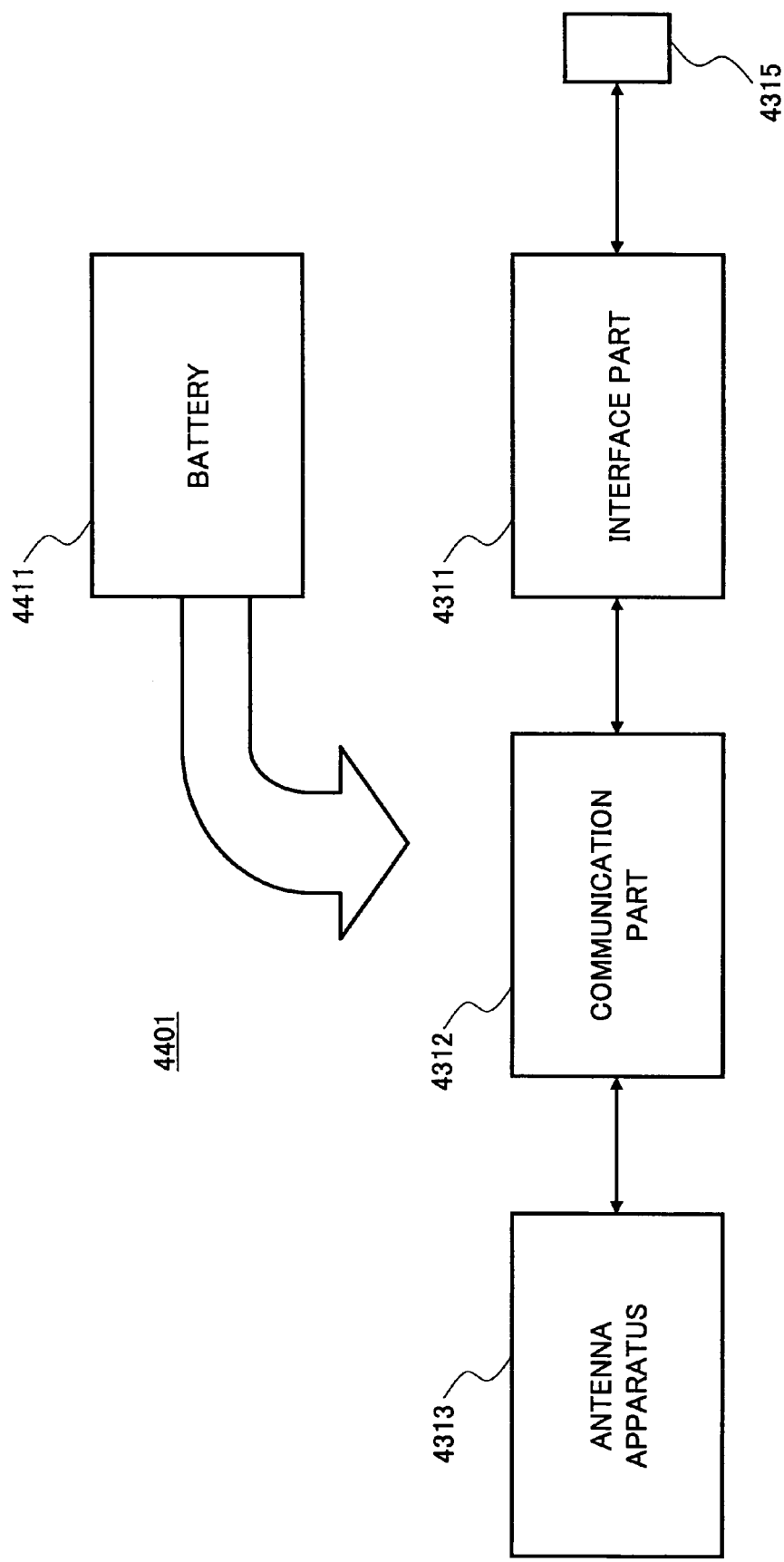
FIG. 55 is a block diagram of a tripod according to an embodiment of the present invention.

FIG. 55 is a block diagram of an exemplary configuration of the tripod 4401.

The base part 4421 of the tripod 4401 includes an interface part 4311, a communication part 4312, an antenna apparatus 4313, and a battery 4411. The interface part 4311 and the communication part 4312 are driven by the battery 4411. The antenna apparatus is mounted to the front surface of the base part 4421 of the tripod 4401 by the above-described mounting methods shown in FIGS. 15-43B.

Fourth Applied Example

Figure 56:
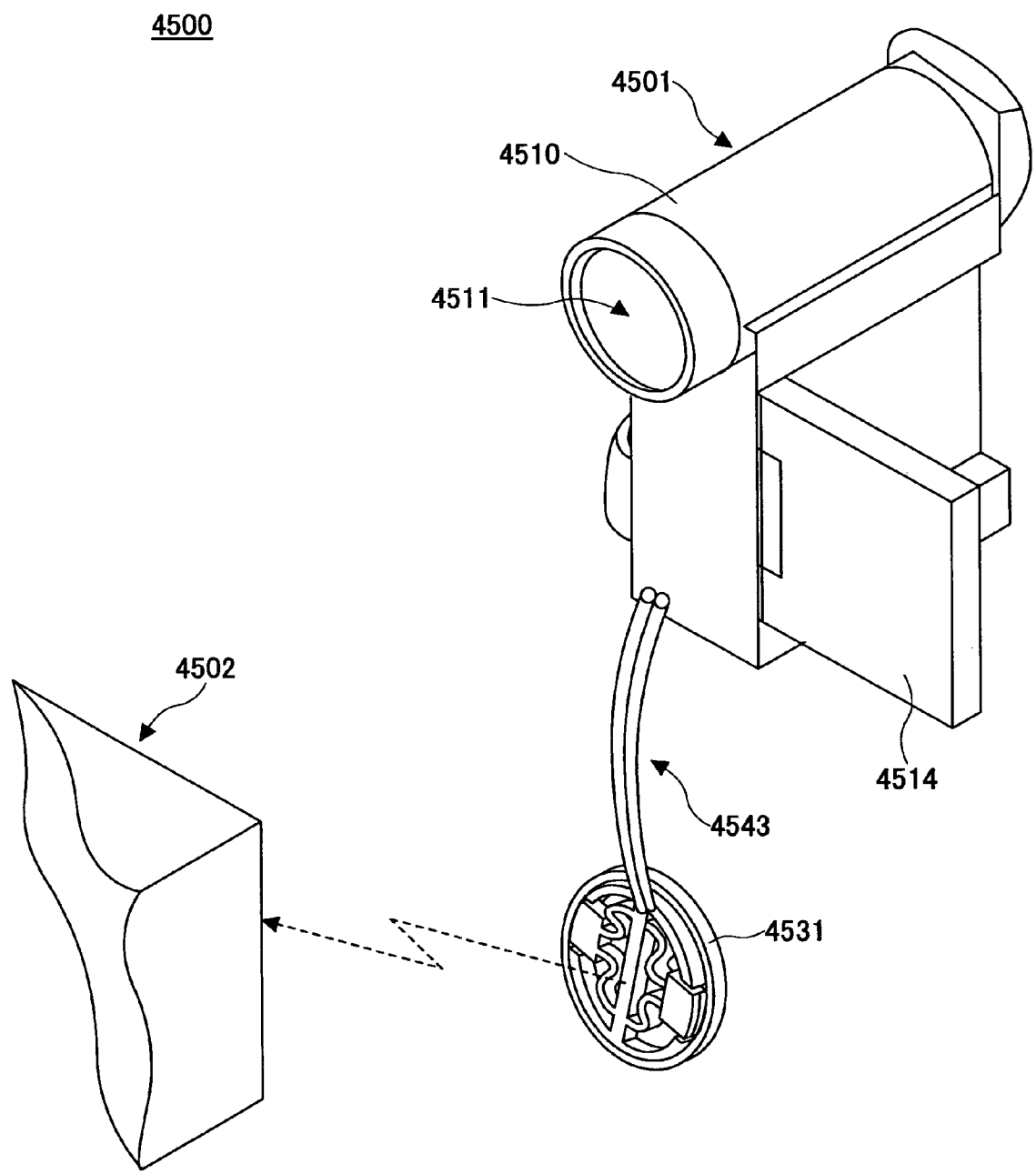
FIG. 56 is a schematic drawing showing a fourth applied example of a system to which an embodiment of an antenna apparatus of the present invention is applied.

FIG. 56 is a schematic drawing showing a configuration of a system 4500 to which an antenna apparatus according to an embodiment of the present invention is applied. In FIG. 56, like components are denoted by like numerals as of FIG. 49 and are not further explained.

The system 4500 includes a video camera 4501 and a video device 4502. The video camera 4501 and the video device 4502 perform communications with each other by ultra wideband wireless communication (e.g. UWB). The video camera 4501 and the video device 4502 each have the above-described antenna apparatus of the present invention mounted thereto.

Figure 57:
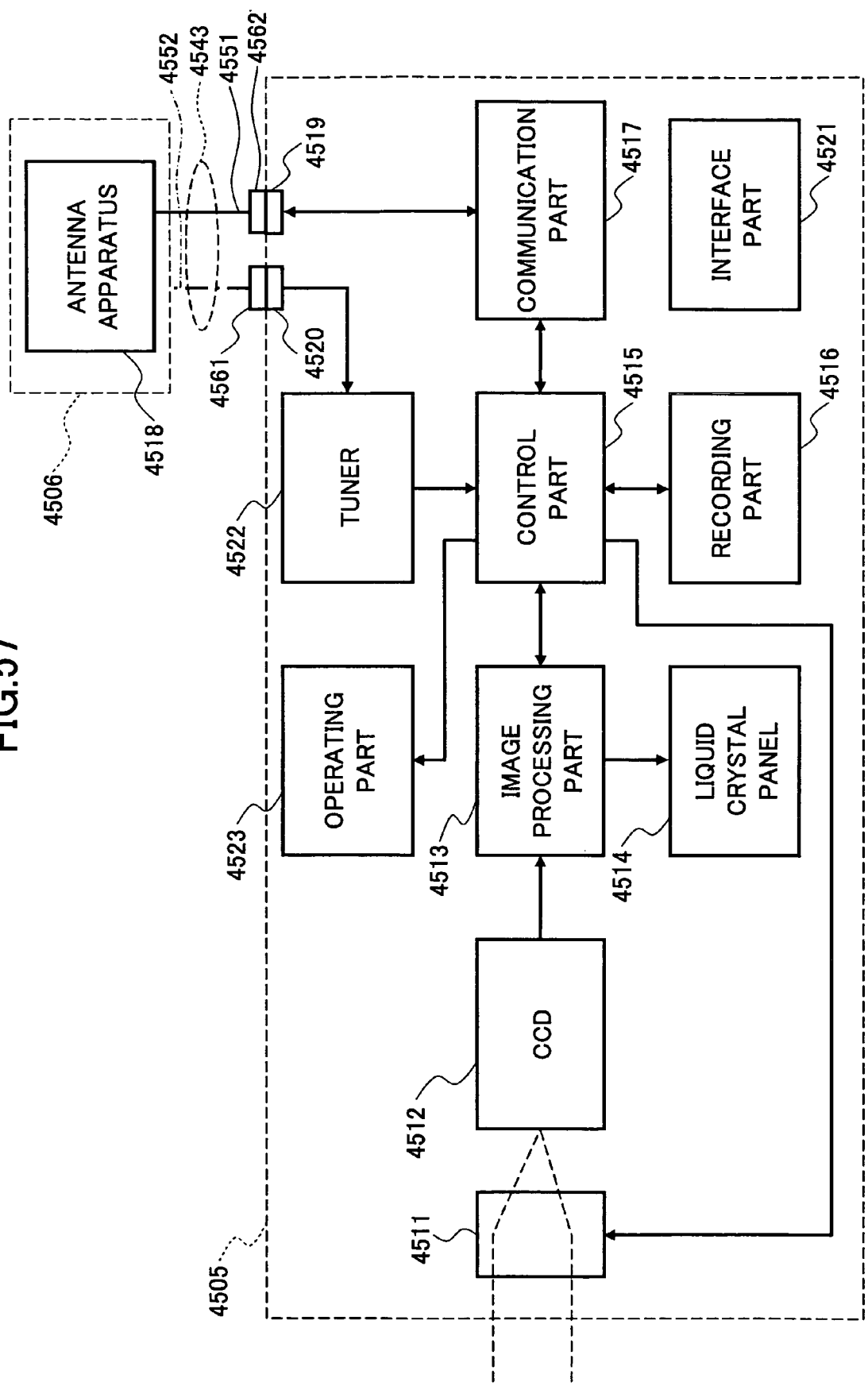
FIG. 57 is a block diagram of a video camera according to an embodiment of the present invention.

FIG. 57 is a block diagram of an exemplary configuration of the video camera 4502.

The video camera 4501 includes a video camera body 4505 and a cap 4506. The video camera body 4505 includes an optical system 4511, a CCD 4512, an image processing part 4513, a liquid crystal panel 4514, a control part 4515, a recording part 4516, a communication part 4517, an antenna apparatus 4518, sockets 4519, 4520, an interface part 4521, a tuner 4522, and a operating part 4523.

In the video camera 4501, the image of the target object is transmitted to the CCD 4512 via the optical system 4511. Then, the image is converted into video signals by the CCD 4512. Then, the converted video signals are processed in the image processing part 4513. The processed video signals are transmitted to the recording part 4516 via the control part 4515. The recording part 4516 records the transmitted signals to a recording medium.

Furthermore, the video signals are transmitted to the video device 4502 via the communication part 4517, the antenna apparatus 4518, and/or the interface part 4521. The cap 4531, which protects the optical system 4511, has the antenna apparatus 4518 mounted thereto.

Figure 58:
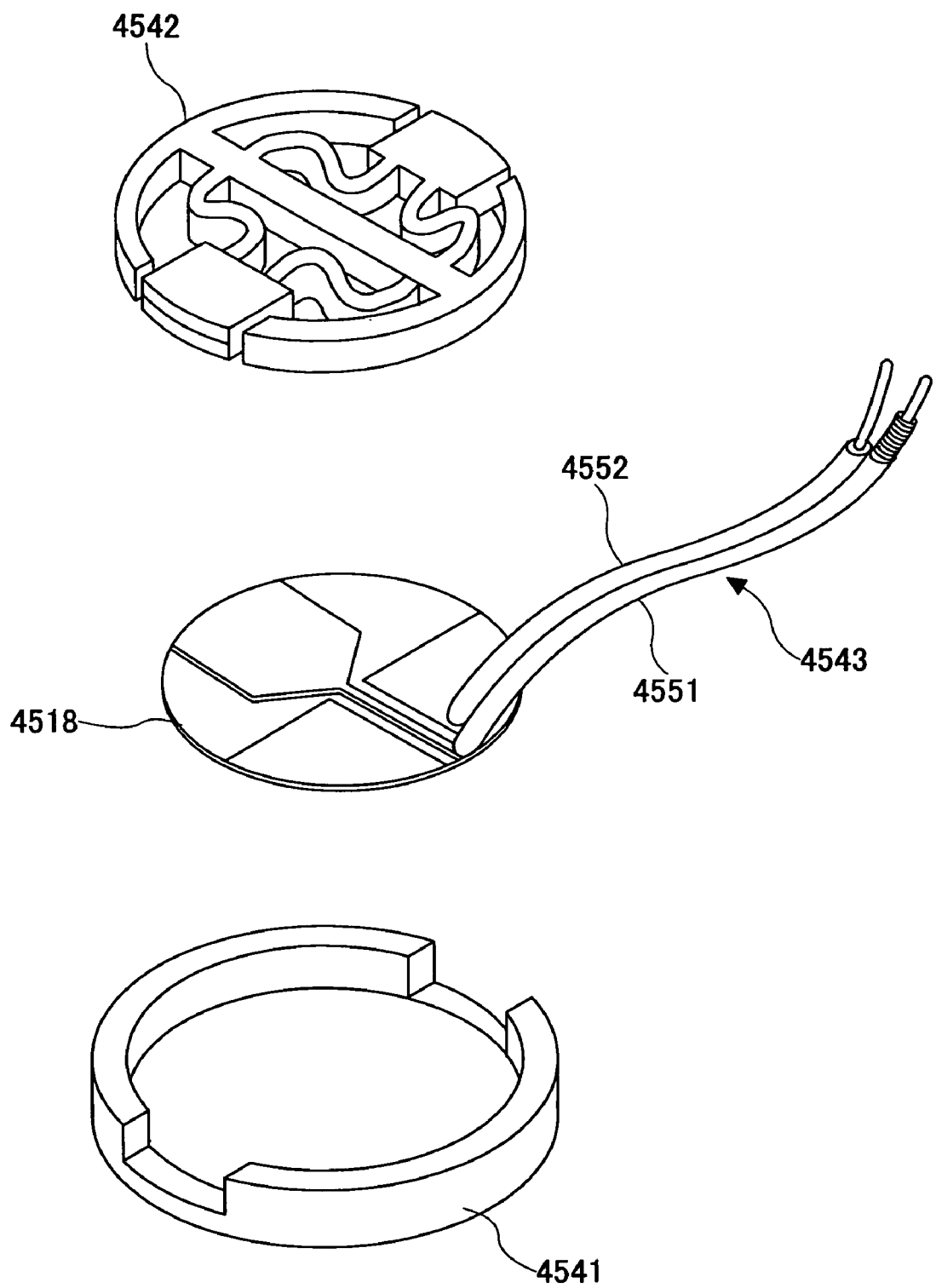
FIG. 58 is a schematic drawing of a cap according to an embodiment of the present invention.

FIG. 58 is a schematic drawing showing an exemplary configuration of the cap 4531.

The cap 4531 includes a cap part 4541, an engagement part 4542, and a strap part 4543. The antenna apparatus 4518 is mounted to a bottom plane of the cap part 4541 by the above-described mounting methods shown in FIGS. 15-43B.

The engagement part 4542, which is provided at the inner side of the cap part 4541, engages the cap part 4541 to the optical system 4511. The strap part 4543 includes a coaxial cable 4551 and a TV (television) antenna line 4552.

The antenna apparatus 4518 is connected to one end of the coaxial cable 4551. A plug 4561 is connected to the other end of the coaxial cable 4551. The TV antenna line 4552 includes a conducting wire having a length substantially corresponding to λ/4 of the VHF or UHF band. A plug 4553 is connected to one end of the TV antenna line 4552. The plugs 4561, 4562 are connected to the sockets 4519, 4520 provided to the video camera body 4510.

Accordingly, the cap 4506 is engaged with the video camera body 4510. Furthermore, the antenna apparatus 4518 is connected to the communication part 4517 via the coaxial cable 4551 and the socket 4519. Furthermore, the TV antenna line 4552 is connected to the tuner 4522 via the socket 4520. The TV broadcasts received through the TV antenna line 4552 and the tuner 4522 are displayed on the liquid crystal panel 4514 via the control part 4515 and the image processing part 4513.

In this example, by having the plugs 4561, 4562 locked (fastened) to the video camera body 4505 with a locking (fastening) mechanism, the cap 4506 can be prevented from disengaging from the video camera body 4505.

Fifth Applied Example

Figure 59:
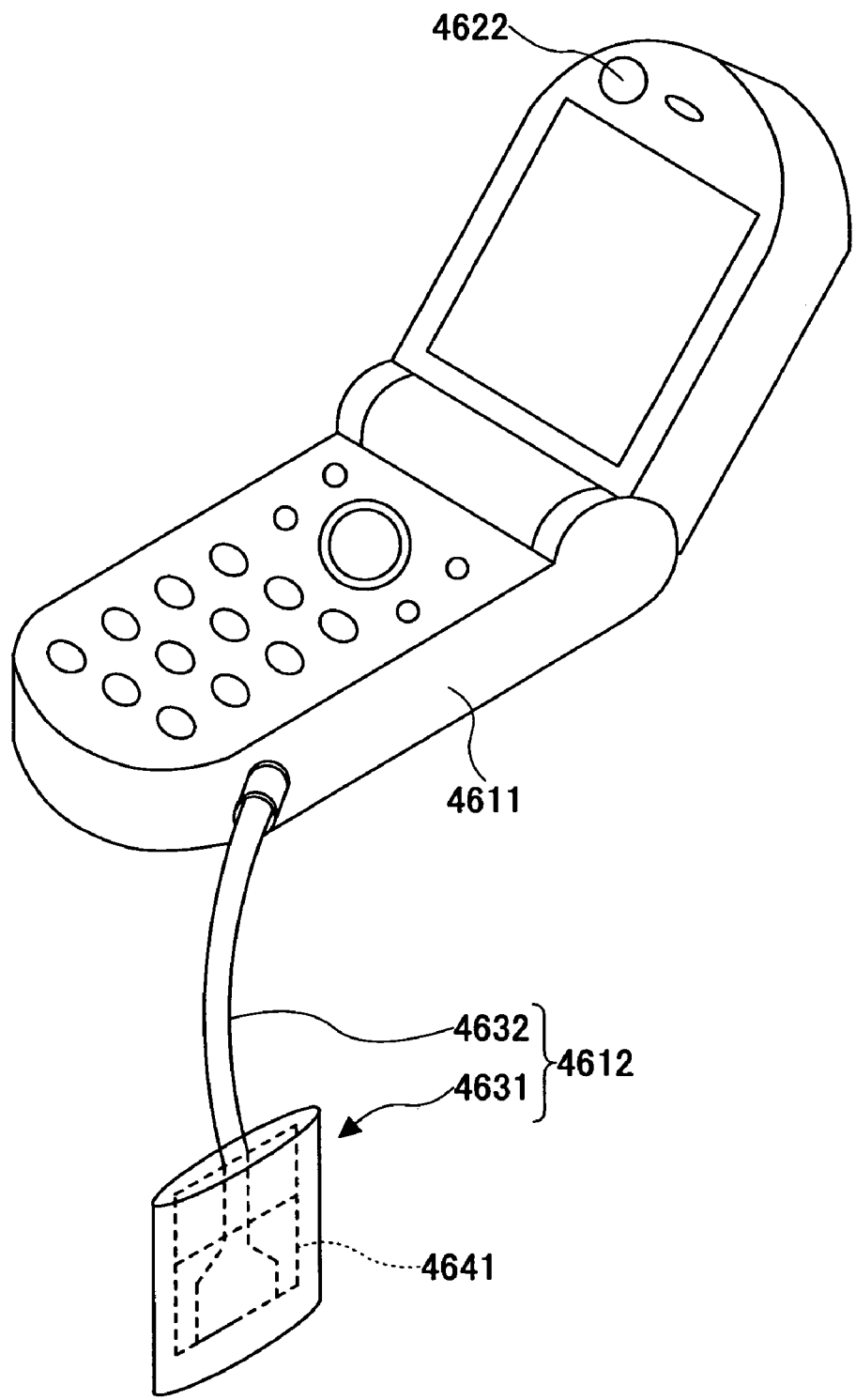
FIG. 59 is a schematic drawing showing a fifth applied example of a system to which an embodiment of an antenna apparatus of the present invention is applied.
Figure 60:
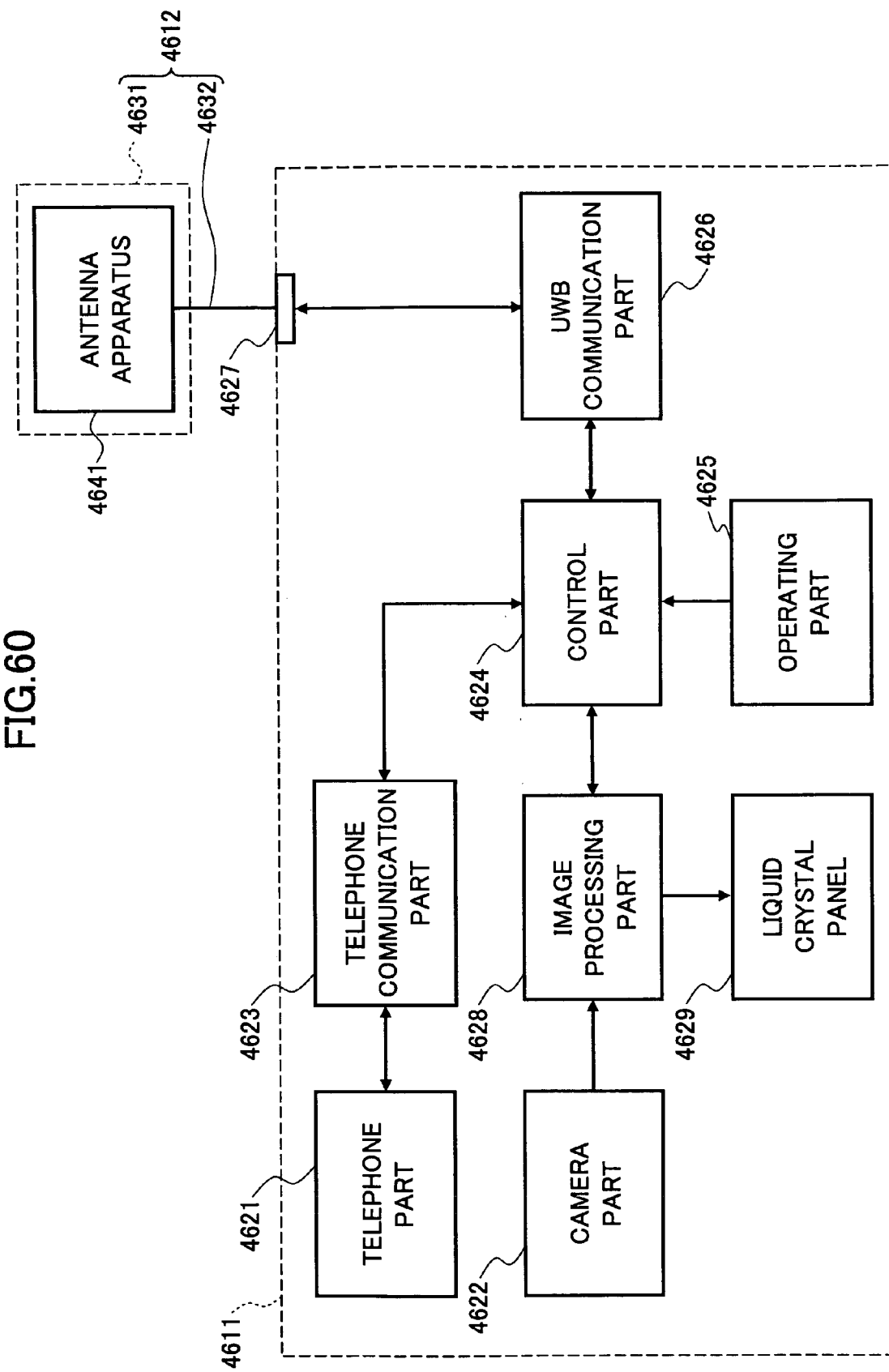
FIG. 60 is block diagram of a mobile phone according to an embodiment of the present invention.

FIG. 59 is a schematic drawing showing a configuration of a mobile phone 4601 to which an antenna apparatus according to an embodiment of the present invention is applied. FIG. 60 is a block diagram of an exemplary configuration of the mobile phone 4601.

The mobile phone 4601 is for performing data communication by ultra wideband wireless communication (e.g. UWB). The mobile phone 4601 has the above-described antenna apparatus of the present invention mounted thereto.

The mobile phone 4601 includes a mobile phone body 4611 and a strap 4612. The mobile phone body 4611 includes a phone part 4621, a camera part 4622, a telephone communication part 4623, a control part 4624, an operating part 4625, a UWB communication part 4626, and a socket part 4627. The phone part 4621 is provided with, for example, a microphone, a speaker, and an audio processing part for achieving the functions of a telephone. The camera part 4622 is provided with, for example, a CCD, an image processing part for achieving the functions of a camera.

The telephone communication part 4623 performs communication with a mobile phone network. The control part 4624 performs various controls in accordance with the operations from the operating part 4625. The UWB communication part 4626 along with the strap 4612 performs UWB communication.

As shown in FIG. 59, the strap 4612 includes an antenna part 4631 and a strap part 4632.

The antenna part 4631 is sealed to the antenna apparatus 4641 by resin. The antenna apparatus 4641 has a configuration shown in FIG. 4, for example. The antenna apparatus 4641 is connected to the strap part 4632. The strap part 4632 includes a coaxial cable. A plug 4651 is provided on one end (end proximal to the mobile phone body 4611) of the coaxial cable. The plug 4651 is connected to the socket 4627 provided in the mobile phone body 4611. Accordingly, the strap 4612 is engaged with the mobile phone body 4611. Furthermore, the antenna apparatus 4641 is connected to the UWB part 4626. It is to be noted that the plug 4651 and the socket 4627 are engaged with each other with a sufficient engaging strength such that the strap 4612 can be prevented from disengaging from the mobile phone body 4611. Furthermore, a locking (fastening) mechanism may also be provided to the plug 4651 and/or the socket 4627 to further prevent the strap 4612 from disengaging from the mobile phone body 4611.

Sixth Applied Example

Figure 61:
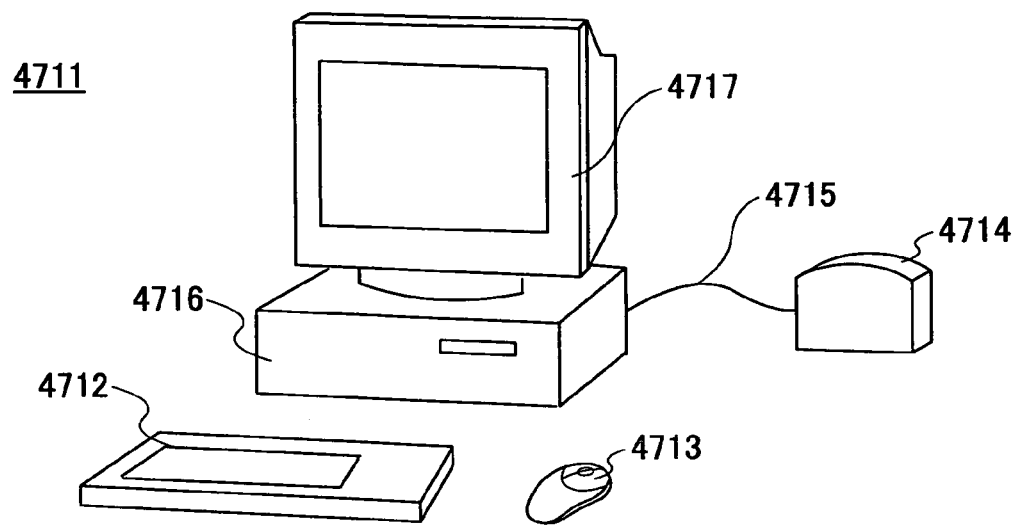
FIG. 61 is a schematic drawing showing a sixth applied example of a system to which an embodiment of an antenna apparatus of the present invention is applied.

FIG. 61 is a schematic drawing showing a configuration of a system to which the antenna apparatus 4100 (including an antenna part) according to an embodiment of the present invention is applied.

The antenna apparatus 4100 according to an embodiment of the present invention may be applied to a human interface device(s), for example, a keyboard 4712 and/or a mouse 4713 of a personal computer 4711.

In this applied example, the keyboard 4712 and/or the mouse 4713 conduct wireless communications with a communication unit 4714. The communication unit 4714 is connected to a computer main body 4716 via a cable 4715. The computer main body 4716 is connected to a display 4717.

Figure 62:
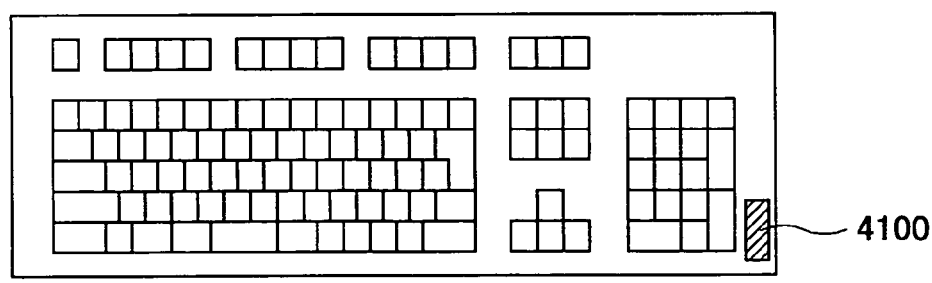
FIG. 62 is a schematic drawing of a keyboard according to an embodiment of the present invention.
Figure 63:
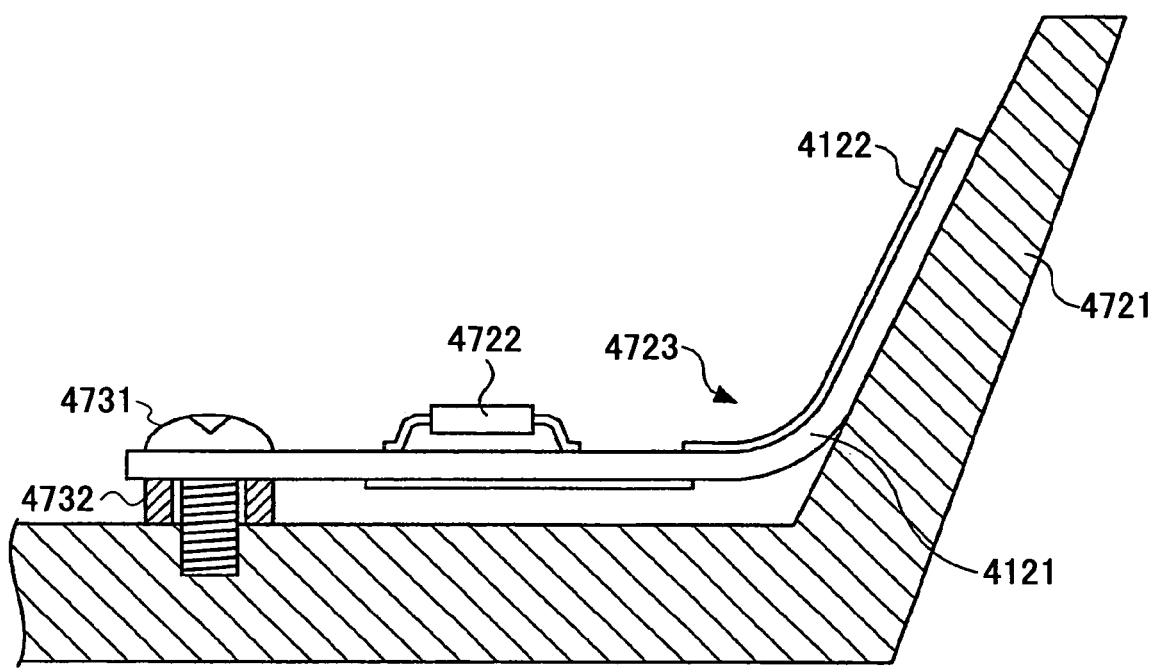
FIG. 63 is a schematic drawing showing an exemplary mounted state of an antenna apparatus according to an embodiment of the present invention.

FIG. 62 is a schematic drawing showing an exemplary configuration of the keyboard 4712. FIG. 63 is a schematic drawing showing an exemplary state where the antenna apparatus 4100 is mounted on the keyboard 4712.

As shown in FIG. 63, an antenna part 4723, which has an electronic component 4722 disposed on its flexible printed wiring board 4121, may be bent and mounted along the inner side of a housing 4721 of the keyboard 4712. In this example, the antenna part 4723 is bent along the inner side of the housing 4721 by fastening the antenna part 4723 to the housing 4721 with a screw 4731 via a spacer 4732. Thereby, the antenna part 4723 can be securely mounted to the housing 4721.

Figure 64A:
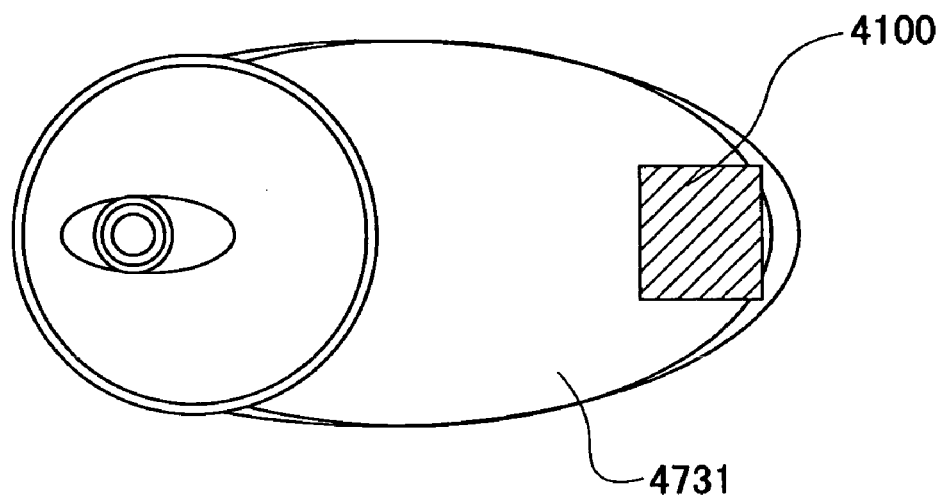
FIGS. 64A-64B are schematic drawings of a mouse according to an embodiment of the present invention.
Figure 64B:
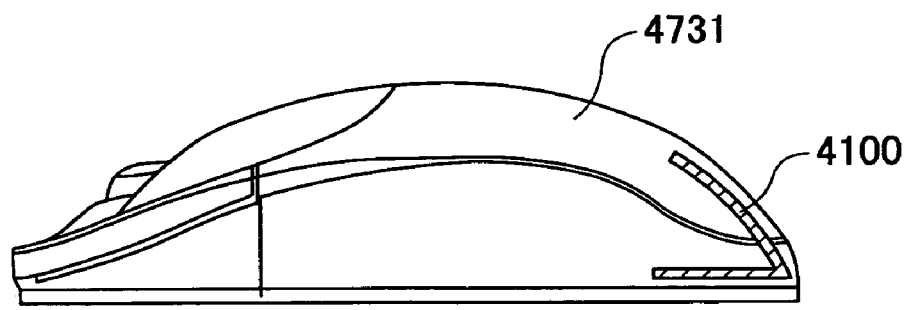

FIGS. 64A and 64B are schematic drawings showing an exemplary configuration of the mouse 4713. Since the antenna part is provided with the flexible printed wiring board 4121, the antenna apparatus 4100 can be easily mounted to the inner surface of the housing 4731 of the mouse 4713 as shown in FIG. 64B.

[Others]

Figures 65A, 65B:
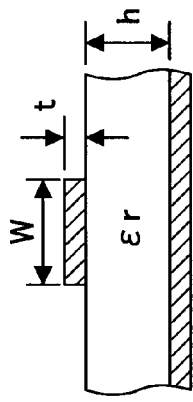
FIGS. 65A-65B are schematic drawings for describing the relation between the thickness of a substrate and the width of a strip-line for attaining an impedance of 50Ω.
Figure 66:
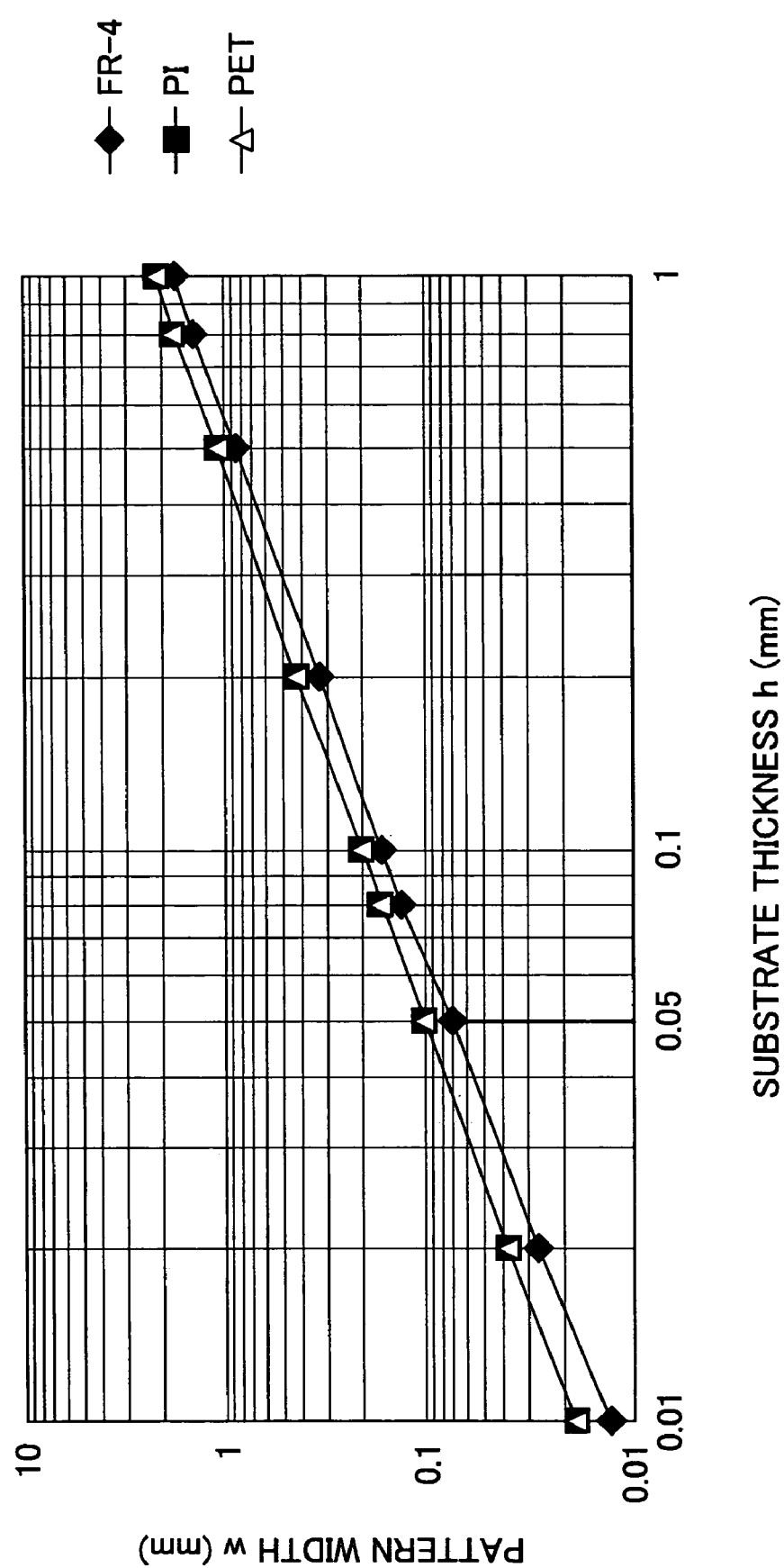
FIG. 66 is a table for describing the relation between the thickness of a substrate and the width of a strip-line for attaining an impedance of 50Ω.

FIGS. 65A, 65B and 66 are diagrams for describing the relation between the thickness of a substrate and the width of a strip-line 143 for attaining a predetermined characteristic impedance (in this example, 50Ω). In FIG. 65A, "∈ r" indicates the dielectric constant of the substrate, "h" indicates the thickness of the substrate, and "W" indicates the width of the strip-line. According to FIGS. 65B and 66, in a case where FR-4 is used as the material of the substrate, a pattern width ranging from 0.012 to 1.86 mm is required for attaining a characteristic impedance of 50Ω when the thickness of the substrate ranges from 0.01 to 1 mm. In a case where PI is used as the material of the substrate, a pattern width ranging from 0.017 to 2.07 mm is required for attaining a characteristic impedance of 50Ω when the thickness of the substrate ranges from 0.01 to 1 mm. In a case where PET resin is used as the material of the substrate, a pattern width ranging from 0.018 to 2.45 mm is required for attaining a characteristic impedance of 50Ω when the thickness of the substrate ranges from 0.01 to 1 mm.

Hence, as shown in FIGS. 65A, 65B and 66, it is preferable to determine the width of the strip-line 143 in accordance with the material of the substrate and/or the thickness of the substrate for attaining a characteristic impedance of 50 Ω.

Further, the present invention is not limited to these embodiments, but variations and modifications may be made without departing from the scope of the present invention.

The present application is based on Japanese Priority Application Nos. 2005-023846, 2005-202154, 2005-243040, and 2005-328514 filed on Jan. 31, 2005, Jul. 11, 2005, Aug. 24, 2005, and Nov. 14, 2005, respectively, with the Japanese Patent Office, the entire contents of which are hereby incorporated by reference.

What is claimed is:

1. An electronic device, comprising:
   a housing having an antenna apparatus integrally formed thereto;
   wherein the antenna apparatus includes a dielectric substrate on which an element including a conductive material pattern is formed,
   wherein the dielectric substrate is a film;
   wherein the element is guided into the housing via a through-hole penetrating the housing.

2. The electronic device as claimed in claim 1, wherein the antenna apparatus is integrally formed with the housing by insert molding the antenna apparatus to the housing.

3. The electronic device as claimed in claim 1, wherein the antenna apparatus is integrally formed with the housing by fastening the antenna apparatus to the housing.

4. The electronic device as claimed, in claim 1, wherein the antenna apparatus is integrally formed with the housing by in-molding the antenna apparatus to the housing.

5. The electronic device as claimed in claim 1, wherein the antenna apparatus is integrally formed with the housing by hot stamping the antenna apparatus to the housing.

6. The electronic device as claimed in claim 1, wherein the element of the antenna apparatus is directly formed onto the housing.

7. The electronic device as claimed in claim 1, wherein the antenna apparatus is provided on a front surface of the housing.

8. An electronic device, comprising:
   a housing having an antenna apparatus integrally formed thereto;
   wherein the antenna apparatus includes a dielectric substrate on which an element including a conductive material pattern is formed;
   wherein the dielectric substrate is a film; and
   wherein the element is guided into the housing via an edge plane of the housing.

9. The electronic device as claimed in claim 8, wherein the antenna apparatus is integrally funned with the housing by insert molding the antenna apparatus to the housing.

10. The electronic device as claimed in claim 8, wherein the antenna apparatus is integrally farmed with the housing by fastening the antenna apparatus to the housing.

11. The electronic device as claimed in claim 8, wherein the antenna apparatus is integrally formed with the housing by in-molding the antenna apparatus to the housing.

12. The electronic device as claimed in claim 8, wherein the antenna apparatus is integrally formed with the housing by hot stamping the antenna apparatus to the housing.

13. The electronic device as claimed in claim 8, wherein the element of the antenna apparatus is directly formed onto the housing.

14. The electronic device as claimed in claim 8, wherein the antenna apparatus is provided on a front surface of the housing.

15. An electronic device, comprising:
    a housing having an antenna apparatus integrally formed thereto; and
    a circuit board being connected to the antenna apparatus via a cable;
    wherein the antenna apparatus includes a dielectric substrate on which an element including a conductive material pattern is formed,
    wherein the dielectric substrate is a film;
    wherein the antenna apparatus has a portion projecting out of the housing.

16. The electronic device as claimed in claim 15, wherein the cable is configured to be soldered to at least one of the antenna apparatus and the circuit board.

17. The electronic device as claimed in claim 15, wherein the cable is connected to at least one of the antenna apparatus and the circuit board via a connector.

18. The electronic device as claimed in claim 15, wherein the cable is connected to at least one of the antenna apparatus arid the circuit board via an anisotropic conductive rubber material.

19. The electronic device as claimed in claim 15, wherein the cable is connected to at least one of the antenna apparatus and the circuit board via an anisotropic conductive film.

20. The electronic device as claimed in claim 15, wherein the cable is connected to the antenna apparatus via an elastic member.

21. The electronic device as claimed in claim 15, wherein the cable is connected to the circuit board by being pressed against the circuit board by an elastic member.

22. The electronic device as claimed in claim 15, wherein the cable is formed by extending a portion of the circuit board.

23. The electronic device as claimed in claim 15, wherein the circuit board is provided inside the housing, wherein the circuit board is directly connected to the antenna apparatus via a connector.

24. The electronic device as claimed in claim 15, wherein the antenna apparatus includes at least one of a monopole antenna, a dipole antenna, and a chip antenna.

25. An electronic device, comprising:
    a housing for installing an antenna apparatus therein, the housing including an opening part to which the antenna apparatus is mounted;

wherein the antenna apparatus includes a dielectric substrate on which an element including a conductive material pattern is formed;

wherein the dielectric substrate is a film; and wherein the antenna apparatus is mounted to the opening part in a bent state for operating as a reflection mirror.

26. The electronic device as claimed in claim 25, further comprising a liquid crystal panel that is also mounted to said opening part of the housing.

27. The electronic device as claimed in claim 25, wherein the antenna apparatus is provided on a rear plane on the liquid crystal plane.

28. The electronic device as claimed in claim 25, wherein the liquid crystal plane includes a transparent conductive film provided on a front plane thereof.

29. The electronic device as claimed in claim 25, wherein the conductive material pattern that is formed on the element has a high reflectivity.

30. The electronic device as claimed in claim 25, wherein the conductive material pattern is formed on the element by at least one of a plating method, a lamination method, a sputtering method, and a vapor evaporation method.

* * * * *

UNITED STATES PATENT AND TRADEMARK OFFICE
CERTIFICATE OF CORRECTION

PATENT NO. : 7,339,533 B2 Page 1 of 1
APPLICATION NO. : 11/341368
DATED : March 4, 2008
INVENTOR(S) : Shigemi Kurashima et al.

It is certified that error appears in the above-identified patent and that said Letters Patent is hereby corrected as shown below:

Column 25, Line 53, change "claimed," to --claimed--.

Column 26, Line 8, change "funned" to --formed--.

Column 26, Line 11, change "farmed" to --formed--.

Column 26, Line 44, change "arid" to --and--.

Column 27, Line 11, after "plane" change "on" to --of--.

Signed and Sealed this

Twenty-ninth Day of July, 2008

JON W. DUDAS
*Director of the United States Patent and Trademark Office*